(12) United States Patent
Rigosi

(10) Patent No.: US 11,474,134 B2
(45) Date of Patent: Oct. 18, 2022

(54) GATELESS P-N JUNCTION METROLOG

(71) Applicant: Government of the United States of America, as represented by the Secretary of Commerce, Gaithersburg, MD (US)

(72) Inventor: Albert Felix Rigosi, Rockville, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 436 days.

(21) Appl. No.: 16/672,613

(22) Filed: Nov. 4, 2019

(65) Prior Publication Data

US 2020/0150165 A1    May 14, 2020

Related U.S. Application Data

(60) Provisional application No. 62/823,148, filed on Mar. 25, 2019, provisional application No. 62/757,274, filed on Nov. 8, 2018.

(51) Int. Cl.
  *G01R 27/14* (2006.01)
  *H01L 29/66* (2006.01)
  (Continued)

(52) U.S. Cl.
  CPC .......... *G01R 27/14* (2013.01); *H01L 29/1606* (2013.01); *H01L 29/24* (2013.01);
  (Continued)

(58) Field of Classification Search
  CPC ..... G01R 27/14; G01R 33/07; H01L 29/1606; H01L 29/24; H01L 29/66977;
  (Continued)

(56) References Cited

U.S. PATENT DOCUMENTS

| | | | |
|---|---|---|---|
| 9,647,098 B2* | 5/2017 | Obradovic | H01L 27/088 |
| 2006/0009872 A1* | 1/2006 | Prager | G01B 11/24 |
| | | | 700/121 |

(Continued)

OTHER PUBLICATIONS

Woszczyna, M., et al., "Graphene p-n junction arrays as quantum-Hall resistance standards", Applied Physics Letters, 2011, p. 022112, vol. 99.

(Continued)

*Primary Examiner* — Giovanni Astacio-Oquendo
(74) *Attorney, Agent, or Firm* — Office of Chief Counsel for National Institute of Standards and Technology

(57) ABSTRACT

A gateless P-N junction metrolog includes: a junction member including: a p-interface; and an n-interface disposed laterally and adjacent to the p-interface; and a p-n junction disposed at where the p-interface and n-interface contact; a drain electrode disposed on the junction member; a source electrode disposed on the junction member such that the source electrode is spaced apart from and opposing the drain electrode; an n-polymer disposed on the n-interface of the junction member; a p-polymer disposed on the p-interface of the junction member such that the n-polymer is interposed between the p-polymer and the n-interface; a mediation polymer disposed on the p-polymer such that the p-polymer is interposed between the mediation polymer and the junction member; and a mediator disposed in the mediation polymer and that receives electrons from the junction member in forming the p-interface.

1 Claim, 59 Drawing Sheets

(51) Int. Cl.
*H01L 29/24* (2006.01)
*H01L 29/76* (2006.01)
*H01L 29/16* (2006.01)
*H01L 43/06* (2006.01)

(52) U.S. Cl.
CPC .... *H01L 29/66977* (2013.01); *H01L 29/7606* (2013.01); *H01L 43/065* (2013.01)

(58) Field of Classification Search
CPC . H01L 29/7606; H01L 43/065; H01L 5/0583; H01L 51/0034
USPC ................................ 324/713, 691, 649, 600
See application file for complete search history.

(56) References Cited

U.S. PATENT DOCUMENTS

2016/0247927 A1* 8/2016 Nomura ............ H01L 29/78618
2017/0018584 A1* 1/2017 Ma .................... H01L 27/14643
2017/0365605 A1* 12/2017 Bedau .................... H01L 29/24

OTHER PUBLICATIONS

Lara-Avila, S., et al., "Non-volatile photochemical gating of an epitaxial graphene/polymer heterostructure" Advanced Materials, 2011, p. 878-882, vol. 23.

* cited by examiner (A)

(B)

GATELESS P-N JUNCTION METROLOG

CROSS REFERENCE TO RELATED APPLICATIONS

The application claims priority to U.S. Provisional Patent Application Ser. No. 62/757,274 filed Nov. 8, 2018, and U.S. Provisional Patent Application Ser. No. 62/823,148 filed Mar. 25, 2019, the disclosures of which are incorporated herein by reference in their entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 18-070US1.

BRIEF DESCRIPTION

Disclosed is a gateless P-N junction metrolog comprising: a junction member comprising: a p-interface; and an n-interface disposed laterally and adjacent to the p-interface; and a p-n junction disposed at where the p-interface and n-interface contact; a drain electrode disposed on the junction member; a source electrode disposed on the junction member such that the source electrode is spaced apart from and opposing the drain electrode; an n-polymer disposed on the n-interface of the junction member; a p-polymer disposed on the p-interface of the junction member such that the n-polymer is interposed between the p-polymer and the n-interface; a mediation polymer disposed on the p-polymer such that the p-polymer is interposed between the mediation polymer and the junction member; and a mediator disposed in the mediation polymer and that receives electrons from the junction member in forming the p-interface.

Disclosed is a process for performing resistance metrology with the gateless P-N junction metrolog, the process comprising: connecting a first electrode to the p-interface; connecting a second electrode to the n-interface; communicating voltage across through the drain electrode and the source electrode; and acquiring a resistance value across the p-n junction from the first electrode and the second electrode to perform resistance metrology.

BRIEF DESCRIPTION OF THE DRAWINGS

The following description should not be considered limiting in any way. With reference to the accompanying drawings, like elements are numbered alike.

Figure 43:
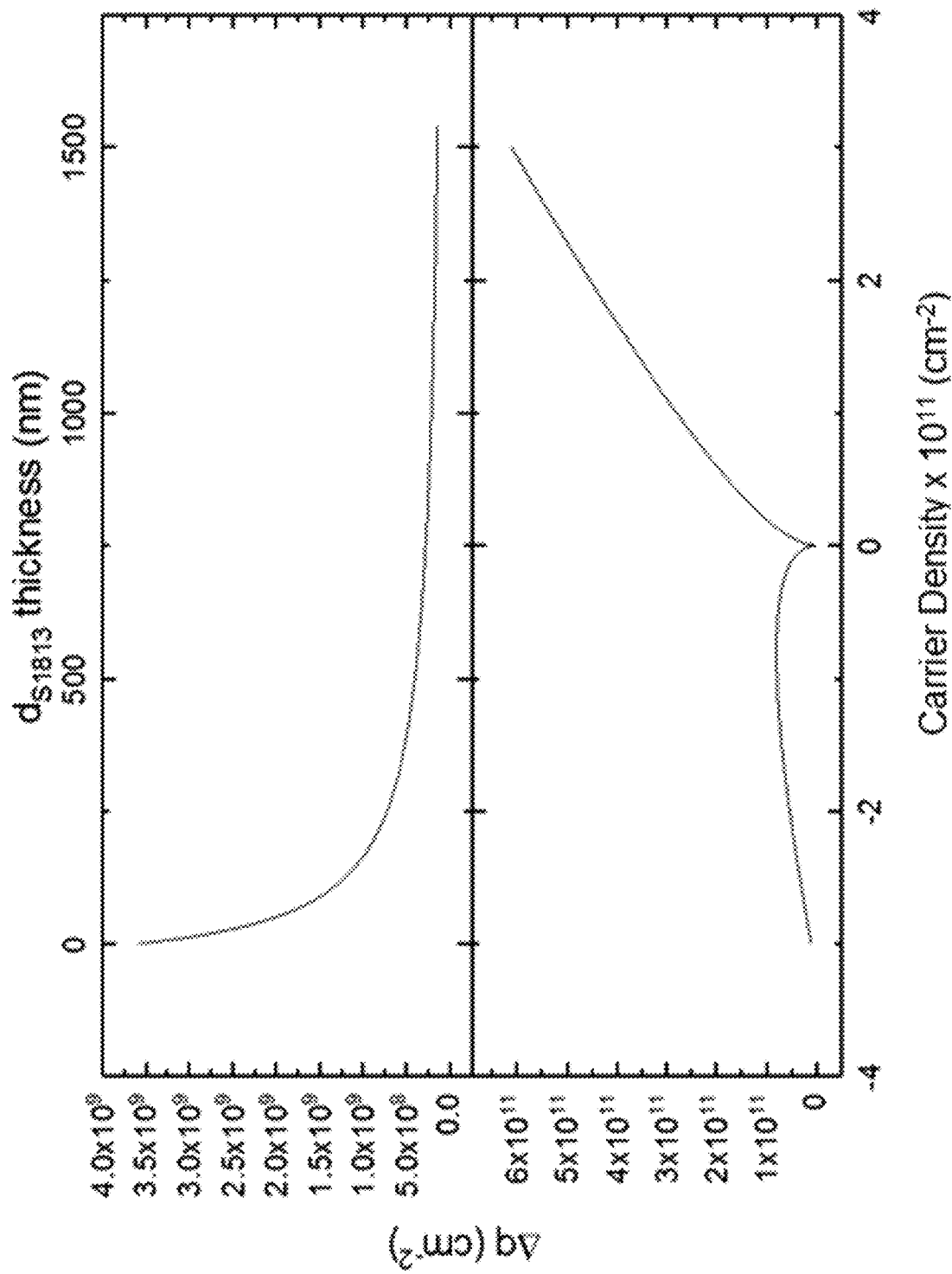
Figure 44:
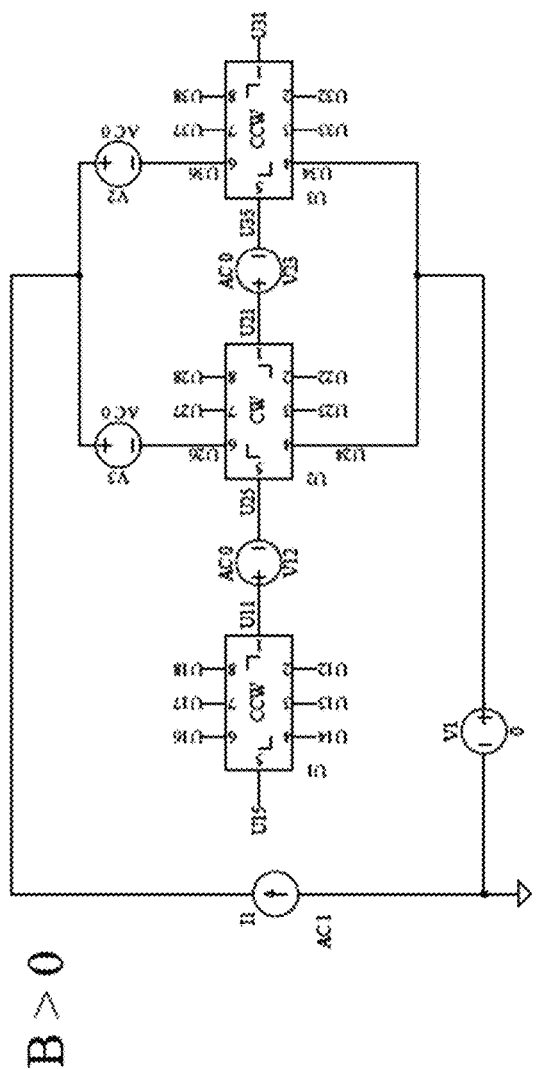
Figure 44:
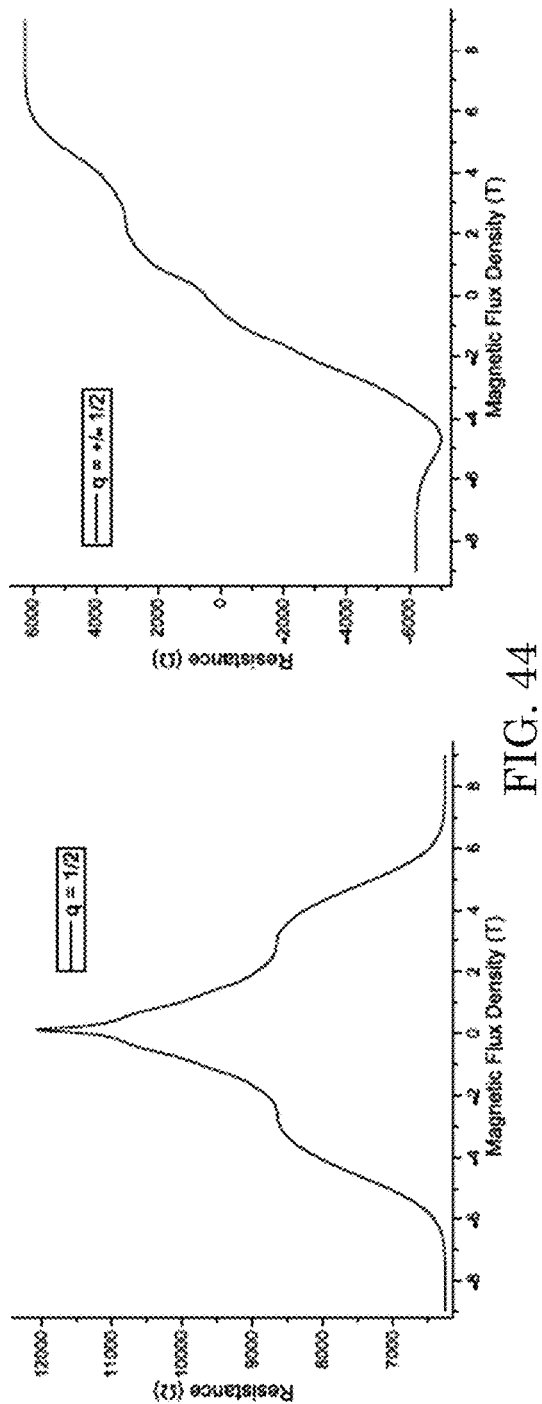
Figure 45:
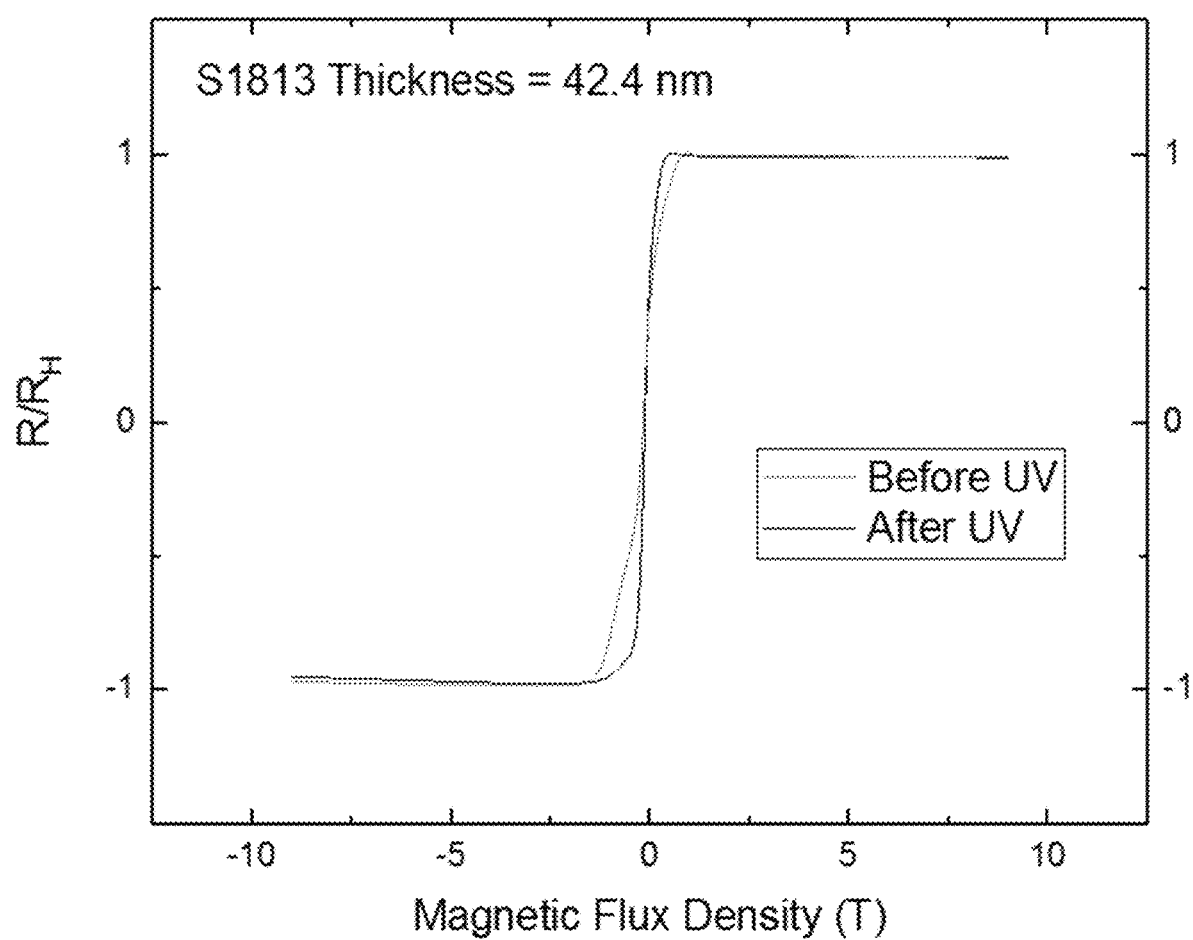
Figure 46:
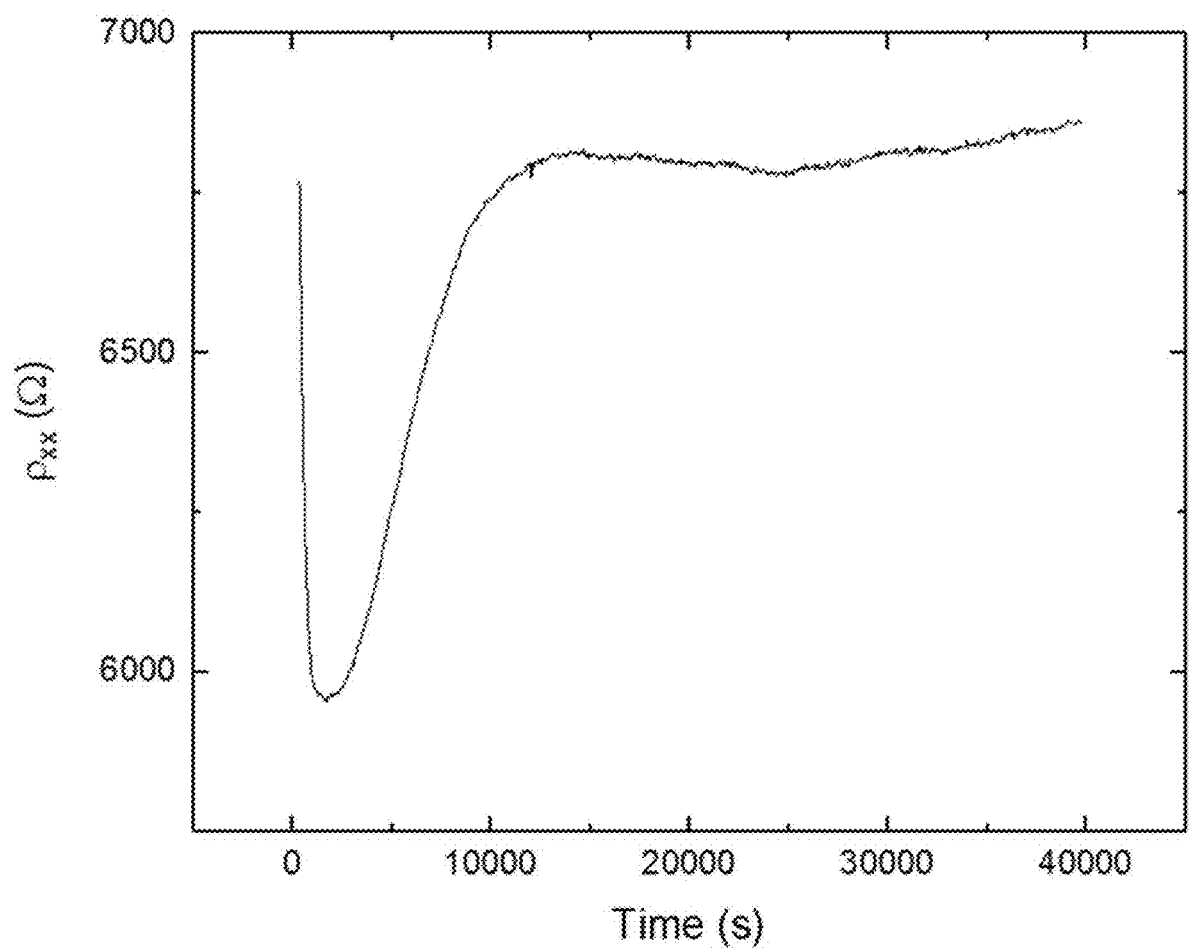
Figure 47:
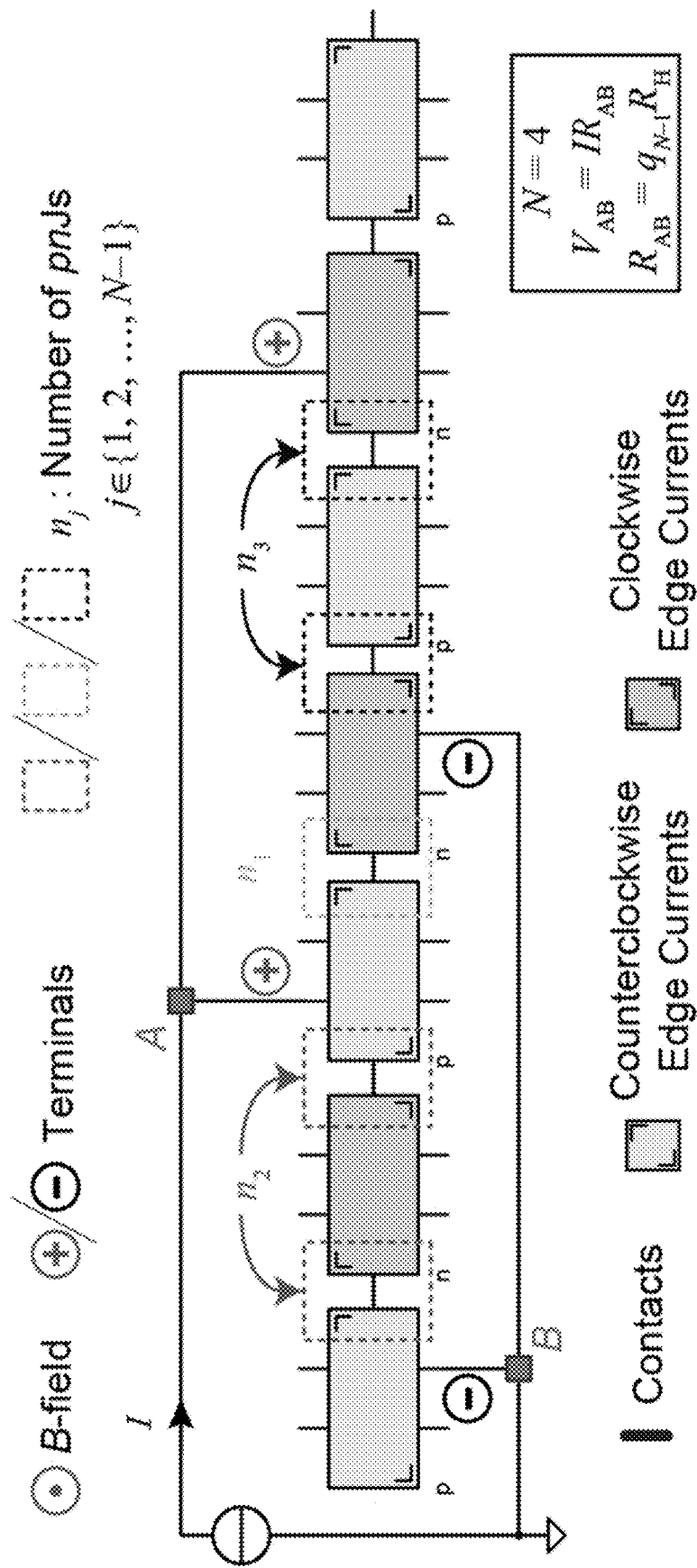
Figure 48:
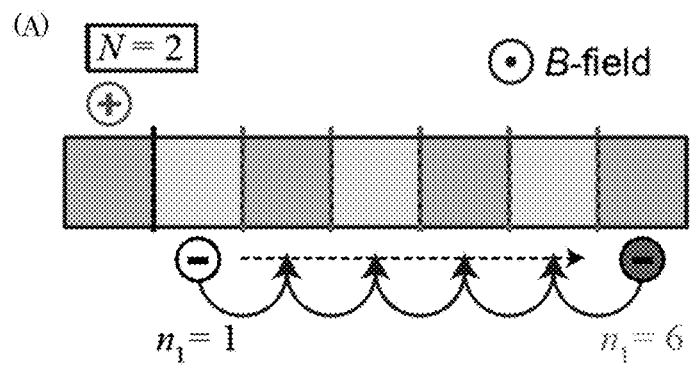
Figure 48:
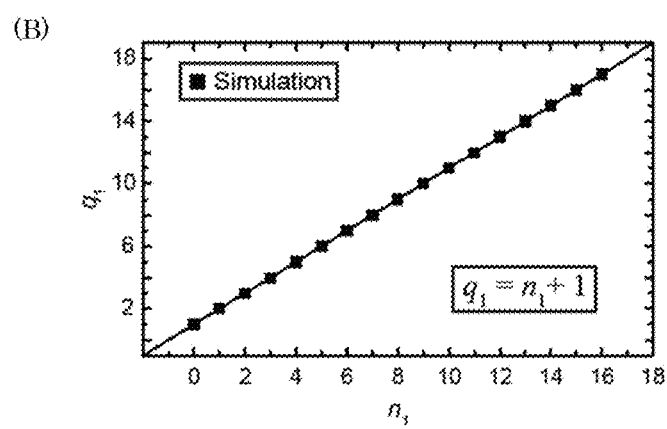
Figure 48:
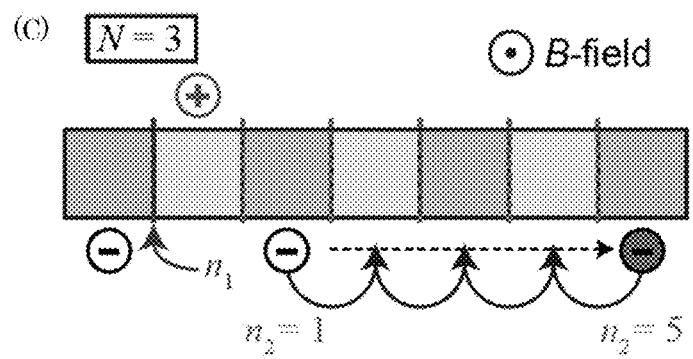
Figure 48:
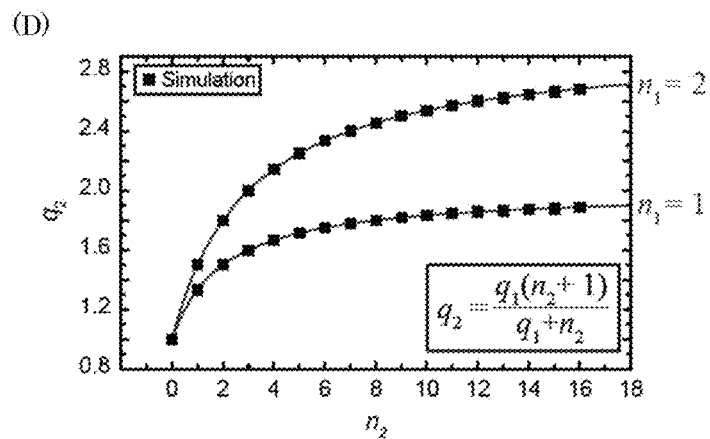
Figure 49:
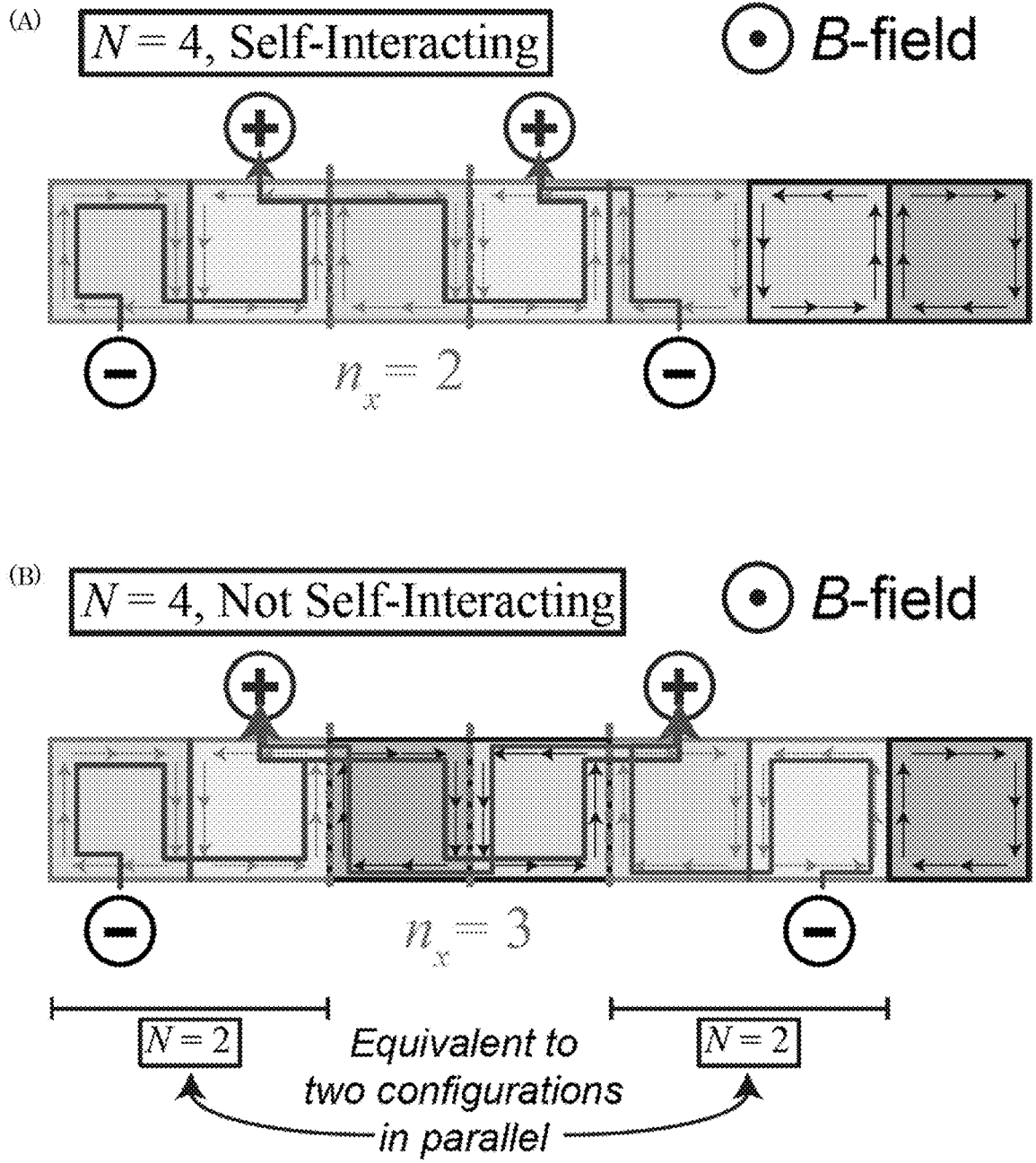
Figure 50:
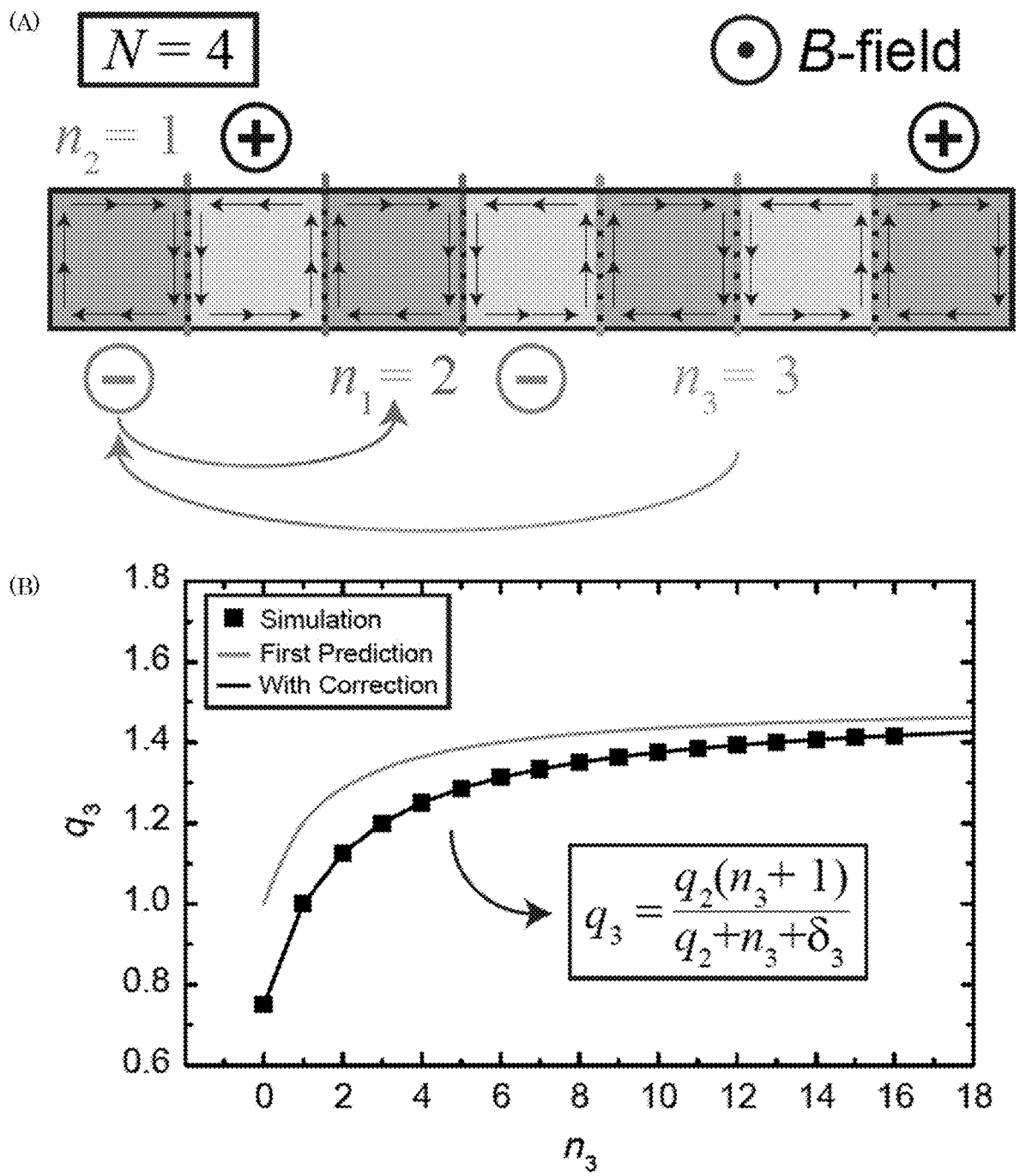
Figure 51:
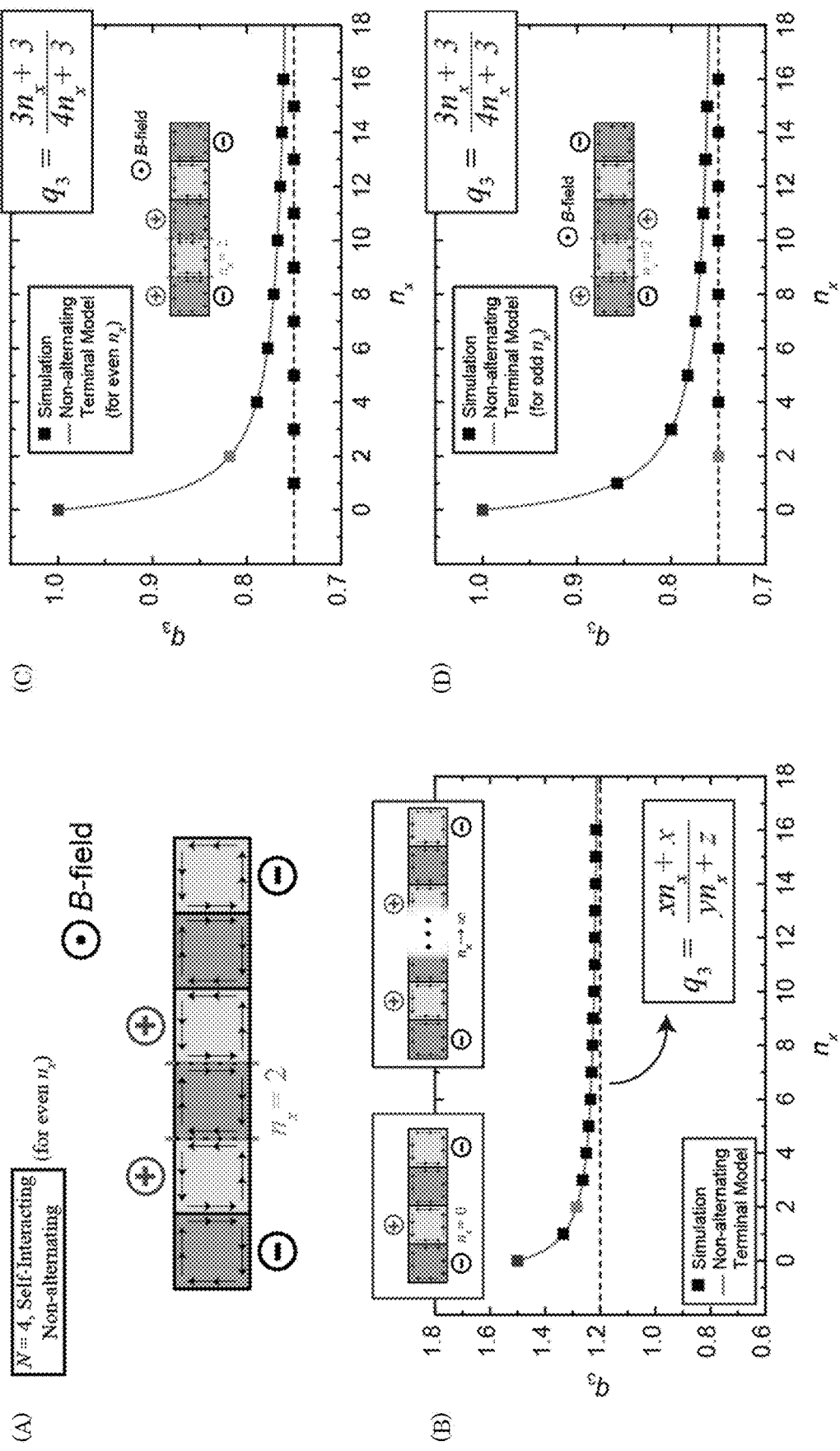
Figure 52:
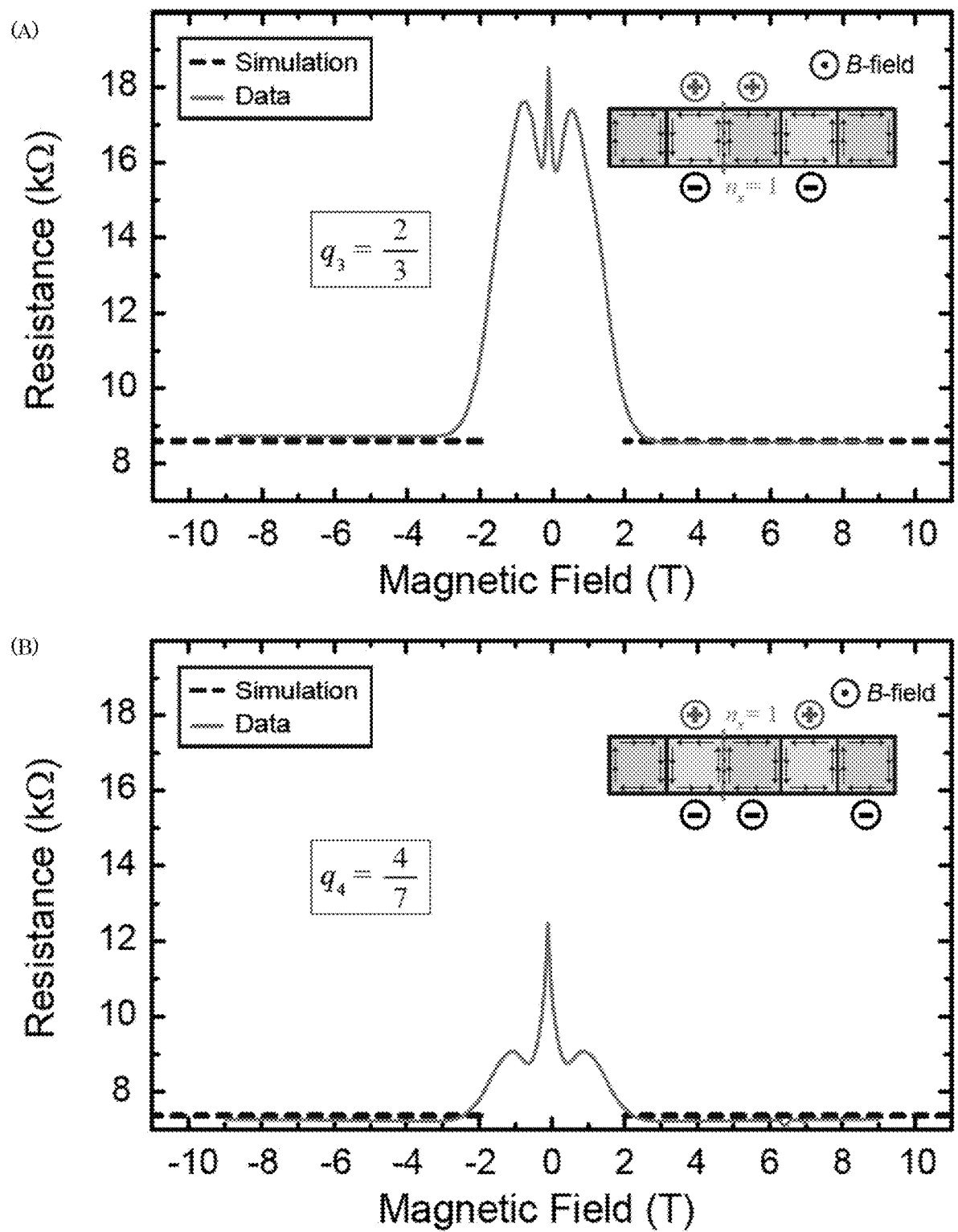
Figure 53:
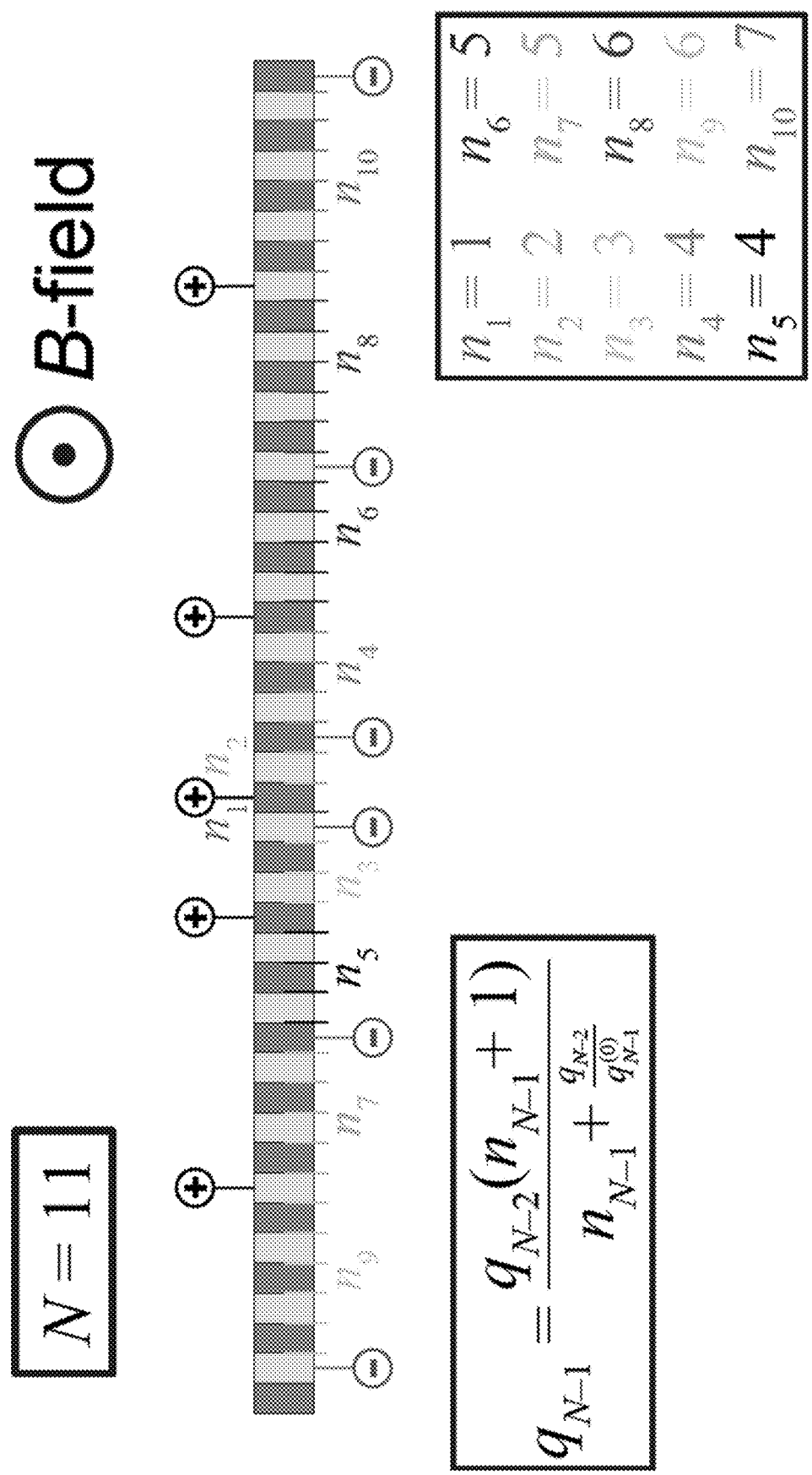
Figure 54:
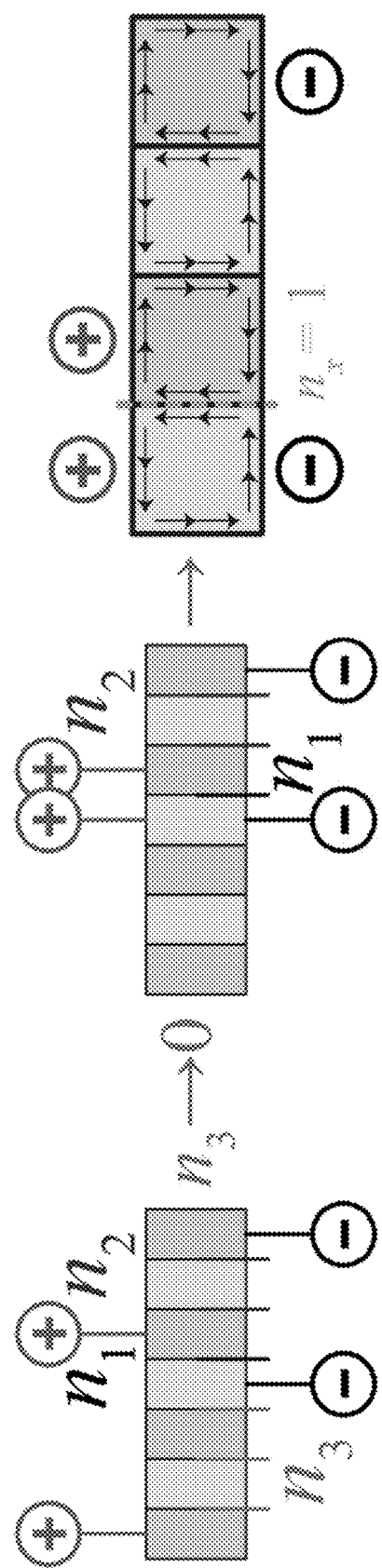
Figure 55:
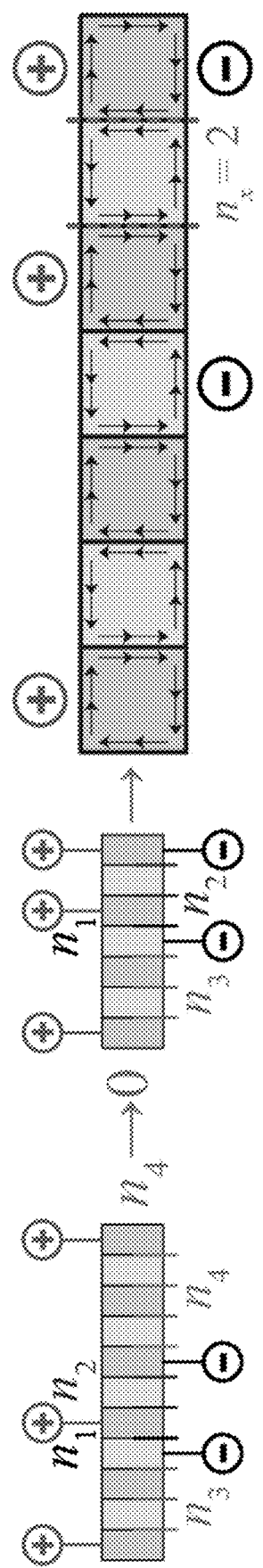
Figure 56:
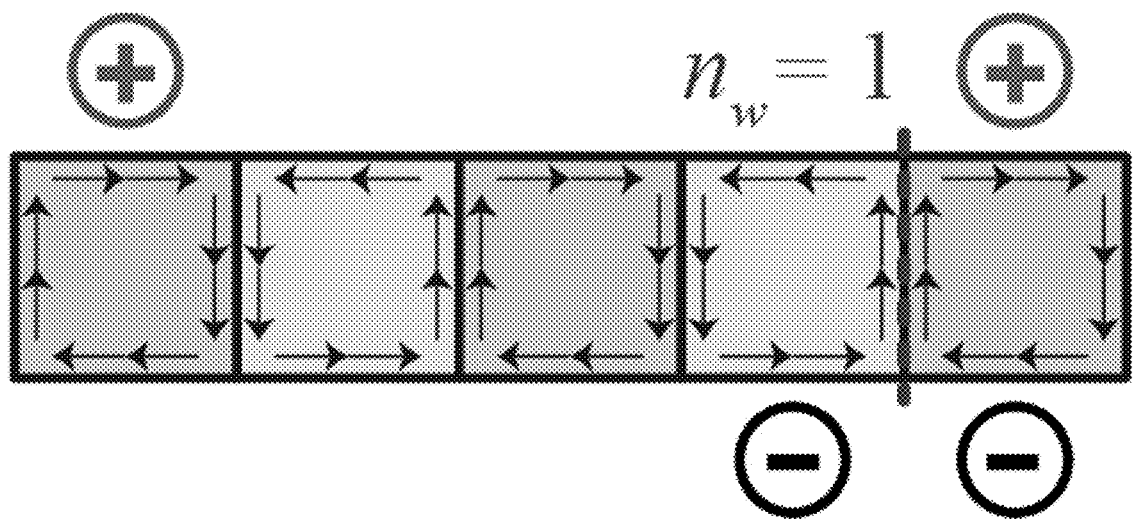
Figure 57:
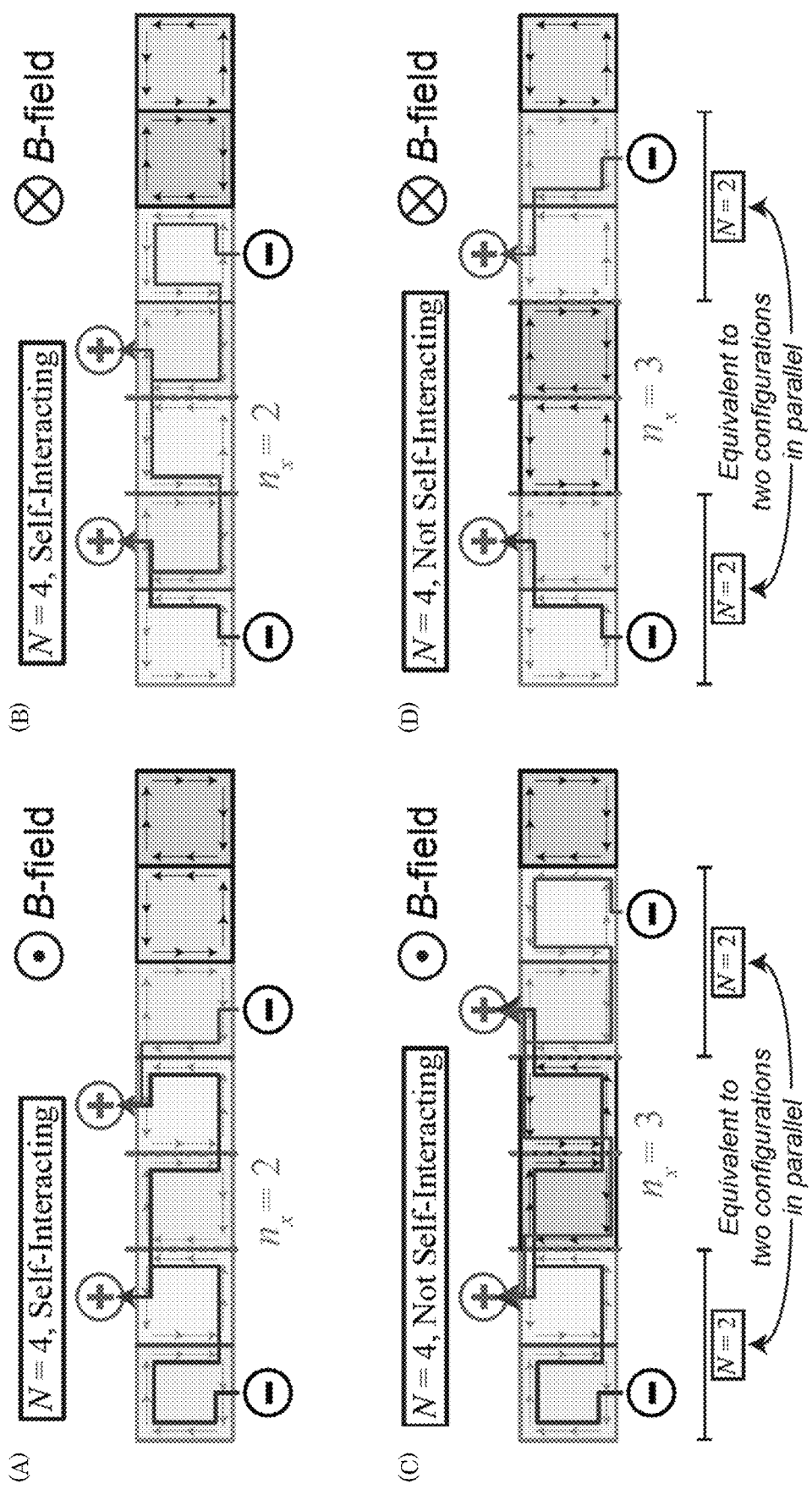
Figure 58:
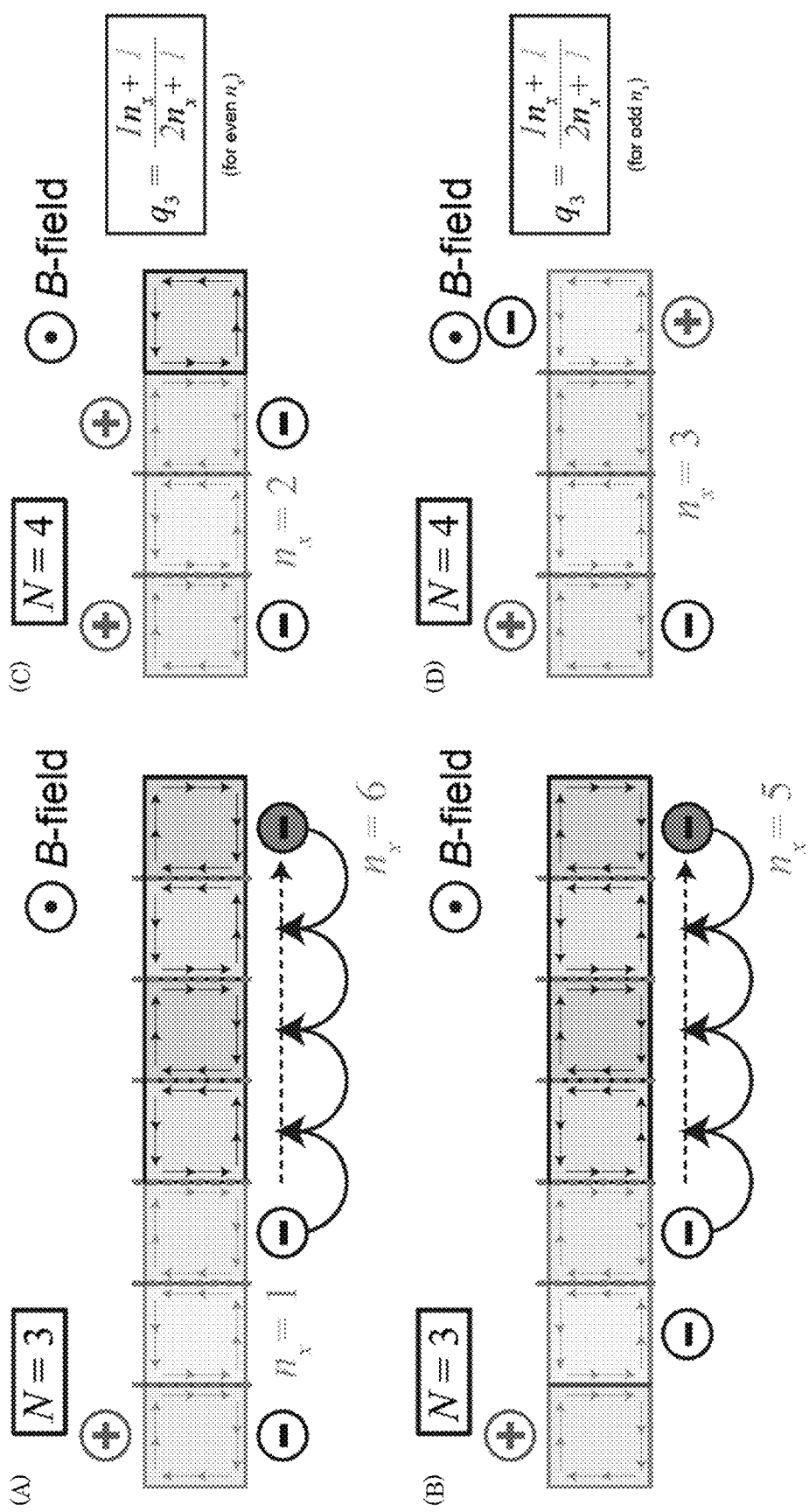
Figure 59:
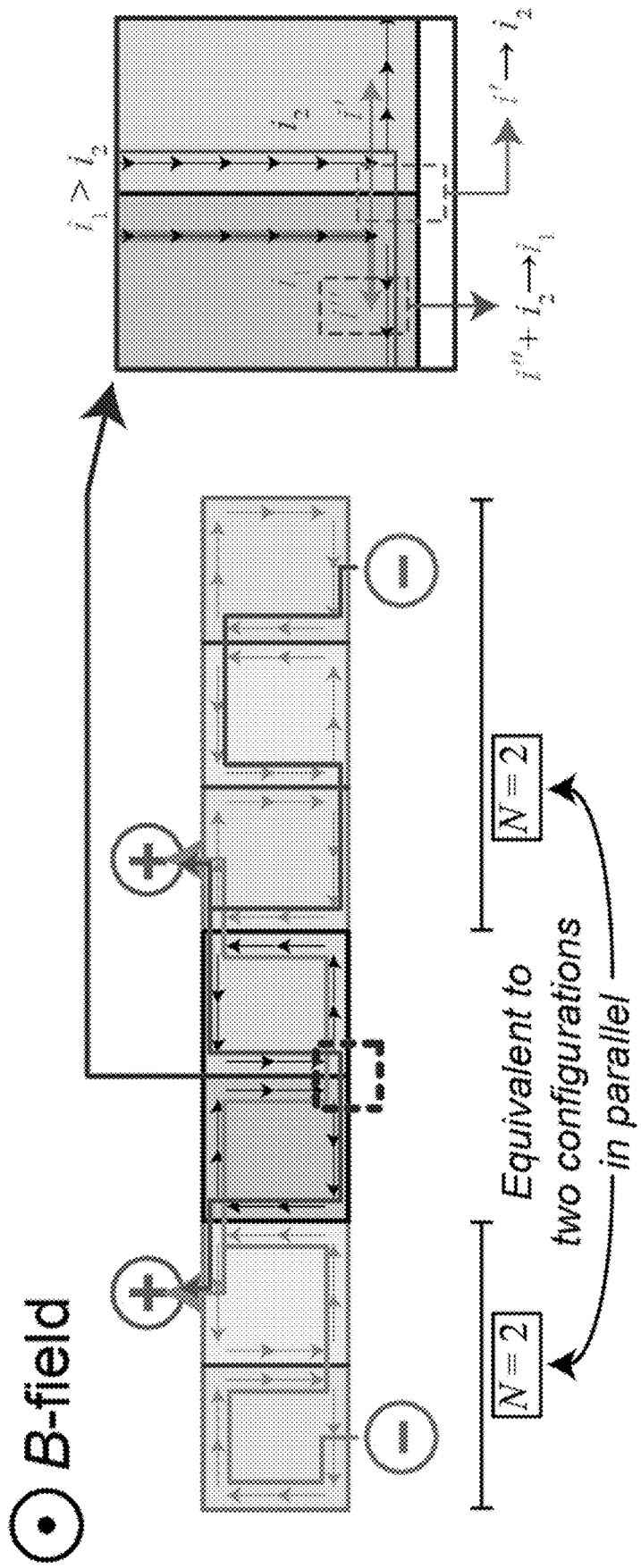

wherein a, b, and c are fit parameters;

FIG. 43 shows a capacitance model;

FIG. 44 shows details of circuit simulations and experimental data for resistance measured across points A and B (left) and C and D (right);

FIG. 45 shows Hall resistance and electron density for thicknesses of the S1813, a spacer for stability of the n region. To approximate the size of the pnJ width, a spacer layer thickness of 42.4 nm was measured with atomic force microscopy, and when that device was exposed to UV light, regions were maintained as n-type and had a change in electron density. Electron density decreased from about $1.7 \times 10^{10}$ cm$^{-2}$ to $0.98 \times 10^{10}$ cm$^{-2}$. The Hall plateau for after UV (in black) was still quantized at 9 T because the pnJ width had an upper bound of 200 nm;

FIG. 46 shows a longitudinal resistivity of a gateless P-N junction metrolog with 42.4 nm thick S1813 at room temperature;

FIG. 47 shows a gateless P-N junction metrolog represented by a schematic from a circuit simulator that included counterclockwise (CCW) and clockwise (CW) edge currents, as predicted in a positive magnetic field for p-type and n-type doping, respectively. There is a total of 4 entry/exit terminals in this depiction (two entries and two exits, totaling N), with the various $n_j$ values labeled in dashed rectangles. The effective resistance of the gateless P-N junction metrolog is found from its corresponding voltage measurement between points A and B (green squares);

FIG. 48 shows: (a) a two-terminal gateless P-N junction metrolog, wherein a negative terminal is moved along the gateless P-N junction metrolog. At each value of $n_1$, a simulation is performed to get the behavior of the CER ($q_1$); (b) corresponding simulations for (a), wherein if $n_1$ increases, $q_1$ increases linearly; (c) a three-terminal configuration of gateless P-N junction metrolog with alternating polarities with fixed $n_1$ and varying $n_2$; and (d) for $n_1=1$, simulations;

FIG. 49 shows: (a) a four-terminal configuration of a gateless P-N junction metrolog; (b) that CER has a value based on a parallel resistance configuration, wherein edge currents for central regions cancel and provide CER for two parallel N=2 configurations;

FIG. 50 shows: (a) a self-interacting four-terminal configuration of a gateless P-N junction metrolog, wherein two outermost adjacent pairs were inspected with the larger of the two being selected as $n_3$. The assignment of $n_2$ and $n_1$, indicated as arrows, followed an alternating succession; (b) once $n_j$ terms were assigned, CER was calculated as a function of $n_3$;

FIG. 51 shows (a) a self-interacting configuration of a gateless P-N junction metrolog with a non-alternating sequence of terminals; (b) data from simulations as squares. The two limiting cases are shown for $n_x \to 0$ and $n_x \to \infty$. CER in those limits are based on the corresponding limit. The limited-case CERs are used to construct the for all $n_x$; and (c) and (d) using unit terminals, symmetry of odd and even cases of $n_x$. When part of the configuration is reflected about the horizontal, the edge state picture dictates that the configuration will switch its self-interaction condition;

FIG. 52 shows (a) experimental data for a non-alternating, non-self-interacting, N=4 configuration of a gateless P-N junction metrolog. The configuration includes two isolated N=2 configurations, one of them being a unit terminal. The calculation and simulation are together represented by the dotted line at a resistance value of $\frac{2}{3}R_H$; and (b) experimental data for a non-alternating, non-self-interacting, N=5 configuration of a gateless P-N junction metrolog. The configuration includes an N=2 unit terminal and an N=3 alternating, self-interacting terminal. The calculation and simulation are together represented by the dotted line at the resistance value of $\frac{4}{7}R_H$;

FIG. 53 shows a configuration of a gateless P-N junction metrolog, wherein an N=11 alternating configuration has $n_j$ terms assigned starting with the larger of the two outermost pairs of adjacent terminals;

FIG. 54 shows a sub-calculation of the gateless P-N junction metrolog shown in FIG. 53. To solve for the $q_3^{(0)}$ term, which is the case where $n_3 \to 0$, the gateless P-N junction metrolog has total CER calculated;

FIG. 55 shows a sub-calculation of the gateless P-N junction metrolog shown in FIG. 53. To solve for the $q_4^{(0)}$ term, which is the case where $n_4 \to 0$, the gateless P-N junction metrolog has total CER calculated;

FIG. 56 shows a sub-sub-calculation of the gateless P-N junction metrolog configuration from FIG. 55, wherein every additional terminal affects the calculation that involves sub-calculations of other configurations;

FIG. 57 shows: a self-interacting, non-alternating terminal at (a) positive and (b) negative B-fields. The difference in electron flow does not change the configuration's status, and CER remains the same; and for (c) and (d) a similar set of configurations that is not self-interacting;

FIG. 58 shows: (a) CER for a unit terminal is unaffected when a third terminal is introduced, and the formula simplifies to a constant function of $n_x$; (b) the same result as (a) for a configuration that has two like-polar terminals at its endpoint; and (c) and (d) even and odd application of a formula for $n_x$ to switch depending on the orientation of two like-polar, adjacent terminals; and FIG. 59 shows a semiclassical visualization of edge currents canceling at junction crossing points, wherein for $i_1 > i_2$, a portion of $i_1$ do not cross the junction (i") due to the difference in electric potential. The portion that crosses the junction, i', will approach the value of $i_2$, and in the steady-state, the two values will match.

DETAILED DESCRIPTION

A detailed description of one or more embodiments is presented herein by way of exemplification and not limitation.

It has been discovered that a gateless P-N junction metrolog and processes herein provide p-n junctions working in a quantum Hall regime for resistance scaling and a plurality of resistance traceable to the quantum Hall effect. The gateless P-N junction metrolog provides values of quantized resistance that overcomes problems of conventional technology for dissemination of the ohm and reduces a chain of calibration.

Gateless P-N junction metrolog 200 and processes herein lyses cell 236. In an embodiment, with reference to FIG. 1, FIG. 2, FIG. 3, FIG. 4, and FIG. 5, gateless P-N junction metrolog 200 includes: junction member 218 including: p-interface 228; and n-interface 230 disposed laterally and adjacent to p-interface 228; and p-n junction 232 disposed at where p-interface 228 and n-interface 230 contact; drain electrode 220 disposed on junction member 218; source electrode 222 disposed on junction member 218 such that source electrode 222 is spaced apart from and opposing drain electrode 220; n-polymer 216 disposed on n-interface 230 of junction member 218; p-polymer 214 disposed on p-interface 228 of junction member 218 such that n-polymer 216 is interposed between p-polymer 214 and n-interface 230; mediation polymer 210 disposed on p-polymer 214 such that p-polymer 214 is interposed between mediation polymer 210 and junction member 218; and mediator 212 disposed in mediation polymer 210 and that receives electrons 226 from junction member 218 in forming p-interface 228.

Gateless P-N junction metrolog 200 can include substrate 224 on which is disposed junction member 218. Substrate 224 can include a semiconducting wafer with a dielectric spacer layer or an insulating support wafer to provide physical stability for the gateless P-N junction metrolog 200. Exemplary substrates include $SiO_2$, SiC, and the like. A thickness of substrate 224 can be from 2 mm to 0.2 mm, specifically from 1 mm to 0.3 mm, and more specifically from 0.5 mm to 0.4 mm. Moreover, substrate 224 should exhibit insulating properties to prevent interaction with junction member 218.

Junction member 218 can include a material that provides electrical Hall conductivity and can be three- or two-dimensional. Exemplary junction members 218 include graphene, GaAs, and the like. A thickness of junction member 218 can be from 100 μm to 0.1 nm, specifically from 100 nm to 0.3 nm, and more specifically from 1 nm to 0.35 nm. Junction member 218 has a minimum electrical conductivity of 0.1 mS/mm. In an embodiment, junction member 218 includes a two-dimensional electrical conductor. According to an embodiment, the two-dimensional electrical conductor is graphene, molybdenum disulfide, or silicene. It is contemplated that the junction member 218 can be chemically modified to include a functional group, oxidation state, and the like. Exemplary functional groups that can be included in junction member 218 include chromium tricarbonyl, diazonium salts, nitrenes, carbenes, and the like.

Junction member 218 includes p-interface 228 disposed at a surface adjacent to p-polymer 214 and n-interface 230 disposed at a surface adjacent to n-polymer 216 such that p-interface 228 and n-interface 230 are laterally disposed adjacent to one another in junction member 218. P-interface 228 can include aforementioned functional groups to enable clockwise or counterclockwise electron flow in a magnetic field and can be p-doped graphene. It is contemplated that p-interface 228 has an electron density that can be from $-10^{13}$ cm$^{-2}$ to 0 cm$^{-2}$, specifically from $-10^{12}$ cm$^{-2}$ to $-10^9$ cm$^{-2}$, and more specifically $-10^{11}$ cm$^{-2}$ to $-10^{10}$ cm$^{-2}$, where a negative sign indicates dominance of positive charges. Moreover, p-interface 228 has an electron flow opposite to n-interface 230. P-interface 228 has a minimum electrical conductivity of 0.1 mS/mm. N-interface 230 can include aforementioned functional groups to enable clockwise or counterclockwise electron flow in a magnetic field and can be n-doped graphene. It is contemplated that n-interface 230 has an electron density from $10^{13}$ cm$^{-2}$ to 0 cm$^{-2}$, specifically from $10^{12}$ cm$^{-2}$ to $10^9$ cm$^{-2}$, and more specifically $10^{11}$ cm$^{-2}$ to $10^{10}$ cm$^{-2}$. Moreover, n-interface 230 has an electron flow opposite to p-interface 228. N-interface 230 has a minimum electrical conductivity of 0.1 mS/mm.

Drain electrode 220 can include a metallic layer to provide adhesion to substrate 224 and can be a metal or superconducting metal. Exemplary junction members 220 include Au, Ti, NbTiN, and the like. A thickness of drain electrode 220 can be from 50 nm to 500 nm, specifically from 100 nm to 400 nm, and more specifically from 250 nm to 350 nm. Moreover, drain electrode 220 provides flow of current. Drain electrode 220 has a minimum electrical conductivity of 0.1 mS/mm. In an embodiment, drain electrode 220 includes a two-dimensional electrical conductor. According to an embodiment, the two-dimensional electrical conductor is graphene, molybdenum disulfide, or silicene.

Source electrode 222 can include a metallic layer to provide adhesion to substrate 224 and can be an ordinary metal or superconducting metal. Exemplary junction members 222 include Au, Ti, NbTiN, and the like. A thickness of source electrode 222 can be from 50 nm to 500 nm, specifically from 100 nm to 400 nm, and more specifically from 250 nm to 350 nm. Moreover, source electrode 222 provides flow of current. Source electrode 222 has a minimum electrical conductivity of 0.1 mS/mm. In an embodiment, source electrode 222 includes a two-dimensional electrical conductor. According to an embodiment, the two-dimensional electrical conductor is graphene, molybdenum disulfide, or silicene.

N-polymer 216 can include additives to enhance electrical insulation and can be an insulating mineral. N-polymer prevents the transfer of electrons 226 between junction member 218 and mediation polymer 210. That is, n-polymer 216 may not communicate a selected wavelength, e.g., UV, of light, from mediation polymer 210 to junction member 218 to form n-interface 230 (relative to p-interface 228) by blocking extraction of electrons 226 in a region that becomes n-interface 230 of junction member 218, wherein either the light of selected wavelength or electrons 226 are not communicated from junction member 218 through n-polymer 216. Exemplary n-polymer 216 include polymethyl methacrylate, trihydroxybenzophenone, and the like. A thickness of n-polymer 216 can be from 50 nm to 1000 nm, specifically from 100 nm to 500 nm, and more specifically from 300 nm to 400 nm. N-polymer 216 has a maximum electrical conductivity of 0.001 mS/cm. In an embodiment, n-polymer 216 includes electronic grade propylene glycol monomethyl ether acetate, cresol novolak resin, fluoroaliphatic polymer ester, a diazo photoactive compound, and the like.

P-polymer 214 can include additives to prevent interaction between junction member 218 and mediation polymer 210 and can be chemically similar to compounds used for photoresists. P-polymer 214 prevents direct physical interaction between the mediation polymer 210 and mediator 212. That is, p-polymer 214 communicates a selected wavelength, e.g., UV, of light, from mediation polymer 210 to junction member 218 to form p-interface 228 via extraction of electrons 226 in a region that becomes p-interface 228 of junction member 218, wherein electrons 226 are communicated from junction member 218, through p-polymer 214, and received by mediator 212 in mediation polymer 210. Exemplary p-polymers 214 include polymethyl methacrylate, acrylic resins, and the like. A thickness of p-polymer 214 can be from 50 nm to 1000 nm, specifically from 100 nm to 500 nm, and more specifically from 200 nm to 300 nm. P-polymer 214 has a maximum electrical conductivity of 0.001 mS/cm. In an embodiment, p-polymer 214 includes a composition of ethyl lactate and poly(methyl methacrylate/methacrylic acid).

Mediation polymer 210 can include additives to enhance electron 226 acceptance from junction member 218 to mediator polymer 210 and can be chemically similar to compounds used for photoresists. Mediation polymer 210 includes mediator 212 and enables electron transfer from junction member 218 through p-polymer 214. That is, mediation polymer 210 communicates a selected wavelength, e.g., UV, of light to junction member 218 to form p-interface 228 via extraction of electrons 226 in a region that becomes p-interface 228 of junction member 218 so that electrons 226 are communicated from junction member 218, through p-polymer 214, and received by mediator 212 in mediation polymer 210. Exemplary mediation polymer 210 include methyl styrene, chloromethyl acrylate copolymer, and the like. A thickness of mediation polymer 210 can be from 50 nm to 1000 nm, specifically from 100 nm to 500 nm, and more specifically from 300 nm to 400 nm. In an embodiment, mediation polymer 210 includes anisole, methyl styrene, chloromethyl acrylate copolymer, and the like.

Figure 1:
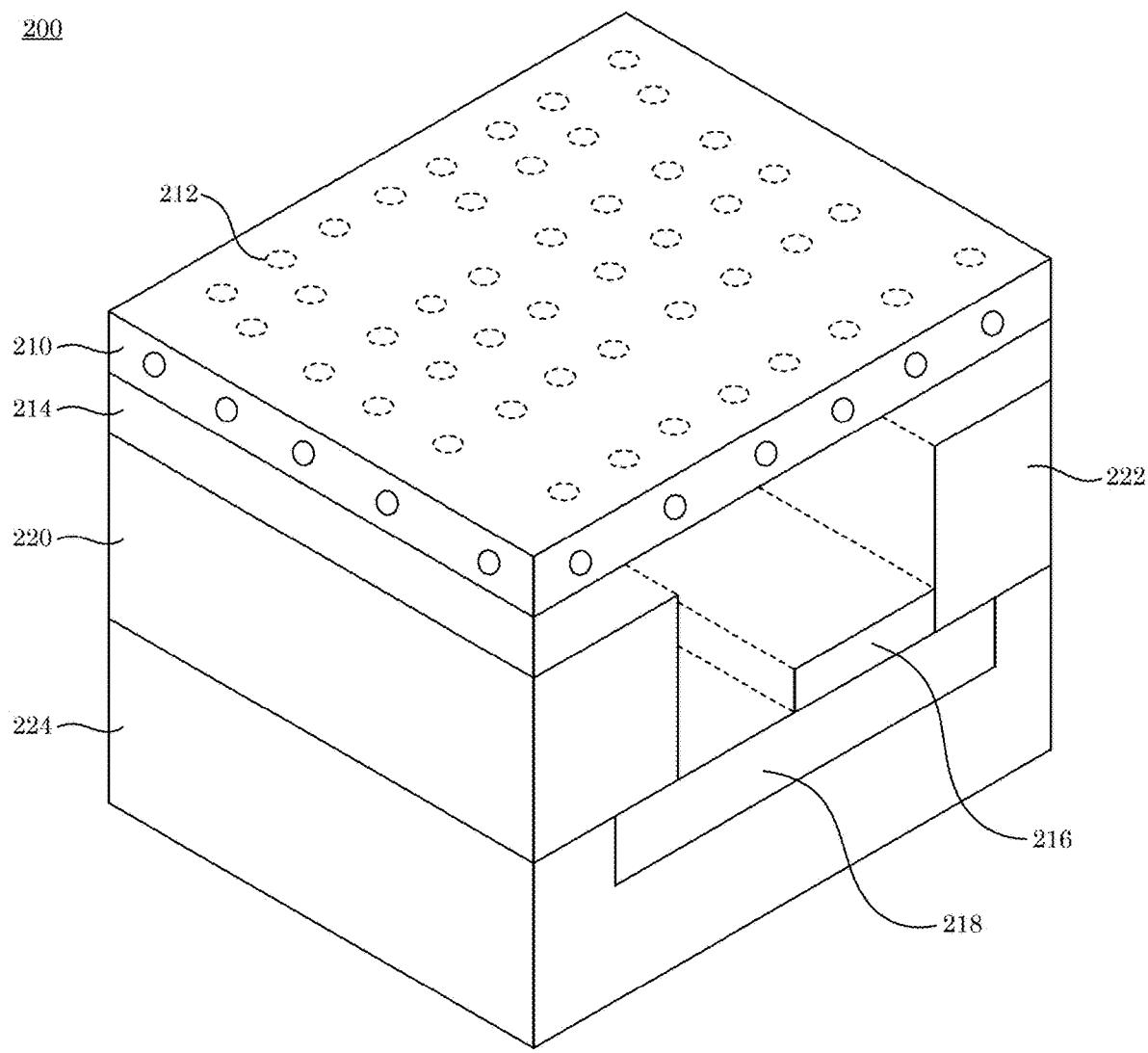
FIG. 1 shows a perspective view of a gateless P-N junction metrolog.
Figure 2:
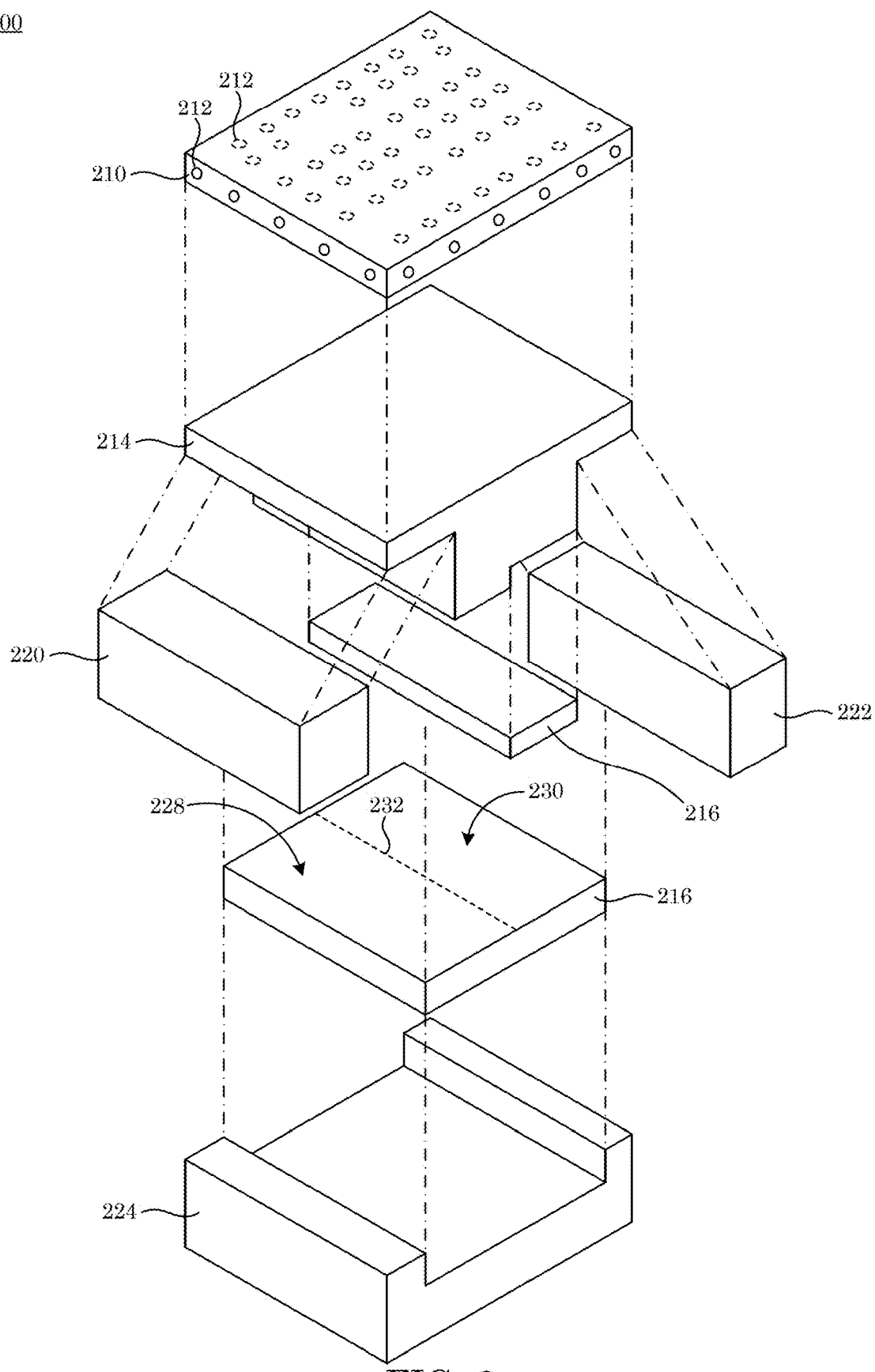
FIG. 2 shows an exploded view of the gateless P-N junction metrolog shown in FIG. 1.
Figure 3:
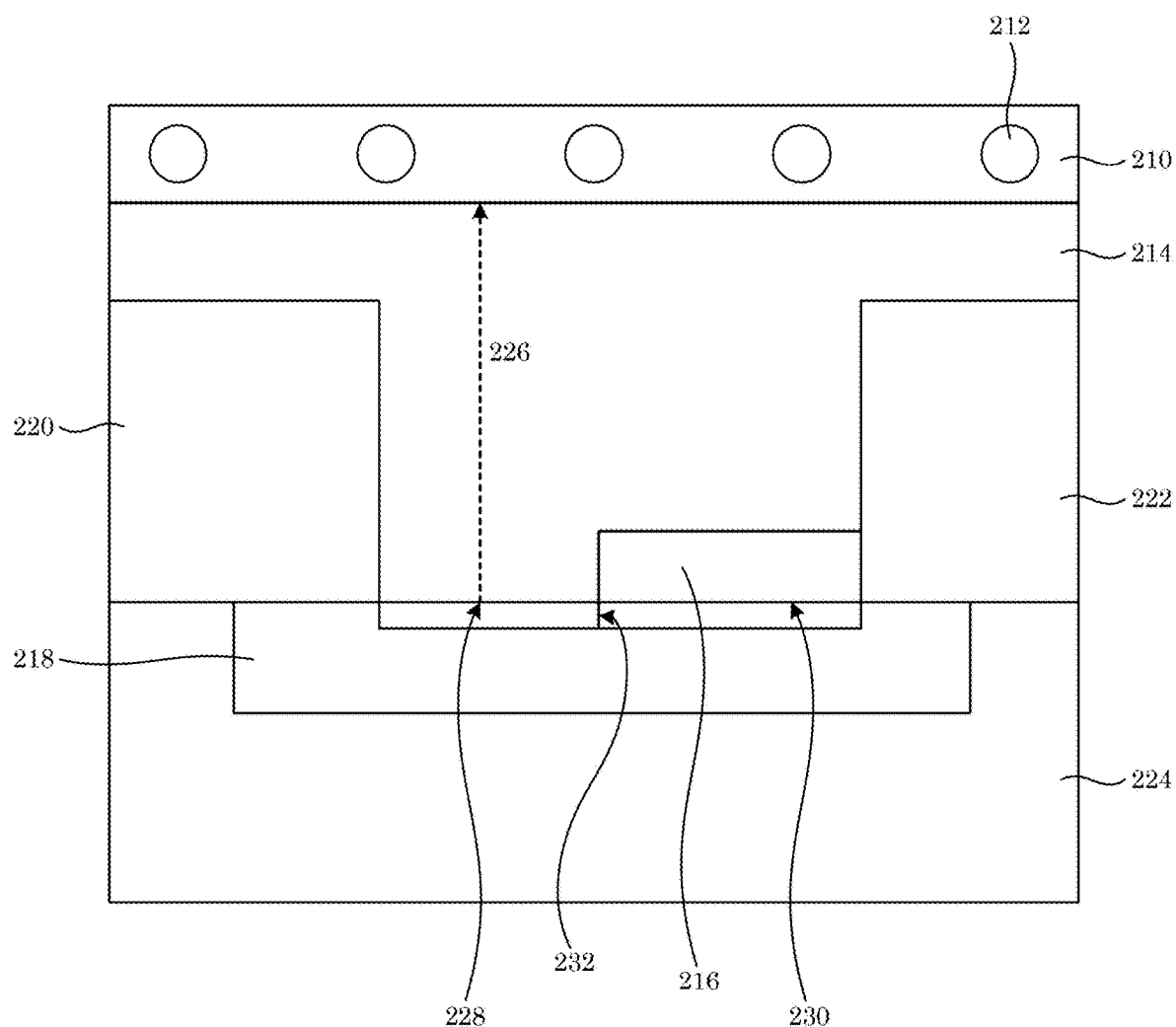
FIG. 3 shows a cross-section along line A-A of the gateless P-N junction metrolog shown in FIG. 4.
Figure 4:
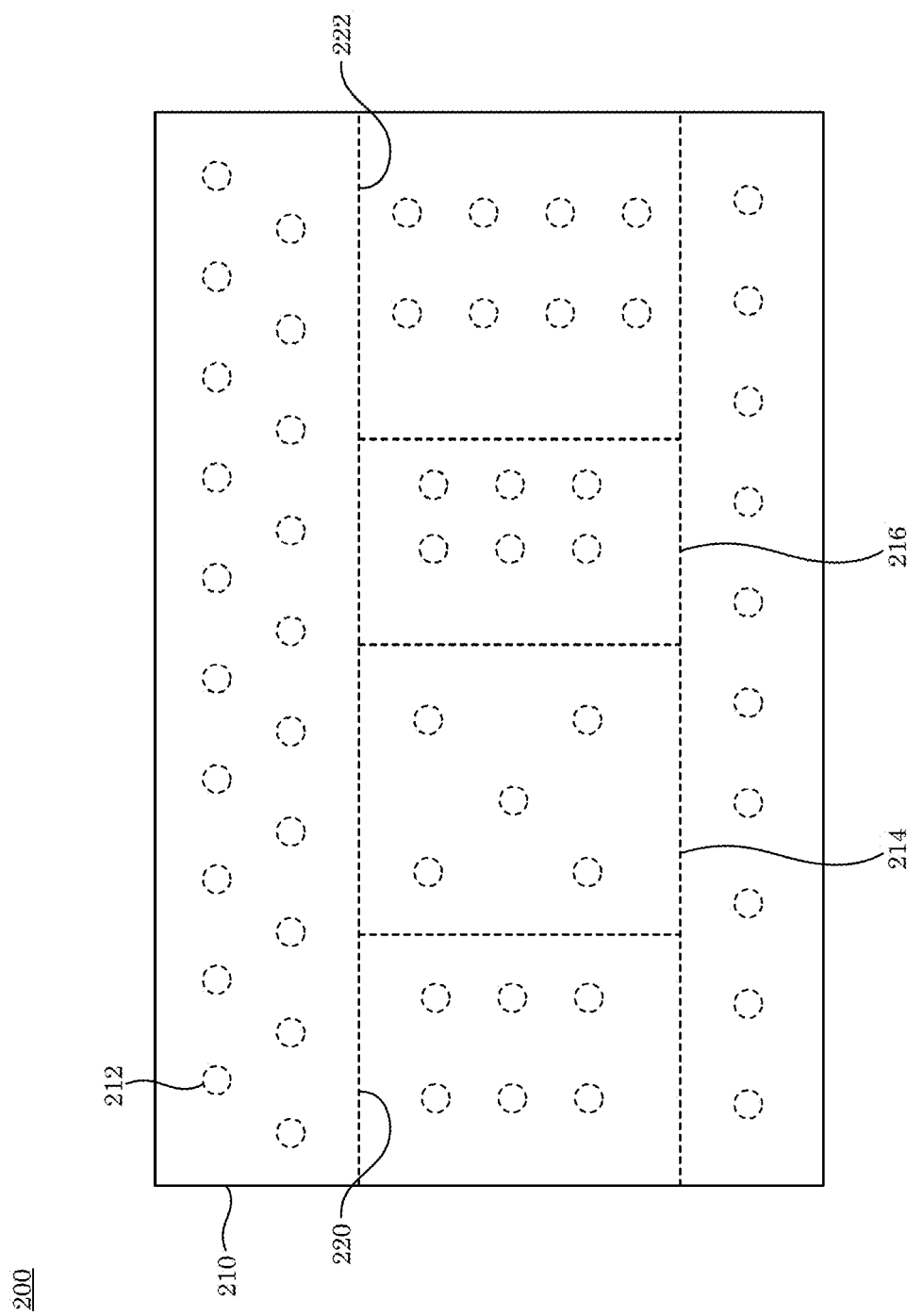
FIG. 4 shows a plan view of the gateless P-N junction metrolog shown in FIG. 1.
Figure 5:
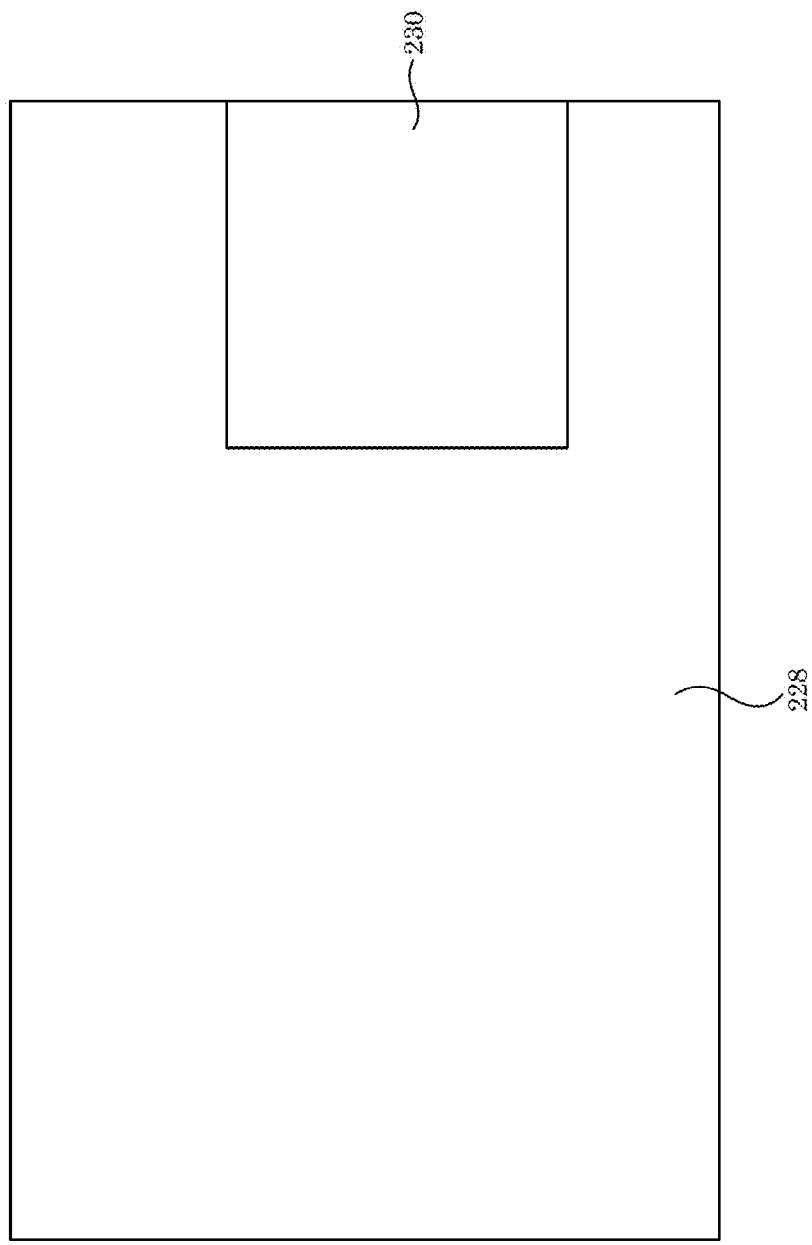
FIG. 5 shows a junction member for the gateless P-N junction metrolog shown in FIG. 1.
Figure 6:
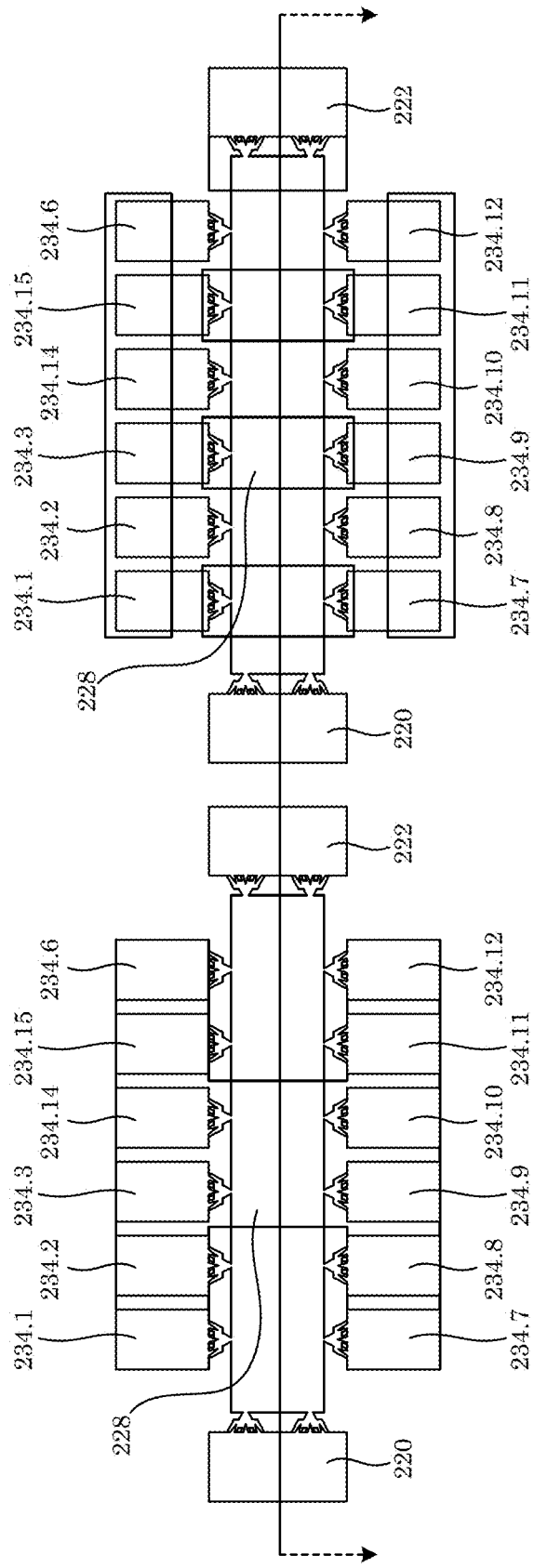
FIG. 6 shows a gateless P-N junction metrolog.
Figure 7:
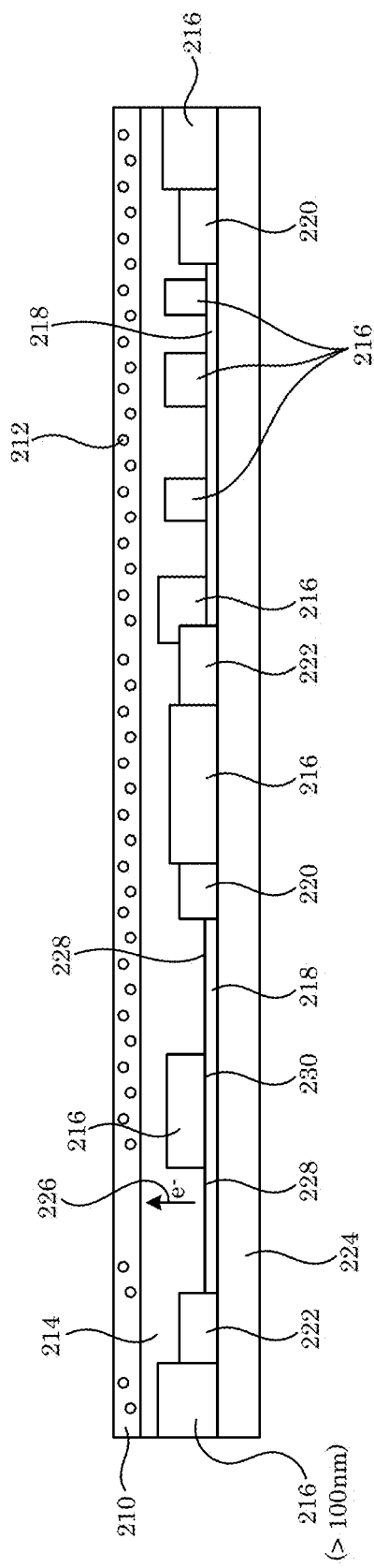
FIG. 7 shows a cross-section of the gateless P-N junction metrolog shown in FIG. 6.
Figure 8:
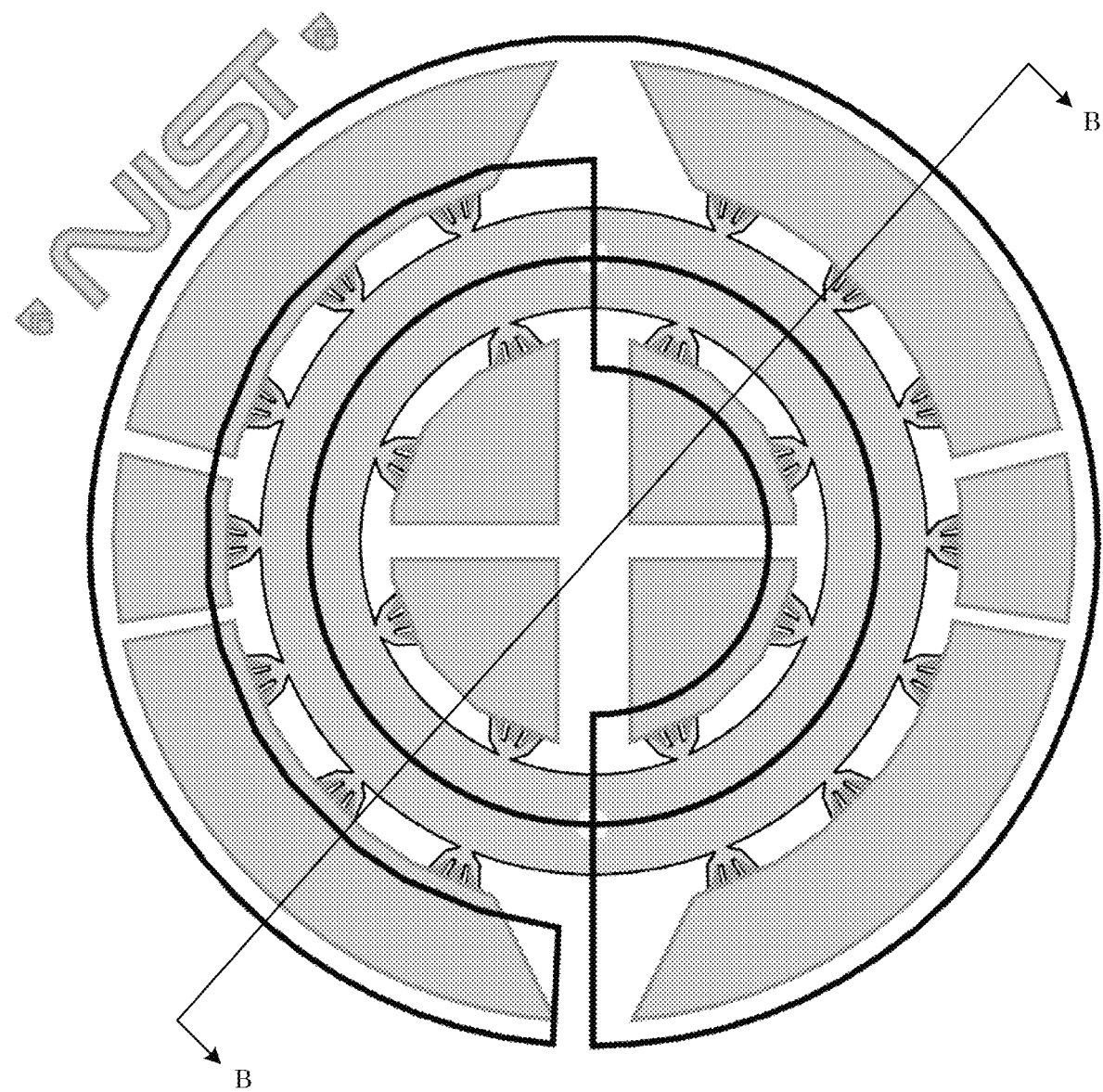
FIG. 8 shows a gateless P-N junction metrolog.
Figure 9:
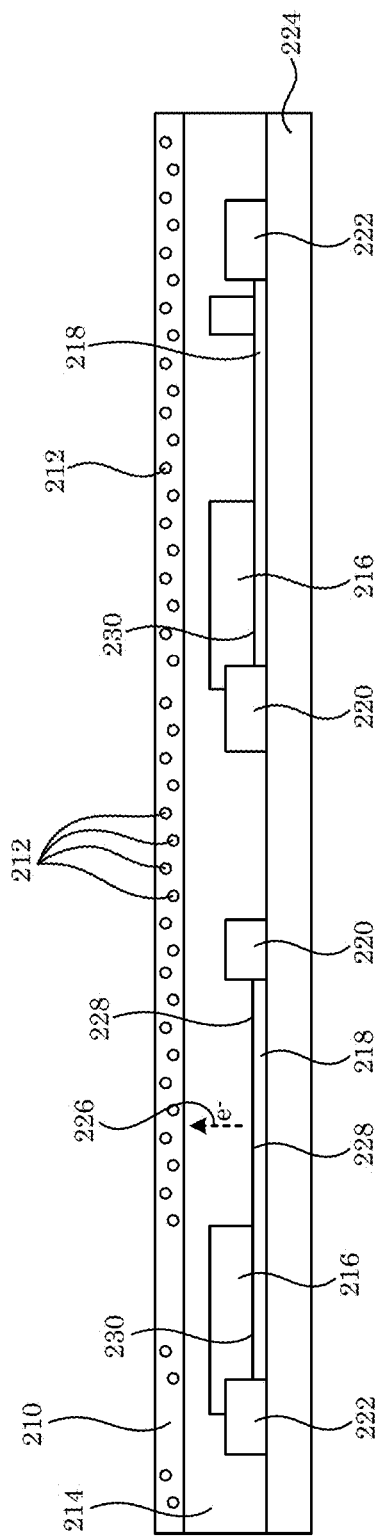
FIG. 9 shows a cross-section of the gateless P-N junction metrolog shown in FIG. 8.
Figure 10:
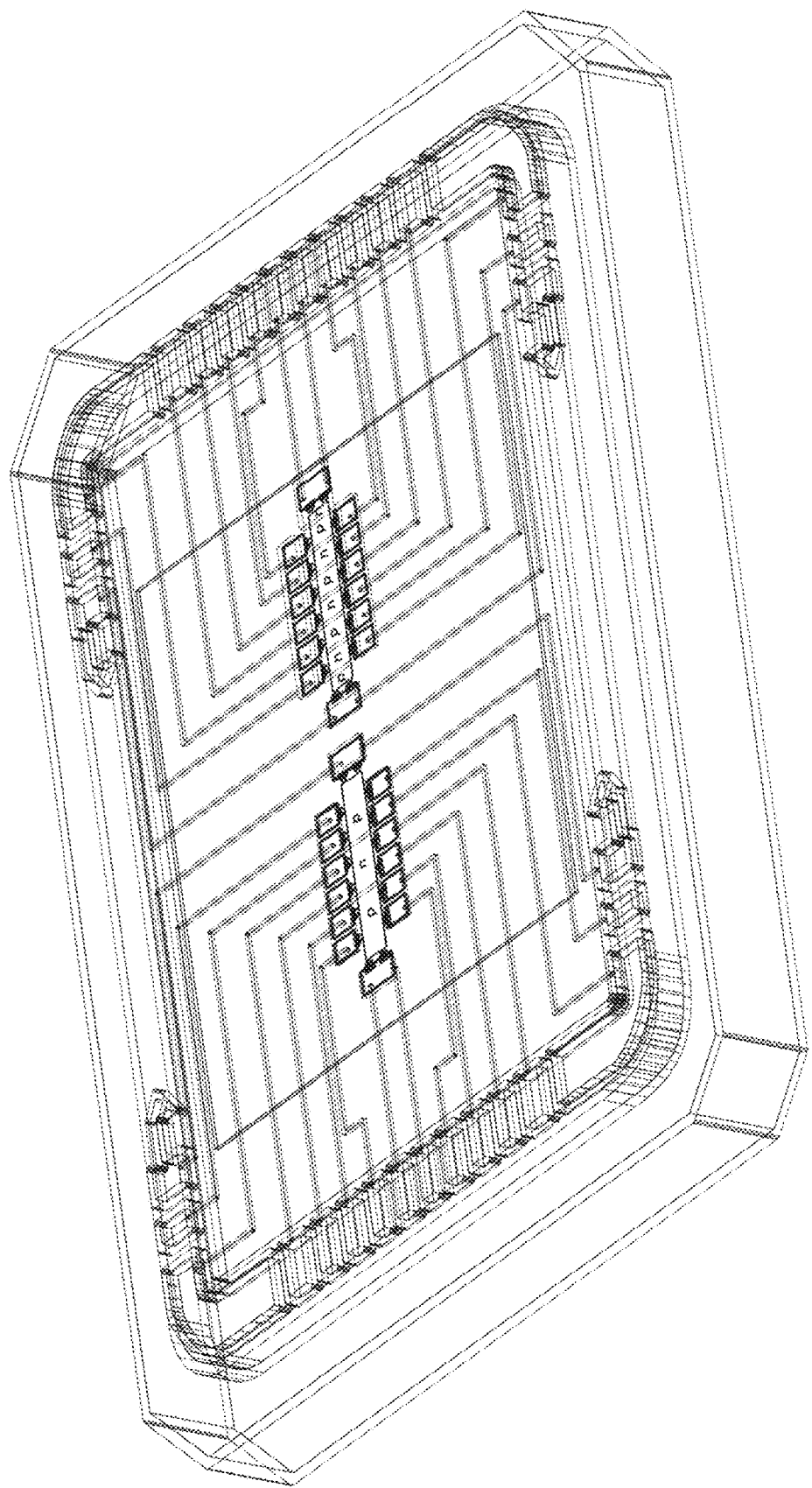
FIG. 10 shows a perspective view of a gateless P-N junction metrolog.
Figure 11:
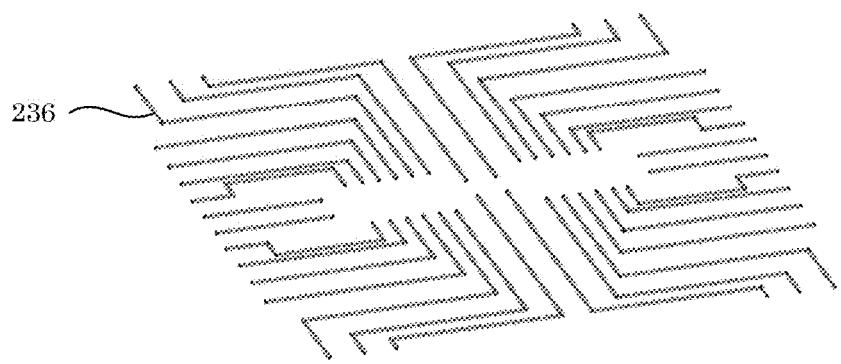
FIG. 11 shows an exploded view of the gateless P-N junction metrolog shown in FIG. 10.
Figure 11:
Figure 11:
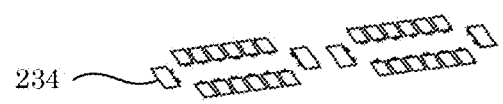
Figure 11:
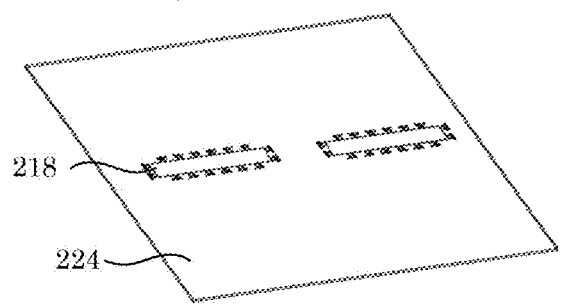
Figure 11:
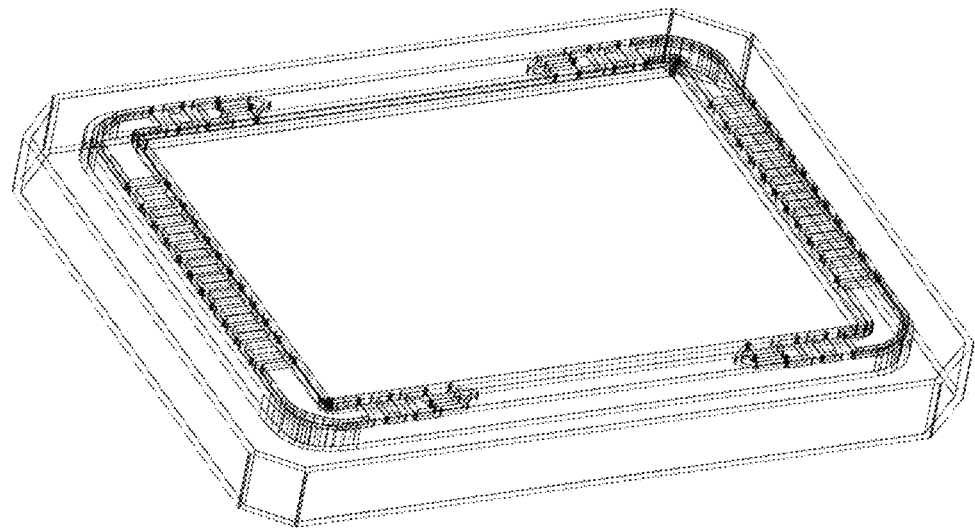
Figure 12:
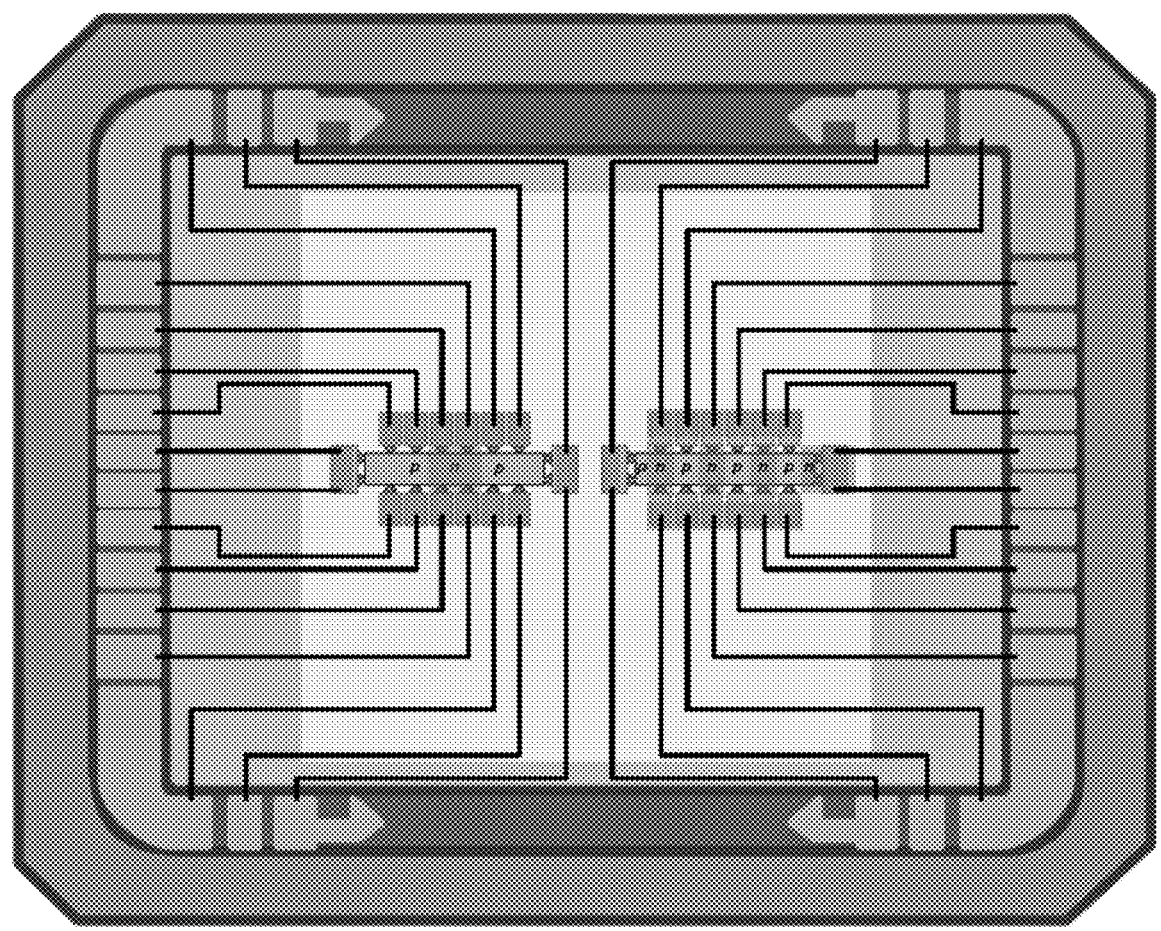
FIG. 12 shows a plan view of the gateless P-N junction metrolog shown in FIG. 10.
Figure 13:
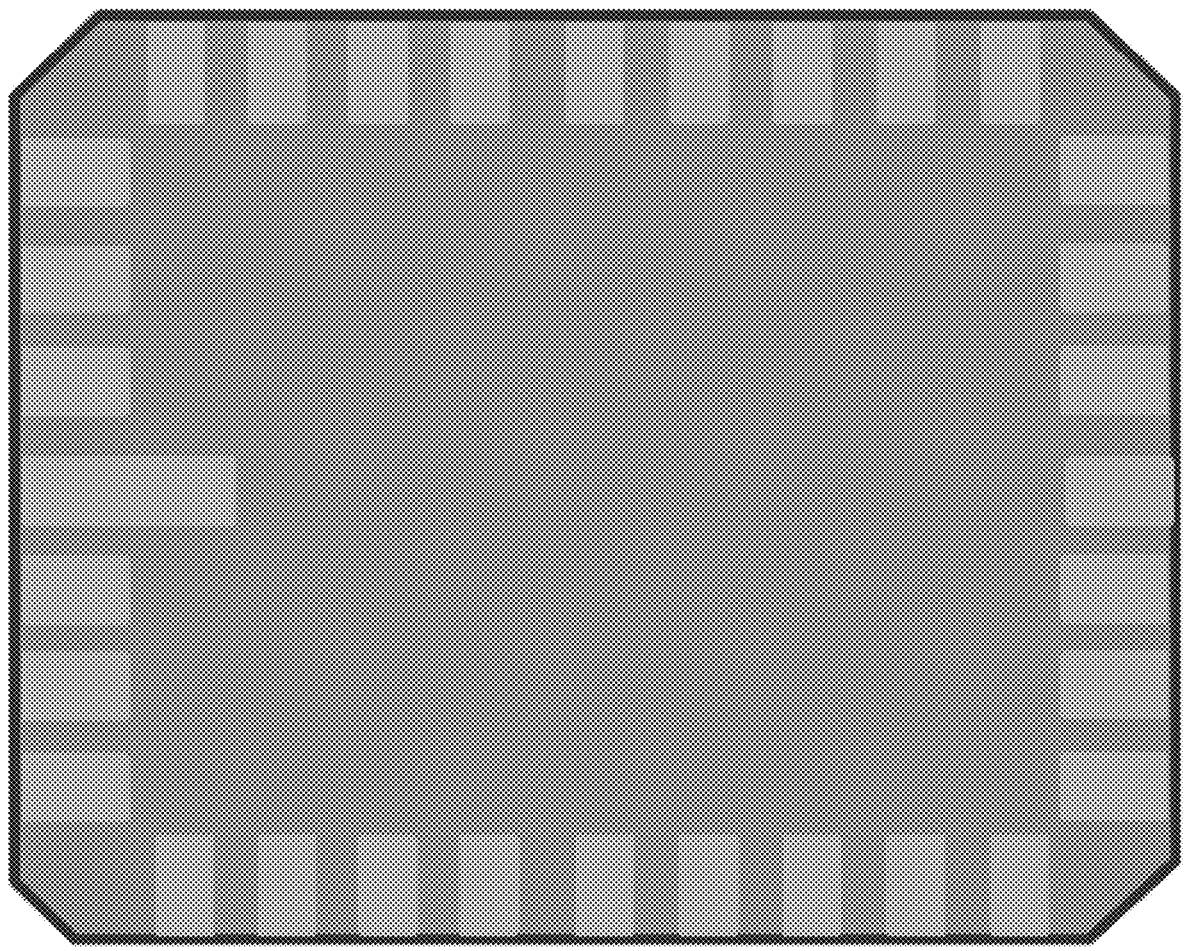
FIG. 13 shows a bottom view of the gateless P-N junction metrolog shown in FIG. 10.
Figure 14:
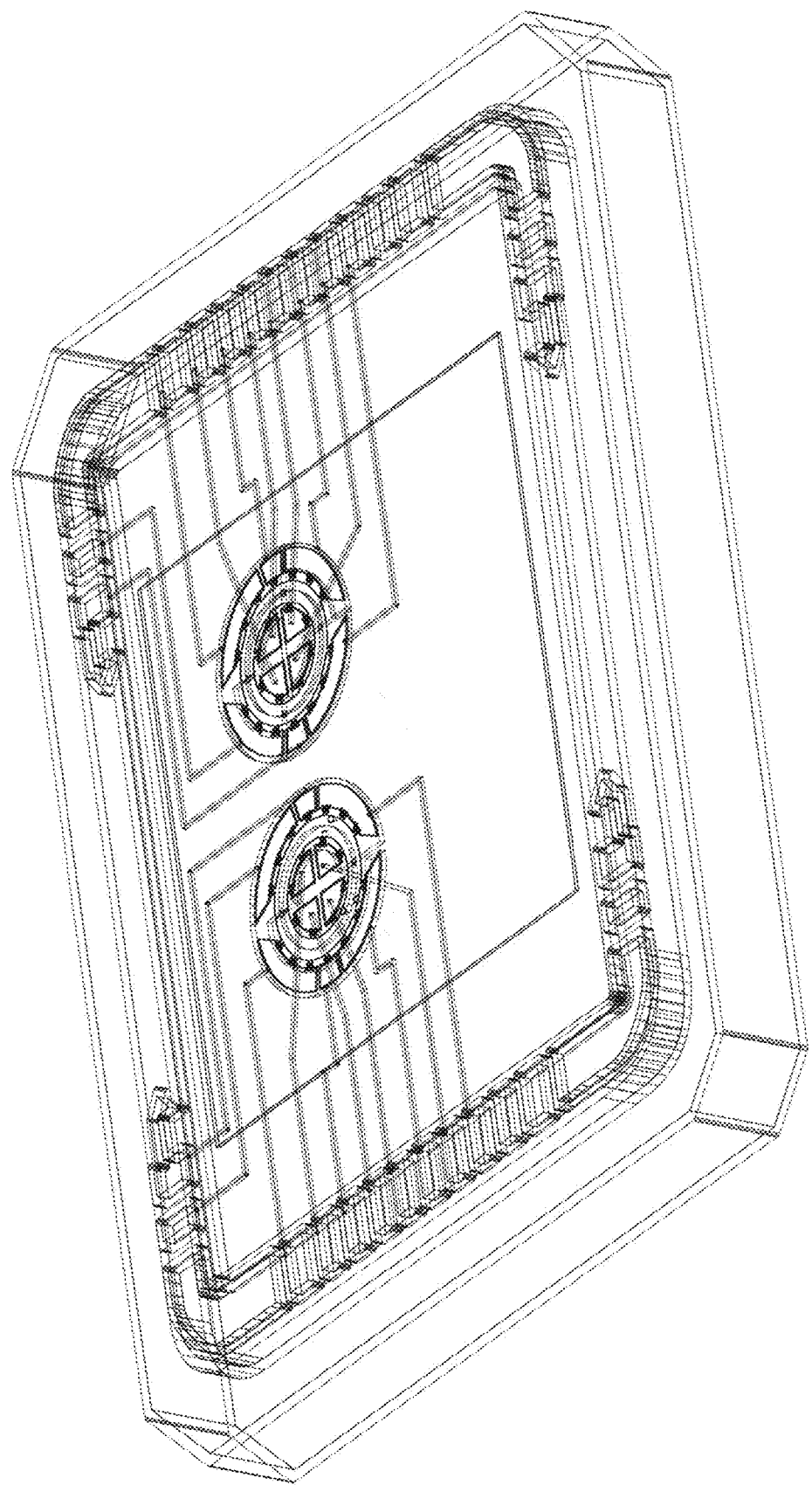
FIG. 14 shows a perspective view of a gateless P-N junction metrolog.
Figure 15:
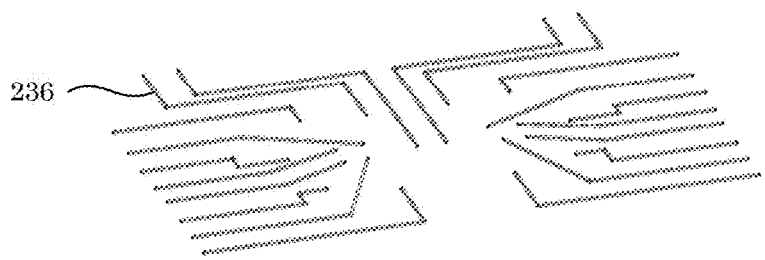
FIG. 15 shows an exploded view of the gateless P-N junction metrolog shown in FIG. 14.
Figure 15:
Figure 15:
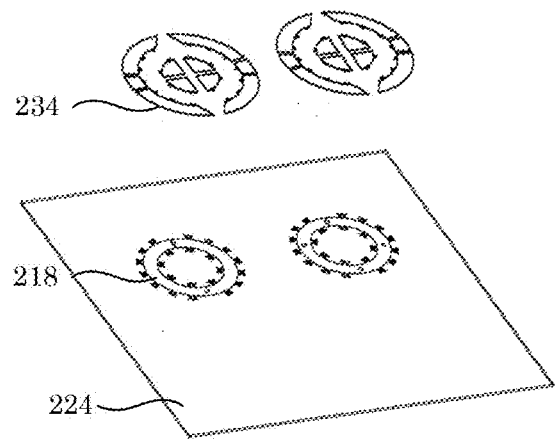
Figure 15:
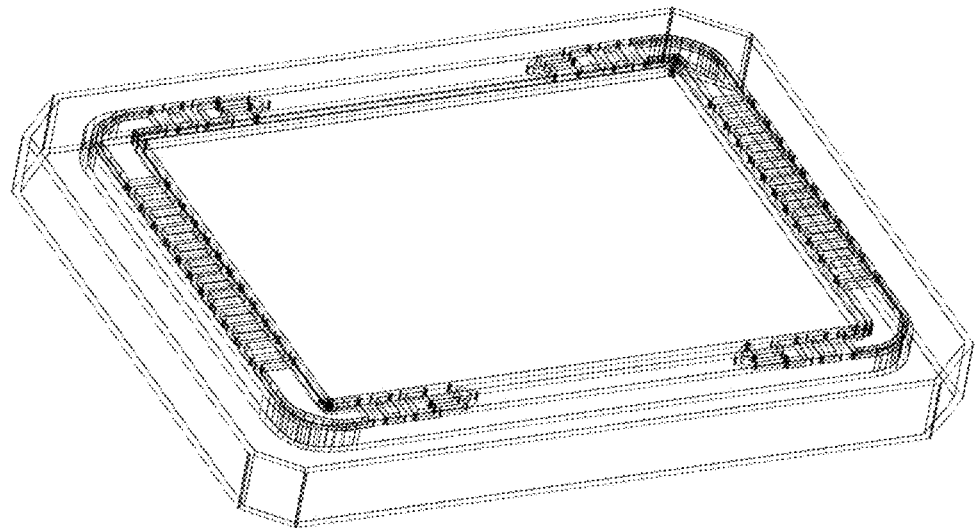
Figure 16:
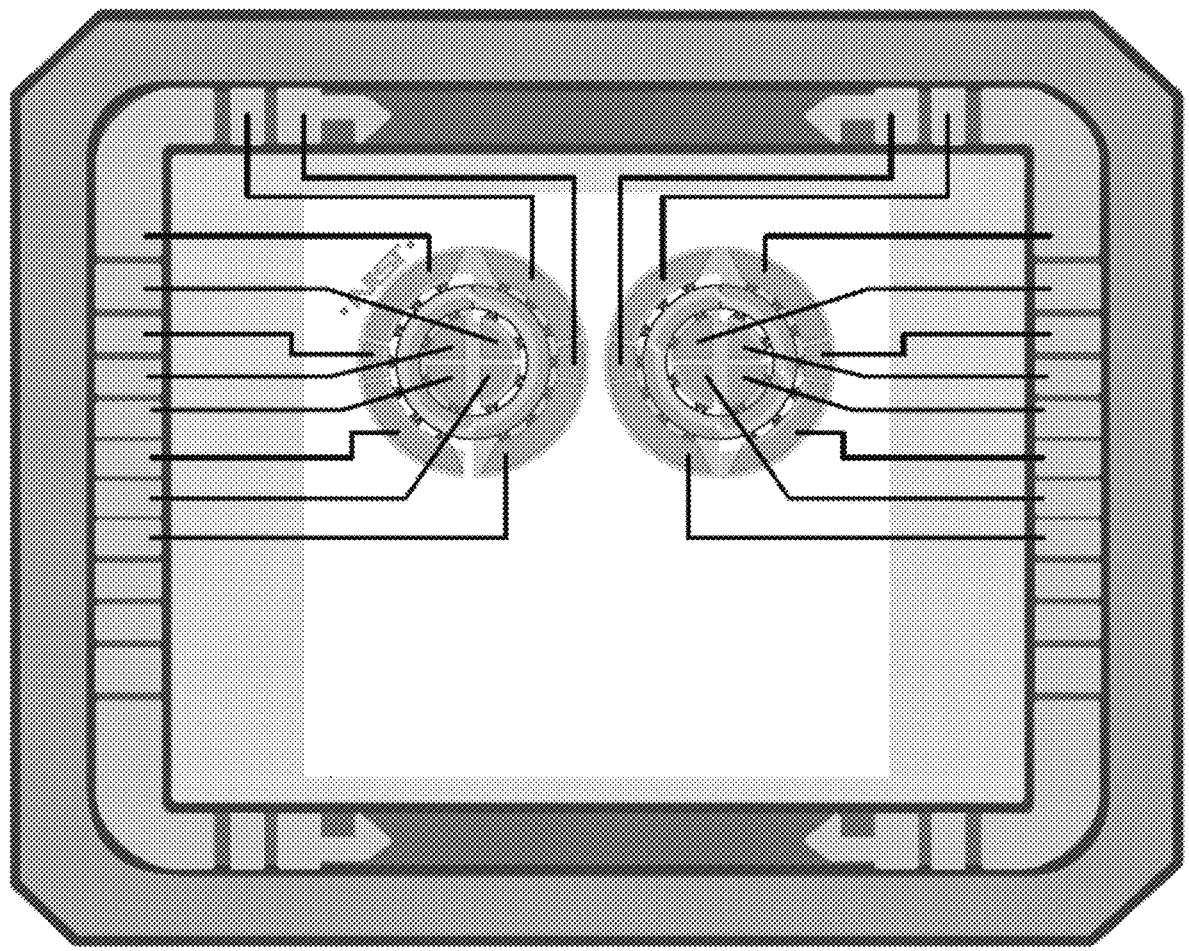
FIG. 16 shows a plan view of the gateless P-N junction metrolog shown in FIG. 14.
Figure 17:
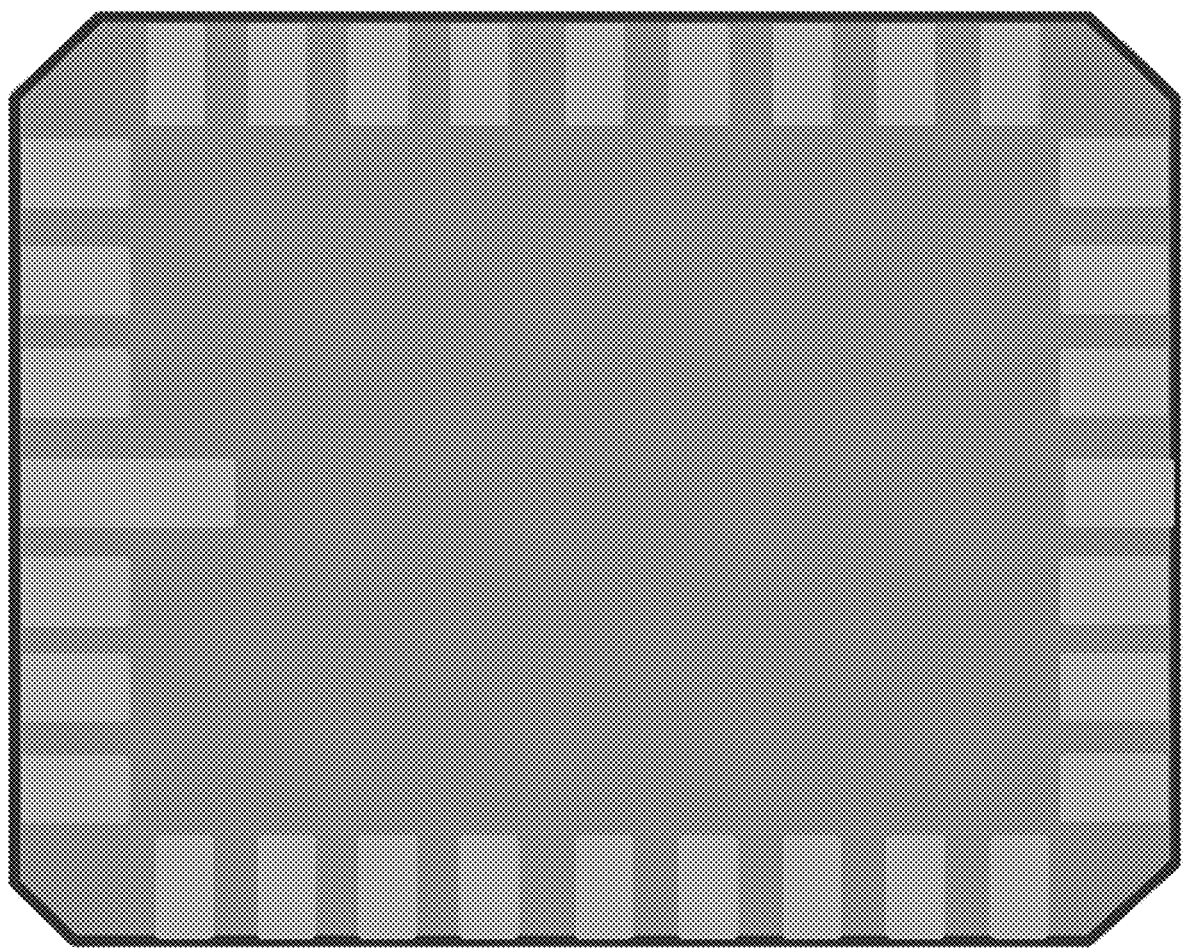
FIG. 17 shows a bottom view of the gateless P-N junction metrolog shown in FIG. 14.

Mediator 212 can include supplementary additives to attract or repel charges and can be a compound that has high electronegativity. Here, mediator 212 receives electrons 226 from junction member 218 to form p-interface 228. Exemplary mediator 212 include halogens, chalcogens, and the like. Mediator 212 has an optical absorption from 100 nm to 1000 nm, specifically from 200 nm to 700 nm, and more specifically from 230 nm to 400 nm. In an embodiment, mediator 212 includes Cl atoms from chloromethyl acrylate copolymers With reference to FIG. 5. FIG. 6, FIG. 7, FIG. 8, and FIG. 9, a number of p-interface 228 and n-interface 230 independently can have a minimum value of 1. Moreover, a shape of p-interface 228 and n-interface 230 independently can be selected per a particular application, e.g., polygonal as shown in FIG. 5, FIG. 6, or FIG. 7 or round as shown in FIG. 8 or FIG. 9.

Gateless P-N junction metrolog 200 can include wire 236 in electrical communication independently with drain electrode 220, source electrode 222, or electrode 234. Wire 236 can include a metallic composition that enhances conductivity and can be metals for typical semiconductor wire bonding. Exemplary wires 236 include Au, Al, and the like. A thickness of wire 236 can be from 15 µm to 100 µm and specifically from 15 µm to 50 µm. Moreover, wire 236 allows current to flow within the gateless p-n junction metrolog 200. Wire 236 has a minimum electrical conductivity of 1000 S/mm.

Figure 18:
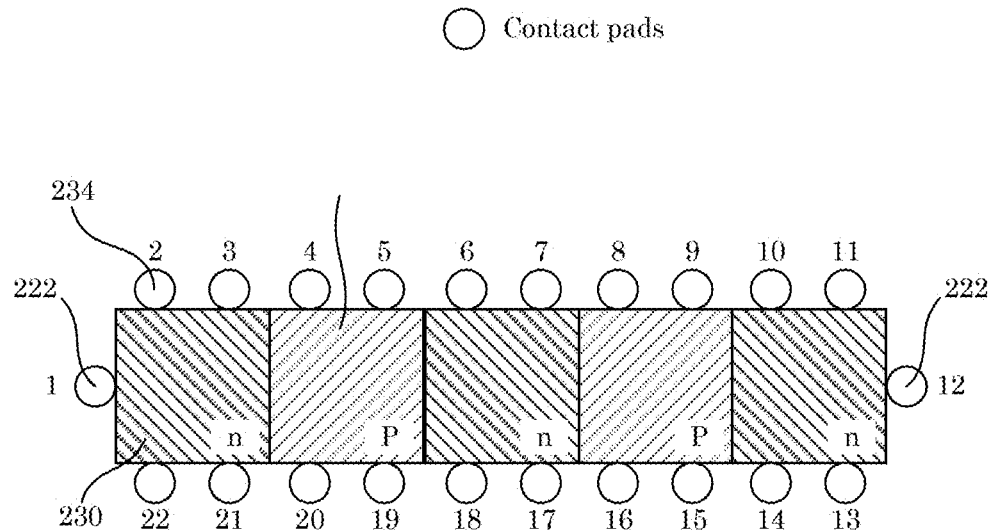
FIG. 18 shows a layout of electrodes, n-interfaces, and p-interfaces of a gateless P-N junction metrolog and source connections, drain connections, and corresponding resistance thereof for the gateless P-N junction metrolog.
Figure 19:
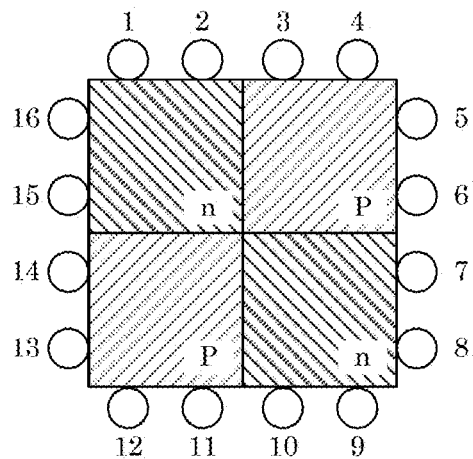
FIG. 19 shows a layout of electrodes, n-interfaces, and p-interfaces of a gateless P-N junction metrolog and source connections, drain connections, and corresponding resistance thereof for the gateless P-N junction metrolog.
Figure 20:
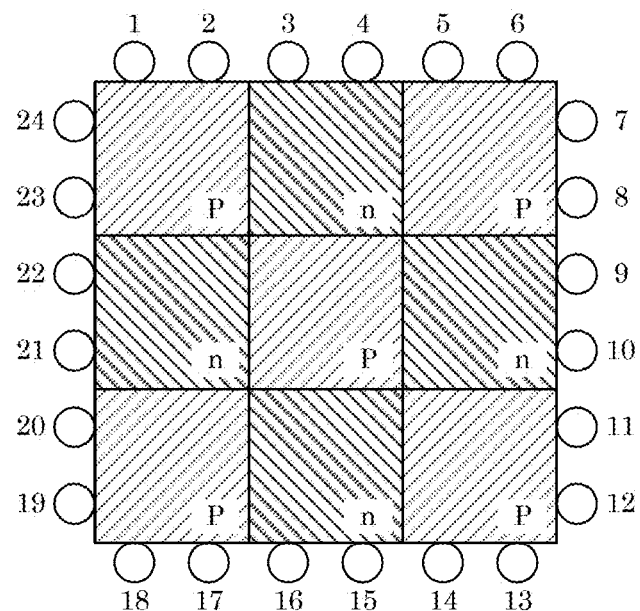
FIG. 20 shows a layout of electrodes, n-interfaces, and p-interfaces of a gateless P-N junction metrolog and source connections, drain connections, and corresponding resistance thereof for the gateless P-N junction metrolog.
Figure 21:
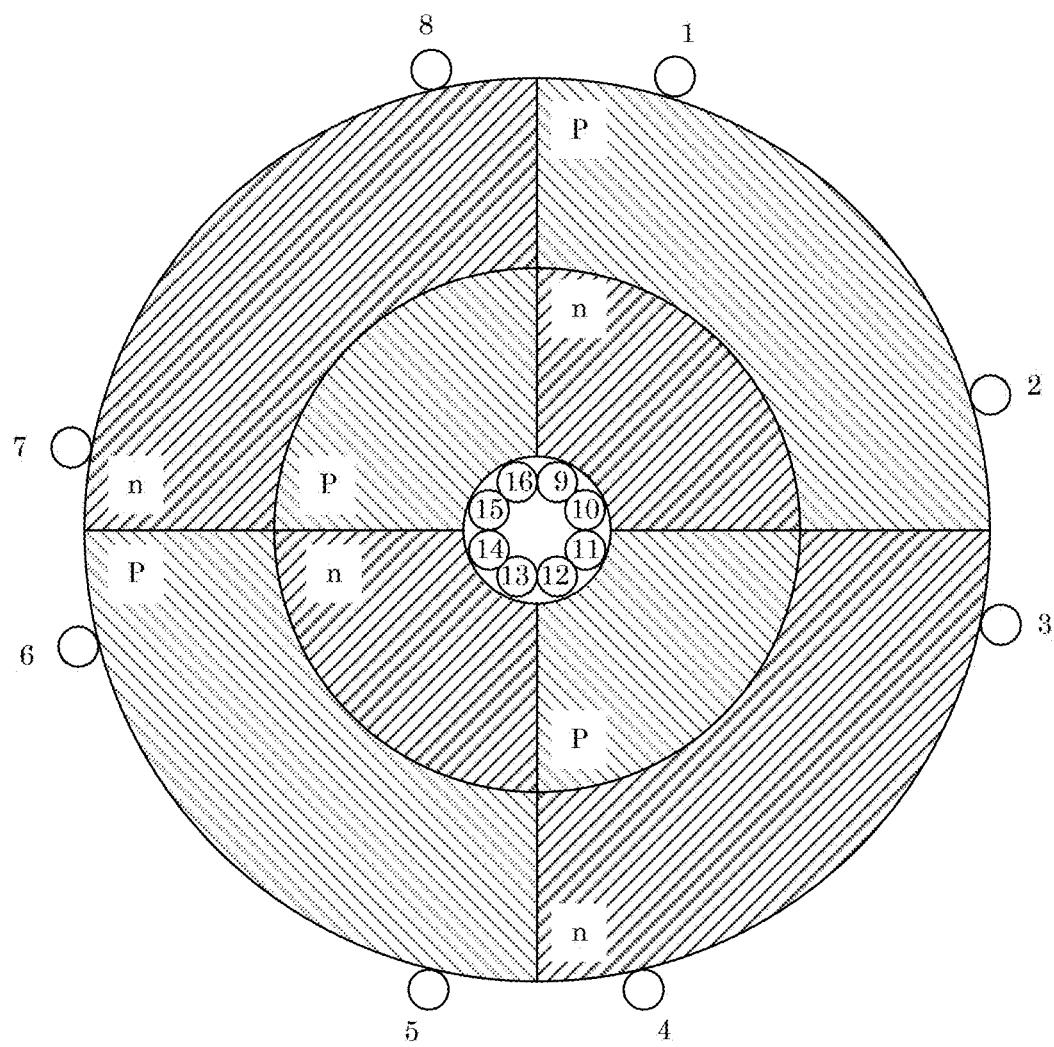
FIG. 21 shows a layout of electrodes, n-interfaces, and p-interfaces of a gateless P-N junction metrolog and source connections, drain connections, and corresponding resistance thereof for the gateless P-N junction metrolog.
Figure 22:
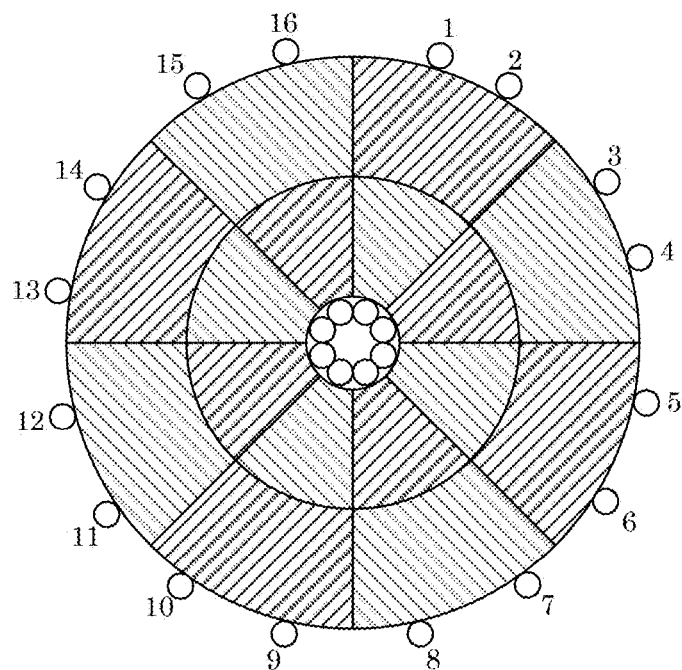
FIG. 22 shows a layout of electrodes, n-interfaces, and p-interfaces of a gateless P-N junction metrolog and source connections, drain connections, and corresponding resistance thereof for the gateless P-N junction metrolog.
Figure 22:
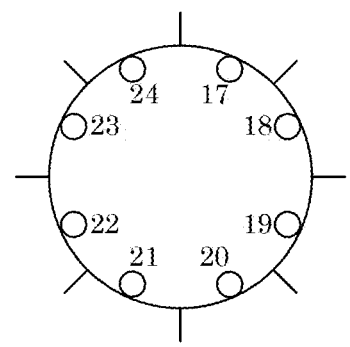

In an embodiment, with reference to FIG. 10, FIG. 11, FIG. 12, FIG. 13, FIG. 14, FIG. 15, FIG. 16, and FIG. 17, gateless p-n junction metrolog 200 can be packaged with various formats, shapes, numbers, and sizes of elements. According to an embodiment, gateless P-N junction metrolog 200 is a quantum Hall resistor that includes a plurality of discrete fractional resistance values provided by the p-n junction 232. With reference to FIG. 18, gateless P-N junction metrolog 200 can include alternatingly disposed p-interface 228 and n-interface 230 with independent electrode 234 connected thereto. Selected electrodes 234 can be connected together as drain electrodes 220 (indicated as "I+") or connected as source electrodes 222 (indicated as "I–") to provide a plurality of resistances that have a value that is $(a/b)R_H$, wherein a and b are integers, and $R_H$ ($h/2e^2$, h being Planck's constant) is one-half of the von Klitzing constant, $R_K=h/e^2=25812.80745 \ldots \Omega$.

Gateless P-N junction metrolog 200 can be made in various ways. In an embodiment, a process for making gateless P-N junction metrolog 200 includes forming substrate 224 by dicing a silicon carbide (SiC) wafer; cleaning substrate 224 with a piranha etching composition; contacting substrate 224 with a graphitic slab that promotes homogeneous epitaxial graphene (EG) growth; growing graphene on substrate 224; disposing substrate 224 in a furnace and purging with argon; heating substrate 224 in a gas composition that includes argon and $H_2$ (e.g., 3% $H_2$ in a balance of Art by volume) at a heating rate of about 3° C./s to 500° C.; maintaining substrate 224 at 500° C. for a selected period, e.g., 5 min; increasing the temperature of substrate 224 at the heating rate to 1050° C.; maintaining substrate 224 at 1050° C. for a selected period, e.g., 1 h; purifying the gas composition to remove hydrogen from the furnace so that argon solely is in the furnace; maintaining, after purifying the gas composition, substrate 224 at 1050° C. for a selected period, e.g., 2 h in the argon; heating substrate 224 at the heating rate to 1300° C.; maintaining substrate 224 at 1300° C. for a selected period, e.g., 1 min; heating substrate 224 at the heating rate to 1850° C.; maintaining substrate 224 at 1850° C. for a selected period, e.g., 4.5 min; and cooling substrate 224 to room temperature at a selected cooling rate, e.g., (1850° C.–20° C.)/12 hrs to produce junction member 218 on substrate 224.

Figure 23:
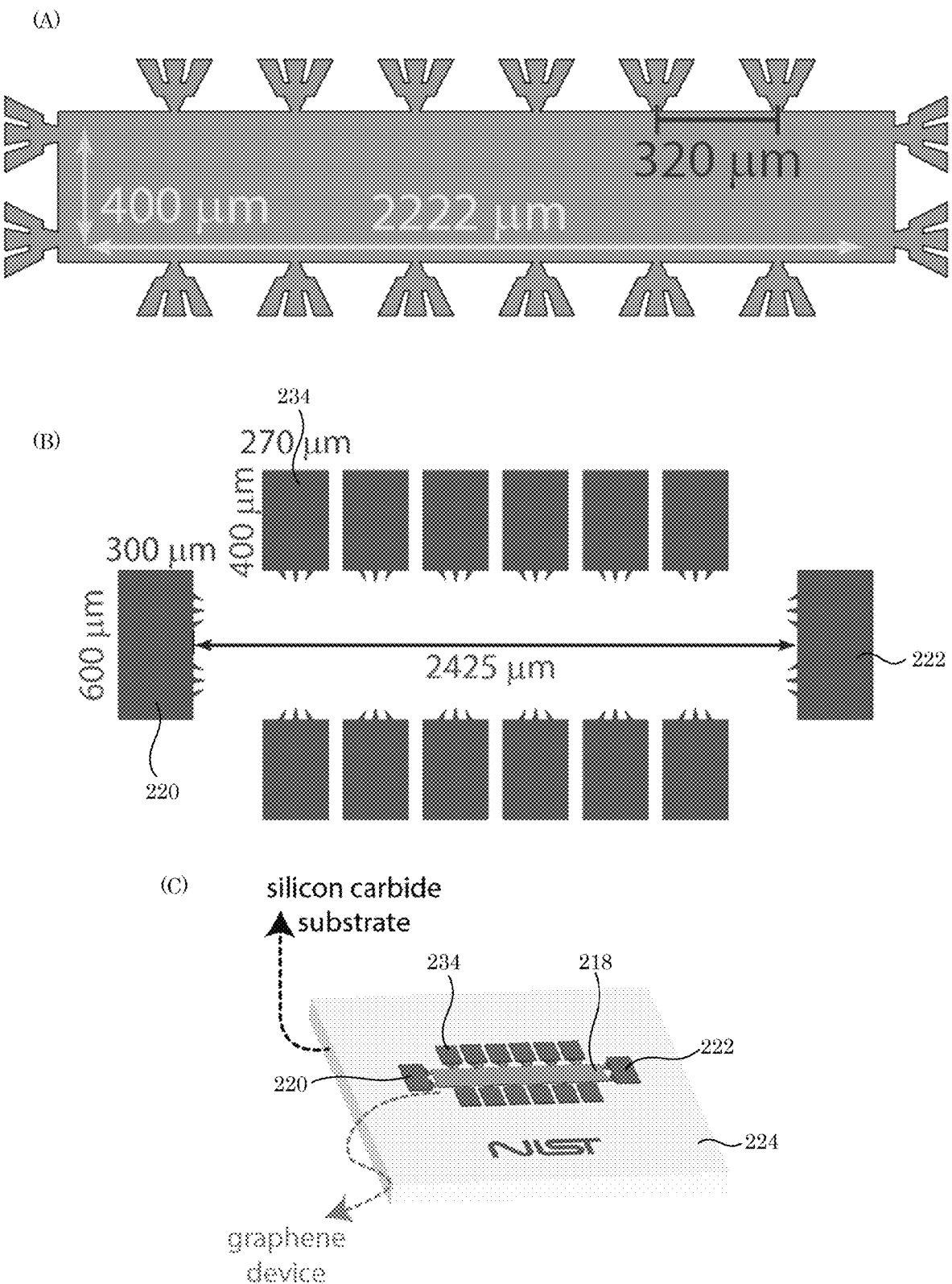
FIG. 23 shows, for making a gateless P-N junction metrolog, a photomask for forming a junction member in panel A; a photomask for forming a drain electrode, source electrode, and electrodes; and a gateless P-N junction metrolog that includes a substrate in panel C that is formed from the photomask.

The process for forming gateless P-N junction metrolog 200 also includes subjecting the substrate 224 to lithography to obtain gateless P-N junction metrolog 200 by: depositing 20 nm of gold onto substrate 224 by electron beam deposition (e.g., at an initial pressure of $10^{-7}$ Torr); disposing, by spinning onto substrate 224, a lift-off photoresist at 4000 rpm for 45 s (e.g., at acceleration: 5000 rpm/s), the lift-off photoresist including, e.g., 75 vol. % cyclopentanone, 15 vol. % propylene glycol monomethyl ether, and 10 vol. % polyaliphatic imide copolymer, based on a total volume of a composition for forming the lift-off photoresists; maintaining substrate 224 at 170° C. for 5 min after spinning the lift-off photoresist; disposing, by spinning onto substrate 224, a capping photoresist at 4500 rpm for 45 s (e.g., at acceleration: 5000 rpm/s, the capping photoresist including 75 vol. % electronic-grade propylene glycol monomethyl ether acetate, 15 vol. % mixed cresol novolak resin and 10 vol. % diazo photoactive compound, based on a total volume of capping photoresist composition; maintaining substrate 224 at 115° C. for 1 min after spinning the capping photoresist; exposing, to ultraviolet light (e.g., 365 nm), the photoresists on substrate 224 for 5 seconds with a photomask that has a selected shape, e.g., as shown in FIG. 23A; removing the photoresists from by washing substrate 224 with a wash composition that included 97 vol. % water and 3 vol. % tetramethylammonium hydroxide, based on a total volume of the wash composition, for 1 min to remove photoresists exposed to ultraviolet light, to form a region of 20-nm-gold-coated graphene exposed to air in the shape shown in FIG. 23B; washing substrate 224 in deionized $H_2O$; depositing 50 nm of gold onto substrate 224; disposing substrate 224 in N-methyl-2-pyrrolidone for 1 h at 75° C. to remove remaining photoresists by lift off from substrate 224; dry etching substrate 224 with argon at 4 Pa and power of 150 W, for 3 min; repeating earlier lithography steps with a photomask in a shape of electrode 234, drain electrode 220, and source electrode 222 as shown in FIG. 23B; dry etching substrate 224 with argon at 4 Pa and power of 150 W, for 30 s; depositing 50 nm of titanium and then 150 nm of gold onto substrate 224 with electron beam deposition at initial pressure $10^{-7}$ Torr; disposing substrate 224 N-ethyl-2-pyrrolidone for 1 h at 75° C. to remove remaining photoresists by lift off from substrate 224; repeating earlier lithography steps with a photomask having rectangles that can be 2400 µm by 450 µm for the eventual UV exposure treatment; aligning the rectangles to be geometrically arranged to the shape shown in FIG. 23A such that a rectangular structure has its perimeter (excluding the trident features) enclosed within a larger, rectangle, wherein electrical contacts (220, 222, 234) are not present within the rectangular window;

disposing substrate 224 in aqua regia (e.g., 1:1 deionized H$_2$O to aqua regia) for 45 s; disposing substrate 224 in acetone for 10 min; disposing substrate 224 in isopropanol for 5 min; and substrate 224 to provide gateless P-N junction metrolog 200, e.g., as shown in FIG. 23C.

The process for forming gateless P-N junction metrolog 200 also can include providing a low electron density for gateless P-N junction metrolog 200 that includes functionalizing substrate 224 with chromium tricarbonyl with a deposition furnace, e.g., from chromium hexacarbonyl by: disposing substrate 224 in inert gas environment (e.g., under N$_2$ gas); heating substrate 224 at 130° C. for 1 h at a temperature tolerance, e.g., 130° C.±10° C.; introducing chromium hexacarbonyl Cr(CO)$_6$ in the inert gas environment; reducing a pressure in which substrate 224 and the chromium hexacarbonyl are disposed to $10^{-2}$ Torr; maintaining for a period, e.g., 40 minutes, at 130° C. and $10^{-2}$ Torr in a presence of the chromium hexacarbonyl for completion of deposition of chromium tricarbonyl on substrate 224; and cooling substrate 224 to room temperature.

Figure 24:
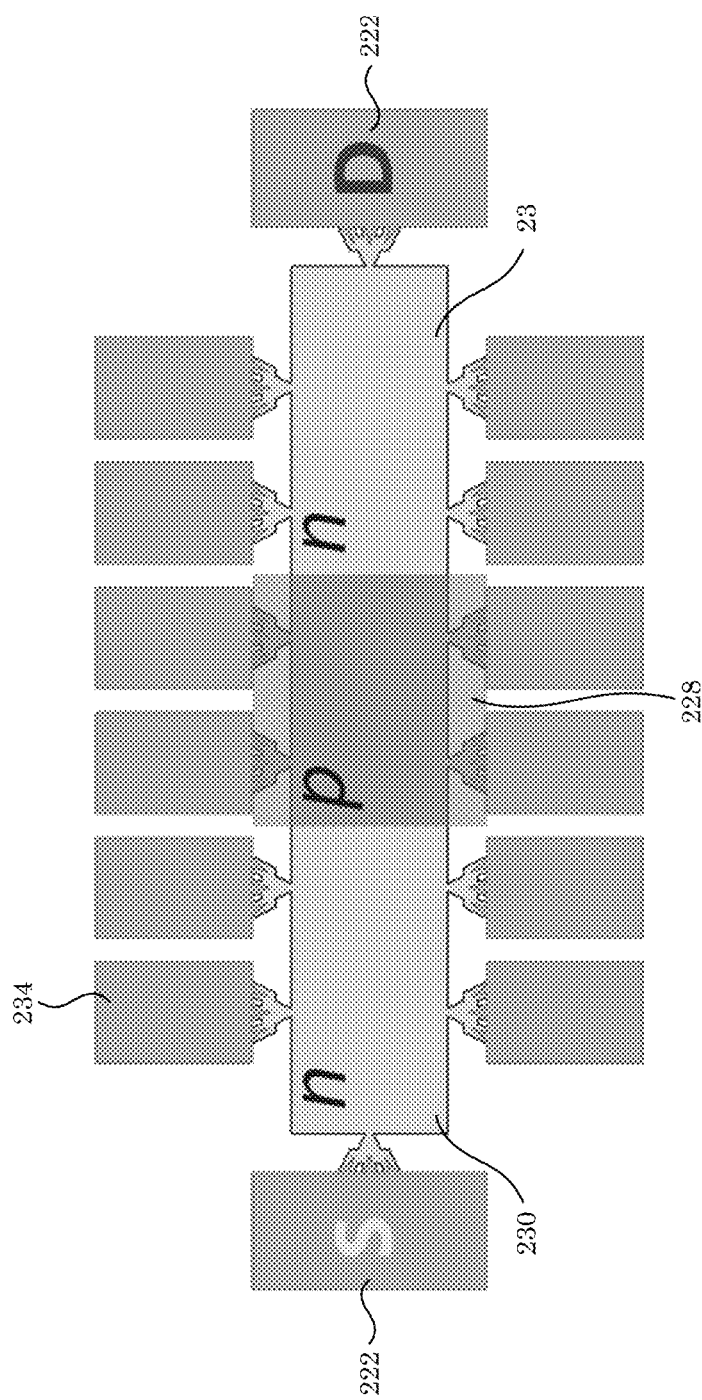
FIG. 24 shows a photomask for exposing a central region, labelled p, to ultraviolet light, wherein S and D indicate source and drain electrodes.
Figure 25:
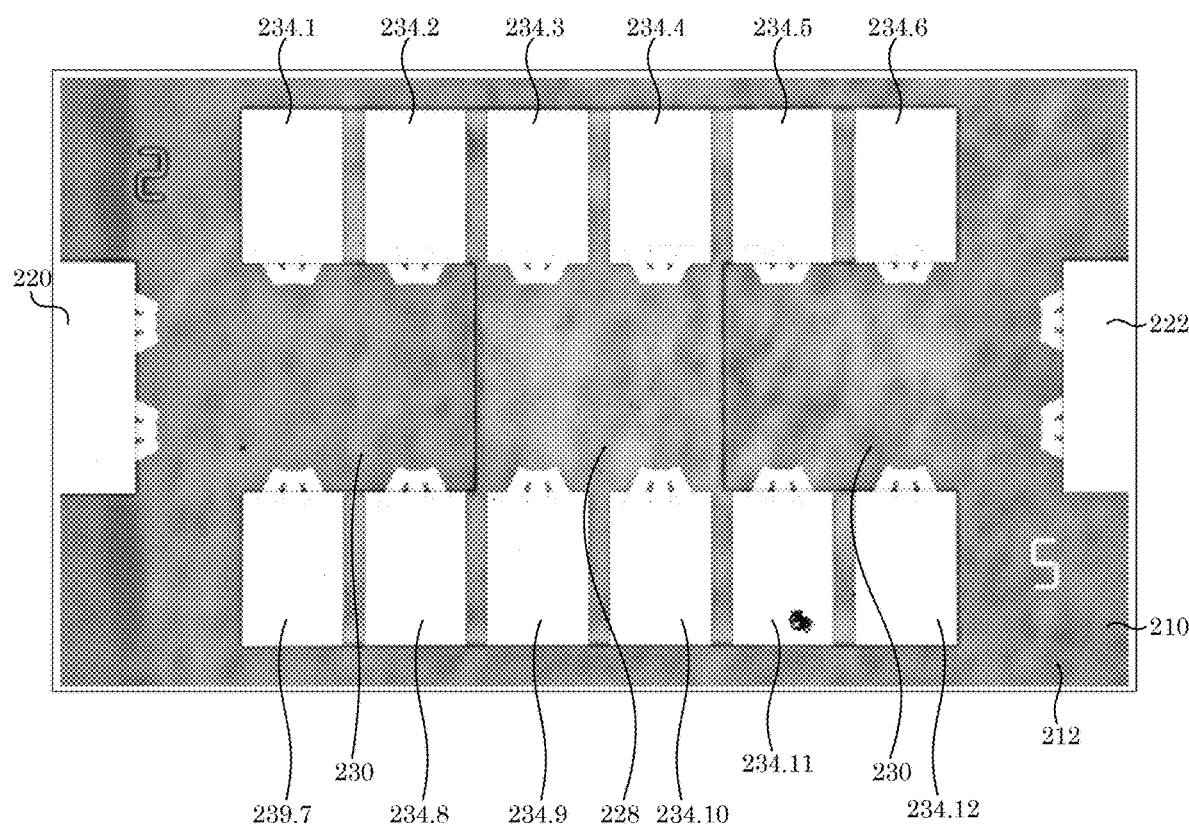
FIG. 25 shows a gateless P-N junction metrolog formed from the photomask shown in FIG. 24.

The process for forming gateless P-N junction metrolog 200 also can include spinning a photoresist at 5000 rpm for 1 min with acceleration: 5000 rpm/s, wherein the photoresist includes 75 vol. % electronic-grade propylene glycol monomethyl ether acetate, 15 vol. % mixed cresol novolak resin, and 10 vol. % diazo photoactive compound, based on a total volume of a composition for the photoresist; heating substrate 224 at 115° C. for 1 min; exposing, to ultraviolet light (365 nm) for 5 seconds, substrate 224 with a photomask that exposes a central region of substrate 224, as in FIG. 24. Parameters were measured on a high-precision mask and bond aligner with exemplary parameters being 1130 W; WEC=cont.; vacuum mode: 10 s/30 s/15 s; Al-gap=15 μm; and dosage=100 mJ. The process can further include removing exposed regions by contacting substrate 224 with a removal composition that includes 97 vol. % water, 2.3 vol. % tetramethylammonium hydroxide, and 0.7 vol. % polyglycol for 1 min to remove exposed region; heating substrate 224 at 200° C. for 5 min; forming a spacer layer on from a spacer composition that includes 95 vol. % ethyl lactate and 5 vol. % poly(methyl methacrylate/methacrylic acid), based on a total volume of the spacer composition, a thickness of this photoresist can be from 50 nm to 100 nm or less with a spin rate of 5000 rpm at an acceleration of 5000 rpm/s; heating substrate 224 at 170° C. for 1 min; spinning another photoresist on substrate 224 at 4000 rpm for 1 min to a thickness from 300 nm and 400 nm to form mediation polymer 210 and mediator 212, the photoresist composition including 89 vol. % anisole and 11 vol. % methyl styrene/chloromethyl acrylate copolymer, based on a total of the photoresist composition; heating gateless P-N junction metrolog 200 at 170° C. for 1 min; exposing substrate 224 to 254 nm ultraviolet light for 15 hours to activate the p-type regions p-interface 228; and forming n-interface 230 in other regions of junction member 218 that are inherently n-type; and optionally adjusting a level of doping by annealing to form gateless P-N junction metrolog 200, e.g., as shown in FIG. 25 that includes graphene p-n junction 232 disposed on SiC substrate 224.

The process for making gateless P-N junction metrolog 200 also can include an annealing step prior to measurement, with 350 K applied to gateless P-N junction metrolog 200 for 15 minutes.

Gateless P-N junction metrolog 200 has numerous advantageous and unexpected benefits and uses. In an embodiment, a process for performing resistance metrology with gateless P-N junction metrolog 200 includes: connecting first electrode 234.1 to p-interface 228; connecting second electrode 234.2 to n-interface 230; communicating voltage across through drain electrode 220 and source electrode 222; and acquiring a resistance value across p-n junction 232 from first electrode 234.1 and second electrode 234.2 to perform resistance metrology.

Figure 26:
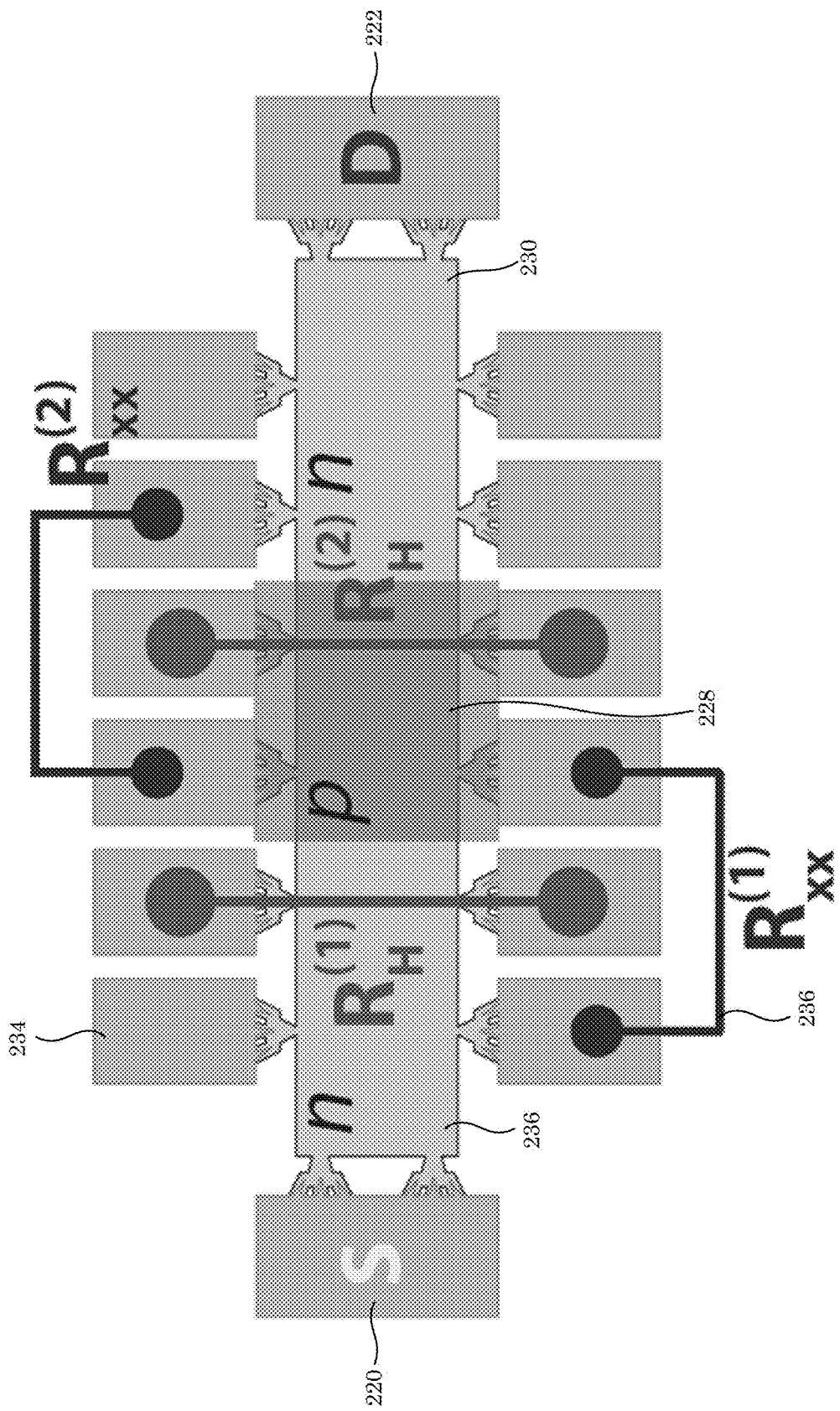
FIG. 26 shows connections in a configuration for measurement of resistance of the gateless P-N junction metrolog shown in FIG. 25.

According to an embodiment, with reference to FIG. 26, a process for measuring a resistance for p-interface 228 and n-interface 230 of gateless P-N junction metrolog 200 includes measuring longitudinal resistance Rxx, longitudinal resistance Rxx being a multiple of Hall resistance $R_K$ (12906.4035Ω). Here, both longitudinal resistances $R^1$xx and $R^2$xx are $2*R_K$ (25812.807Ω).

Figure 27:
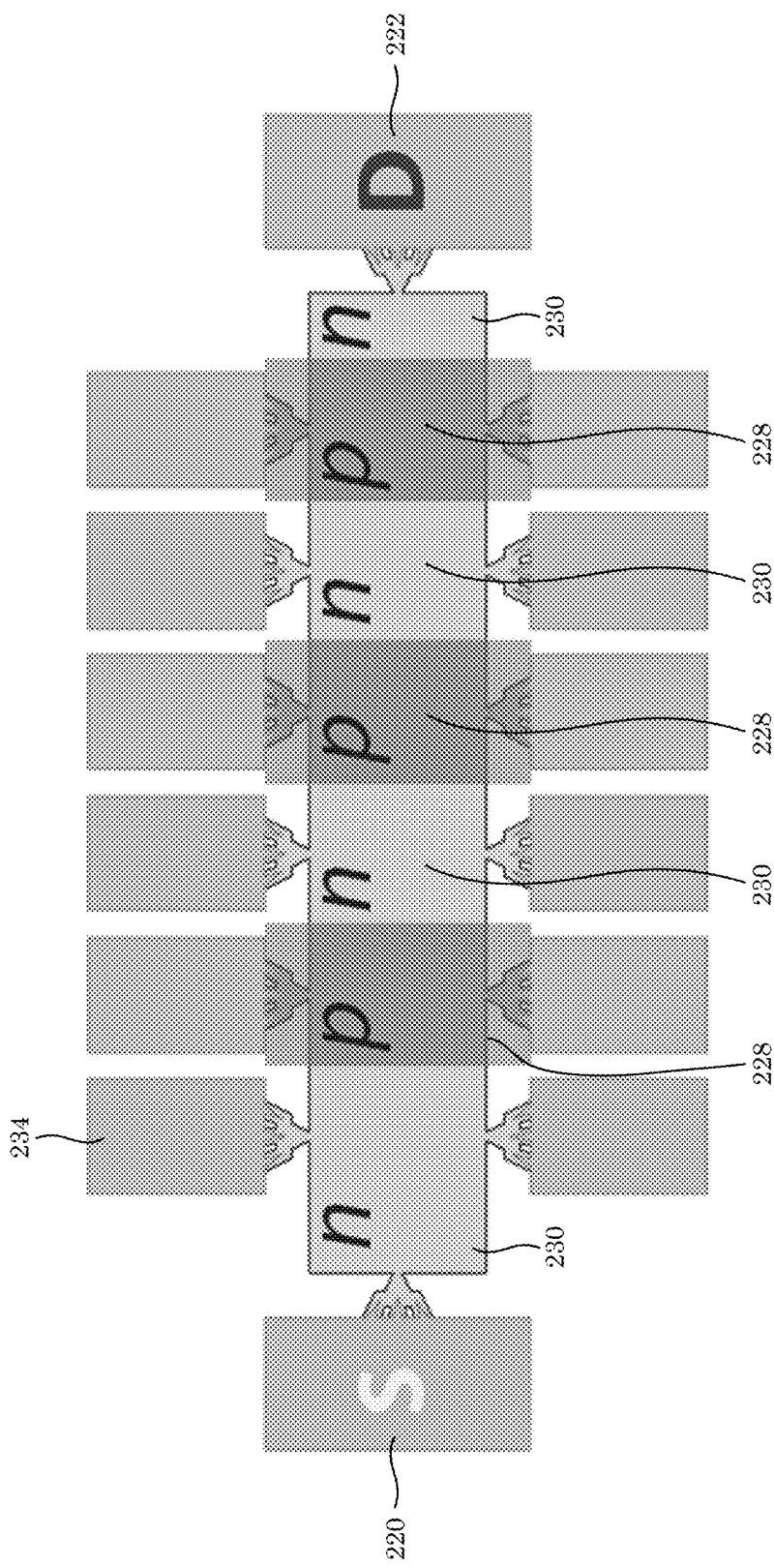
FIG. 27 shows a gateless P-N junction metrolog.

According to an embodiment, with reference to FIG. 27, a process for measuring a resistance for p-interface 228 and n-interface 230 of gateless P-N junction metrolog 200 includes measuring resistance that is a multiple of $R_K$ that depends on a total number of p-n junction 232 between adjacent p-interface 228 and n-interface 230 that are crossed by the resistance measurement, with each p-n junction 232 contributing $2*R_K$. It should be appreciated that the resistance between the bottom left contact and the bottom right contact yields $6*R_K$. Moreover, to make gateless P-N junction metrolog 200 shown in FIG. 27 includes using a photomask that includes this arrangement and number of p-interfaces 228.

Figure 28:
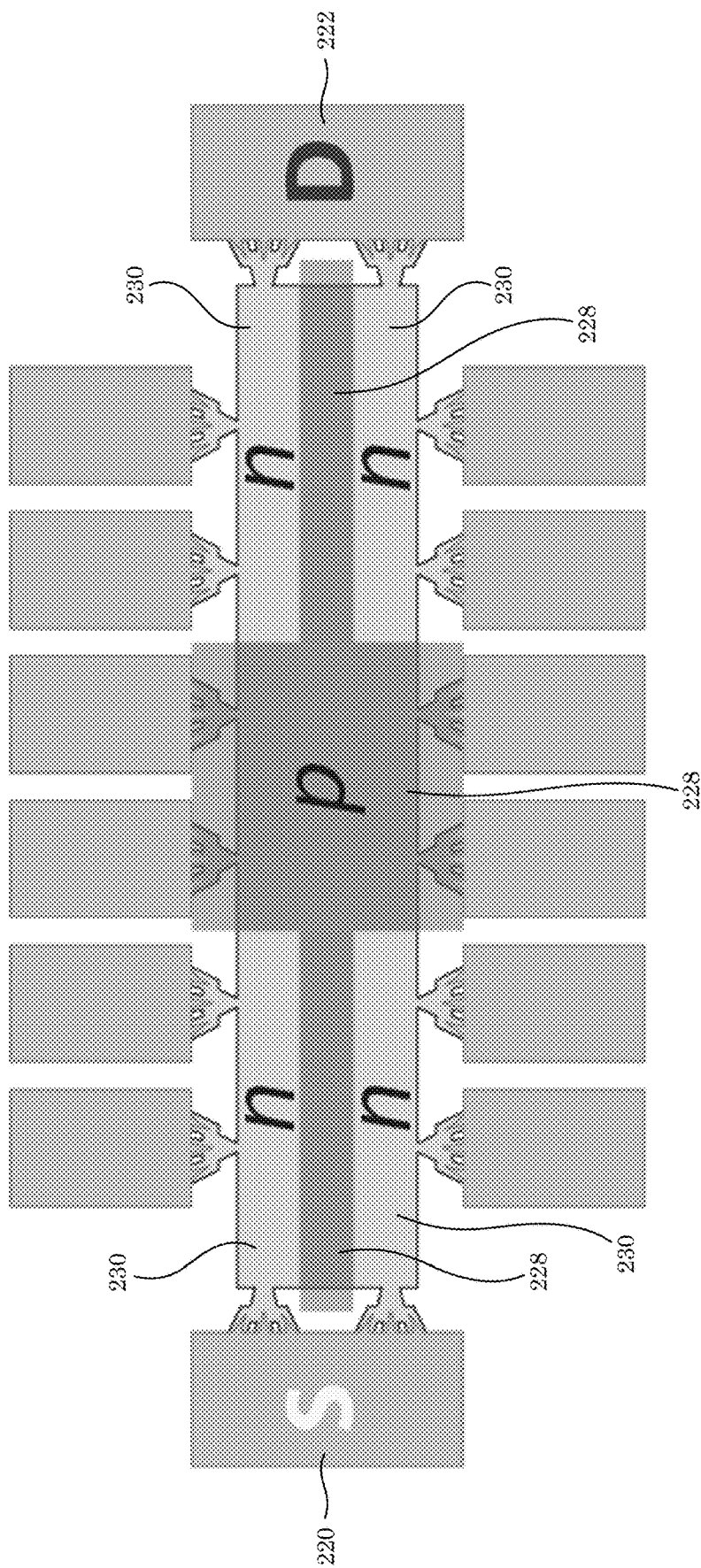
FIG. 28 shows a gateless P-N junction metrolog that provides a fractional multiple of Hall resistance $R_K$ (12906.4035Ω)

According to an embodiment, with reference to FIG. 28, a process for measuring a resistance for p-interface 228 and n-interface 230 of gateless P-N junction metrolog 200 includes measuring resistance that is a multiple of Rx that depends on a total number of p-n junction 232 between adjacent p-interface 228 and n-interface 230 that are crossed by the resistance measurement, with each p-n junction 232 contributing 2*Rx, such that a checkerboard configuration of p-interfaces 228 and n-interfaces 230 provide fractional multiples of Hall resistance $R_K$ (12906.4035Ω). It should be appreciated that to make gateless P-N junction metrolog 200 shown in FIG. 28 includes using a photomask that includes this arrangement and number of p-interfaces 228.

Figure 29:
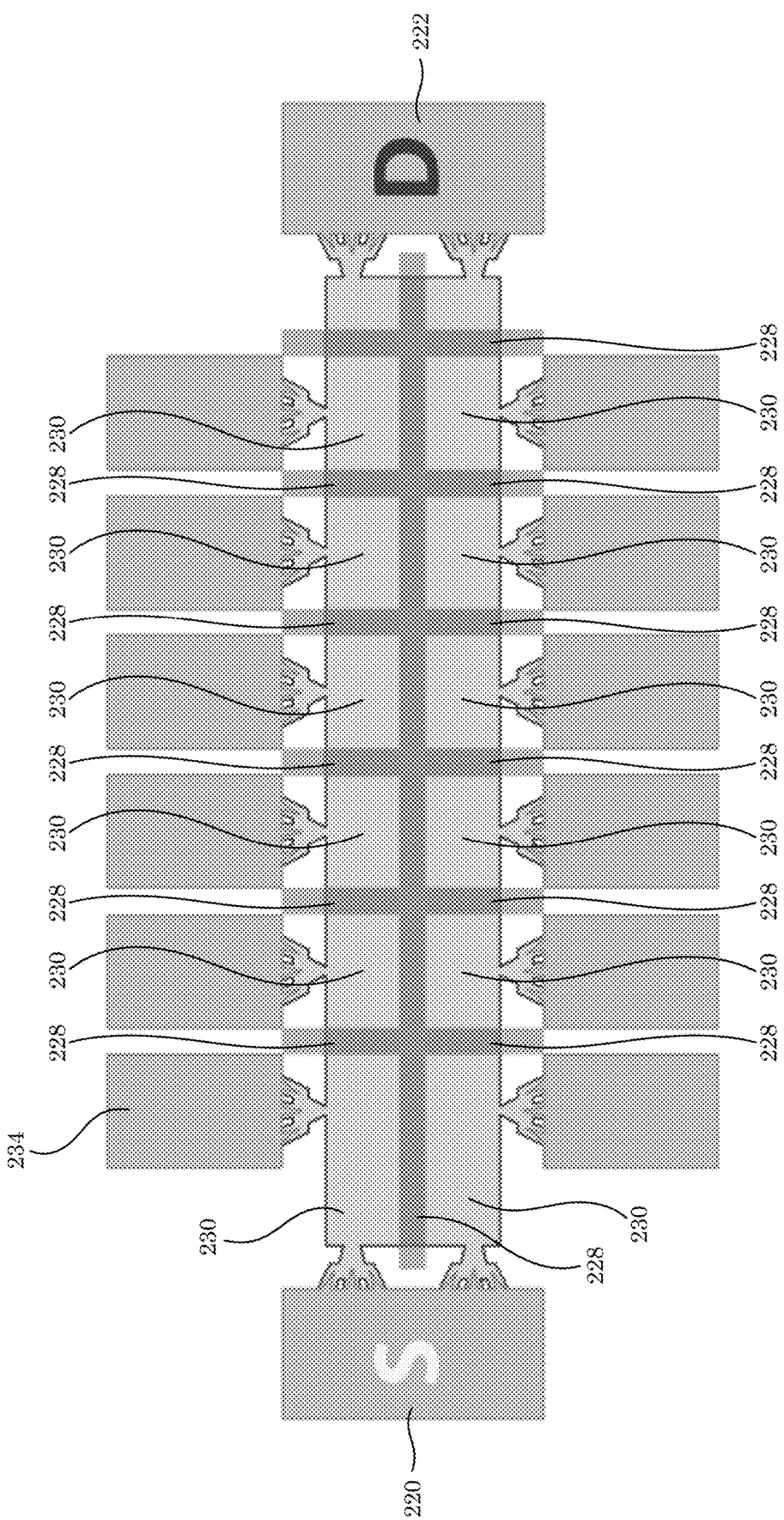
FIG. 29 shows a gateless P-N junction metrolog.

According to an embodiment, with reference to FIG. 29, a process for measuring a resistance for p-interface 228 and n-interface 230 of gateless P-N junction metrolog 200 includes measuring resistance that is a multiple of $R_K$ that depends on a total number of p-n junction 232 between adjacent p-interface 228 and n-interface 230 that are crossed by the resistance measurement. It should be appreciated that to make gateless P-N junction metrolog 200 shown in FIG. 29 includes using a photomask that includes this arrangement and number of p-interfaces 228.

In certain embodiments, with reference to FIG. 18, FIG. 19, FIG. 20, FIG. 21, and FIG. 22, gateless P-N junction metrolog 200 includes a select arrangement of p-n junction 232 and a process of performing resistance metrology includes injection of current through any simultaneously-used combination of source electrode 222 and drain electrode 220, as described in Example 3. Here, a current source can be split among several branches with inputs labeled as I+ and outputs labeled as I−.

Gateless P-N junction metrolog 200 and processes disclosed herein have numerous beneficial uses, including electron optics, photodetection, resistance metrology, and edge state manipulation. Advantageously, gateless P-N junction metrolog 200 overcomes limitations of technical deficiencies of conventional compositions such as fabrication length scales, carrier density control, fabrication time scales, and lifetime of functionality. Further, the gateless carrier density control renders the process highly advantageous due to its quicker fabrication processing time.

Gateless P-N junction metrolog 200 and processes herein unexpectedly accommodates sufficiently narrow p-n junction formation by use of ultraviolet photolithography. Moreover, gateless P-N junction metrolog 200 provides access to fractional values of the quantum Hall resistances as described by Example 3.

The articles and processes herein are illustrated further by the following Examples, which are non-limiting.

EXAMPLES

Example 1

Gateless and reversible carrier density tunability in epitaxial graphene devices functionalized with chromium tricarbonyl.

Monolayer epitaxial graphene (EG) can provide quantized Hall resistance (QHR). One major difficulty with conventional QHR devices based on EG is that their electrical properties drift over time, e.g., due to adsorption of atmospheric molecular dopants. A parameter for device stability is charge carrier density, which helps determine the magnetic flux density required for precise QHR measurements. Gateless P-N junction metrolog 200 overcomes this problem of instability in air by functionalizing the surface of gateless P-N junction metrolog 200 with chromium tricarbonyl, $Cr(CO)_3$. Observations of carrier density stability in air over the course of one year occurred, as well as the ability to tune the carrier density by annealing the devices. For low temperature annealing, the presence of $Cr(CO)_3$ stabilized electrical properties and provided reversible tuning of carrier density in millimeter-scale graphene devices close to the Dirac point. Precision measurements in the quantum Hall regime showed no detrimental effect on the carrier mobility.

Developing highly efficient standards using EG involves long-term stability of electrical properties of millimeter-scale EG devices in ambient conditions, to equal the long-term stability and precision of GaAs—AlGaAs heterostructure QHR devices. These properties include the longitudinal conductivity $\sigma_{xx}$, carrier density n, and mobility $\mu$, which are related by the equation $\sigma xx = ne\mu$.

Electrostatic gating for devices is difficult. One early and successful process used to reduce the carrier density for QHR devices was photochemical gating, using methyl styrene/chloromethyl acrylate copolymer (available under the tradename ZEP-520A) electron beam positive tone resist as an electron acceptor, but the process reversibility has inherent limitations based on number of thermal cycles to which a device is exposed. Other methods for carrier density control and conservation have been explored such as the use of poly-methyl methacrylate (PMMA), atomically layered dielectrics, perylene, amorphous boron nitride, and hexagonal boron nitride but were either unable to achieve metrological usefulness or are irreversible processes.

When EG is exposed to ambient atmospheric conditions, it experiences a drift in the carrier density and conductivity because of the physisorption of $H_2O$ and $O_2$, which are found to be p-doping species because of their oxidizing characteristic. Achieving electrical stability is critical for device applications including mass-produced electronics, chemical and biological sensors, and functionalized materials. This motivation holds particularly true for resistance metrology, where a narrow range of carrier densities between $1 \times 10^{11}$ cm$^{-2}$ and $3 \times 10^{11}$ cm$^{-2}$ is needed to produce a resistance plateau of $$R_{xy} = \frac{e^2}{2h}$$

at easily accessible magnetic flux densities (B). Generally, lower carrier densities will yield unreliable plateaus and higher carrier densities correlate to a plateau onset at higher magnetic flux densities. Thus, gateless control of the carrier density is crucial to improving accessibility of resistance metrology using EG, where this v=2 plateau can exhibit precise quantization at low magnetic fields (between 2.5 T and 7 T) for carrier densities in the vicinity of $10^{11}$ cm$^{-2}$.

Here, gateless and reversible carrier density tunability in EG devices functionalized with chromium tricarbonyl [Cr(CO)$_3$] were obtained with carrier density stability in air over the course of one year with shifts less than $10^{11}$ cm$^{-2}$, and by controllable and reversible tuning, achieved metrologically useful values of the QHR, rendering $Cr(CO)_3$ as a suitable compound for stabilizing electrical devices based on EG. Controllable tuning was demonstrated by annealing the device in vacuum to the desired carrier density while monitoring the device's room-temperature longitudinal resistivity. Despite exposure to heating in vacuum at up to 363 K (90° C.), EG devices retained full functionalization, and when stored in air for typically 24 h to 36 h following the anneal and measurement, the device's carrier density drifted back to a low value, on the order of $10^{10}$ cm$^{-2}$, with respect to inherent EG doping above $10^{13}$ cm$^{-2}$. These results demonstrated that this functionalization method can be used to stabilize and reversibly tune the carrier density in millimeter-scale EG devices without the need of electrostatic gating, reducing the level of processing required for useful devices. Furthermore, these devices exhibited properties suitable for resistance metrology with proper tuning.

EG is formed during thermal decomposition of the SiC substrate causing an enrichment of the surface with carbon atoms due to the preferential sublimation of silicon atoms. Samples used for this study were grown using 4H—SiC (0001) semi-insulating substrates with a mis-cut of ≤0.10°. Before growth, the substrates were first cleaned by piranha etch, followed by a dip into diluted hydrofluoric acid and a surface treatment with polymer adsorbates for polymer-assisted sublimation growth (PASG) by spin coating a weak solution (approximately 2 ml$_{[AZ5214E]}$/1$_{[isopropanol]}$). For graphene growth, the resulting SiC(0001) samples were placed on a polished disk of glassy carbon with the Si face in direct contact with the disk for face-to-graphite growth. Combining the PASG and face-to-graphite growth methods suppresses the formation of etch pits and high substrate steps as well as related bilayer domains. The annealing process at 1900° C. was performed in argon at atmospheric pressure with a graphite-lined resistive-element furnace. After growth, EG was inspected with confocal laser scanning and optical microscopy to rapidly identify successful growths over large areas.

The concept of functionalizing EG with $C(CO)_3$ was motivated, in part, by pursuits to alter the electronic structure of graphene without drastically modifying the in-plane transport properties. Covalent functionalization by this method does not fully passivate the EG surface but reduces the level of electron doping in EG devices and helps to limit the long-term drift in carrier density levels. The completed EG device was placed in a phosphor-bronze (Ph-Br) boat and loaded into a small homemade vacuum furnace shown in FIG. 30(a). The chamber was then purged with nitrogen gas and heated slightly above 130° C. for 2 h while keeping the load lock slightly open to remove any lingering adsorbates on the surface of the EG device. After placing approximately 100 mg of crystalline $Cr(CO)_6$ (chromium hexacarbonyl) in a separate section of the Ph-Br sample boat, the system was closed, and nitrogen flow was stopped. The furnace temperature was then raised to 130° C. The $Cr(CO)_6$ sublimates and reacts with the surface of EG, resulting in the ring-centered $Cr(CO)_6$ functionalization. An illustration of this mechanism is provided in FIG. 30(a), as well as an optical image of one of the devices in FIG. 30(b). The sample space was then evacuated using a liquid nitrogen cold trap for about 30 minutes before the chamber was cooled down and opened. Out of seven fabricated devices used in this study, six were functionalized using the vacuum furnace method.

Figure 30:
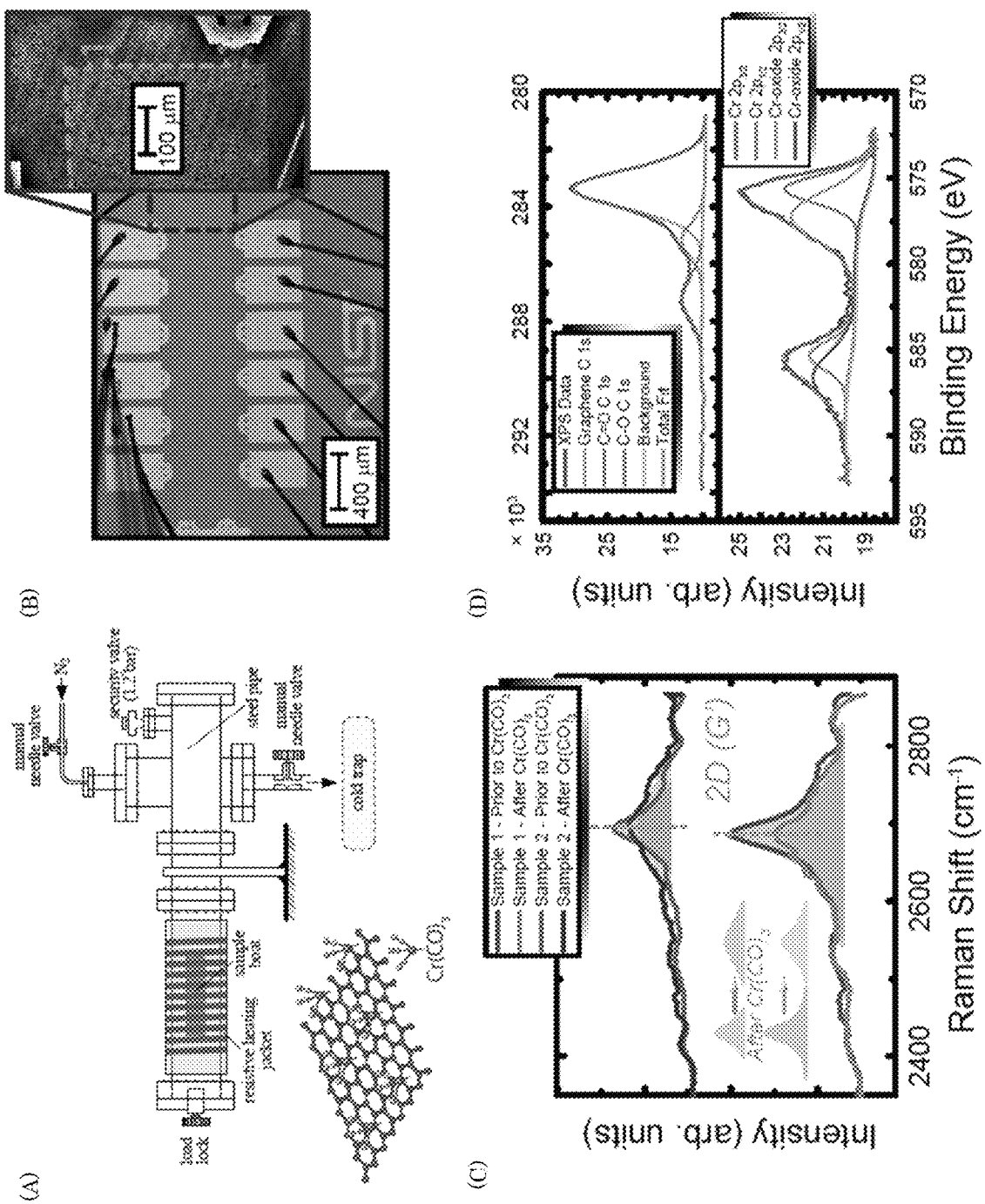
FIG. 30 shows: (a) a furnace for functionalizing and forming graphene crystal structure functionalized with $Cr(CO)_3$; (b) an image of a gateless P-N junction metrolog, taken at 5× and 20× (inset) magnification with a confocal laser scanning microscope, after functionalization. The inset uses a dashed line to mark the EG edge. Black dots appear on the surface which are clusters of $CrO_3$ from XPS measurements; (c) Raman spectra for two devices, taken both before and after functionalization; and (d) XPS spectra for the surface presence of carbon (C 1s) and chromium (Cr 2p) in the top and bottom panel, respectively

Raman spectroscopy monitored behavior of the 2D (G') peak of the EG before and after the functionalization process. Spectra were collected with a micro-Raman spectrometer using a 633 nm wavelength excitation laser source and a backscattering configuration. The spot size was about 1 µm, the acquisition times were 300 s, the laser power was 1.7 mW power, and the optical path included a 50× objective and 1200 mm$^-$ grating. Rectangular Raman maps were collected with step sizes of 20 µm in a 5 by 3 raster-style grid. The presence of $Cr(CO)_3$ on the EG surface yielded a modified 2D (G') peak with a smaller intensity, redshifted position, and larger width. The average changes in intensity, position, and width for the case before and after functionalization corresponded to a factor of 0.68±0.05, a redshift of 4 cm$^{-1}$±0.5 cm$^{-1}$, and a broadening of 51.3 cm$^{-1}$±10.5 cm$^{-1}$, as shown in FIG. 30(c) using two examples (all uncertainties represent 1σ deviations). The effects have been observed with other amorphous materials deposited on EG. The 2D (G') peak was used to assess the changes of the EG surface due to the overwhelmingly large SiC response in the G peak region.

X-ray photoelectron spectroscopy (XPS) measurements on functionalized EG devices were performed in a commercial instrument equipped with a monochromatic Al Kα excitation photon source and a hemispherical electron analyzer. All XPS measurements were performed at a base pressure of 2.7×10$^{-7}$ Pa or less, electron take-off angle of 0° with respect to the surface normal, and an energy resolution of 0.1 eV. The spectra in FIG. 30(d) show the fittings done for the spectral regions relevant to C 1s in the top panel and Cr 2p in the bottom panel. For binding energies near the carbon region, EG and SiC show contributions of carbon around 283 eV, C—O at 285 eV, and C=O at 287 eV. Analyzing the Cr 2p peaks required the fitting to include chromium oxide compounds. The Cr $2p_{3/2}$ peak can be deconvoluted into two peaks at binding energies of 576 eV and 577 eV, assigned to graphene bonded $Cr(CO)_3$ and $CrO_3$, respectively. The observed components of the functionalization process have relative intensities that were much higher compared to adjacent atoms like carbon.

Six functionalized devices and one control device were tested for carrier density stability. By annealing the device at a fixed temperature for a prolonged time in vacuum and within the cryogenic measuring system, ranging from 5 min to 90 min, the carrier density becomes more n-type. The integrated heat exposure (IHE) is a figure of merit used to quantify the applied changes to the device caused by annealing:

$$IHE = \int_0^t k_B(T_{applied} - T_{RT}) dt' \quad (1)$$

$T_{RT}$ is taken to be 300 K, $k_B$ is the Boltzmann constant, and the integral is evaluated over time in seconds. Repeatable annealing was achieved using proportional-integral-derivative (PID) controllers that require some time to reach temperatures as high as 360 K, and so the effects of annealing between room temperature and the desired temperature must be accounted for. While annealing, only the longitudinal resistivity, a quantity that is correlated with the carrier density, was monitored. At room temperature while in vacuum or inert gases such as helium, the longitudinal resistivity shifted by less than 100Ω overnight, compared to the typical value of up to 10 kΩ, making it a negligible shift compared with that above room temperature. After annealing, the carrier density and mobility were derived from cryogenic transport measurements in a 9 T superconducting magnet system.

Figure 31:
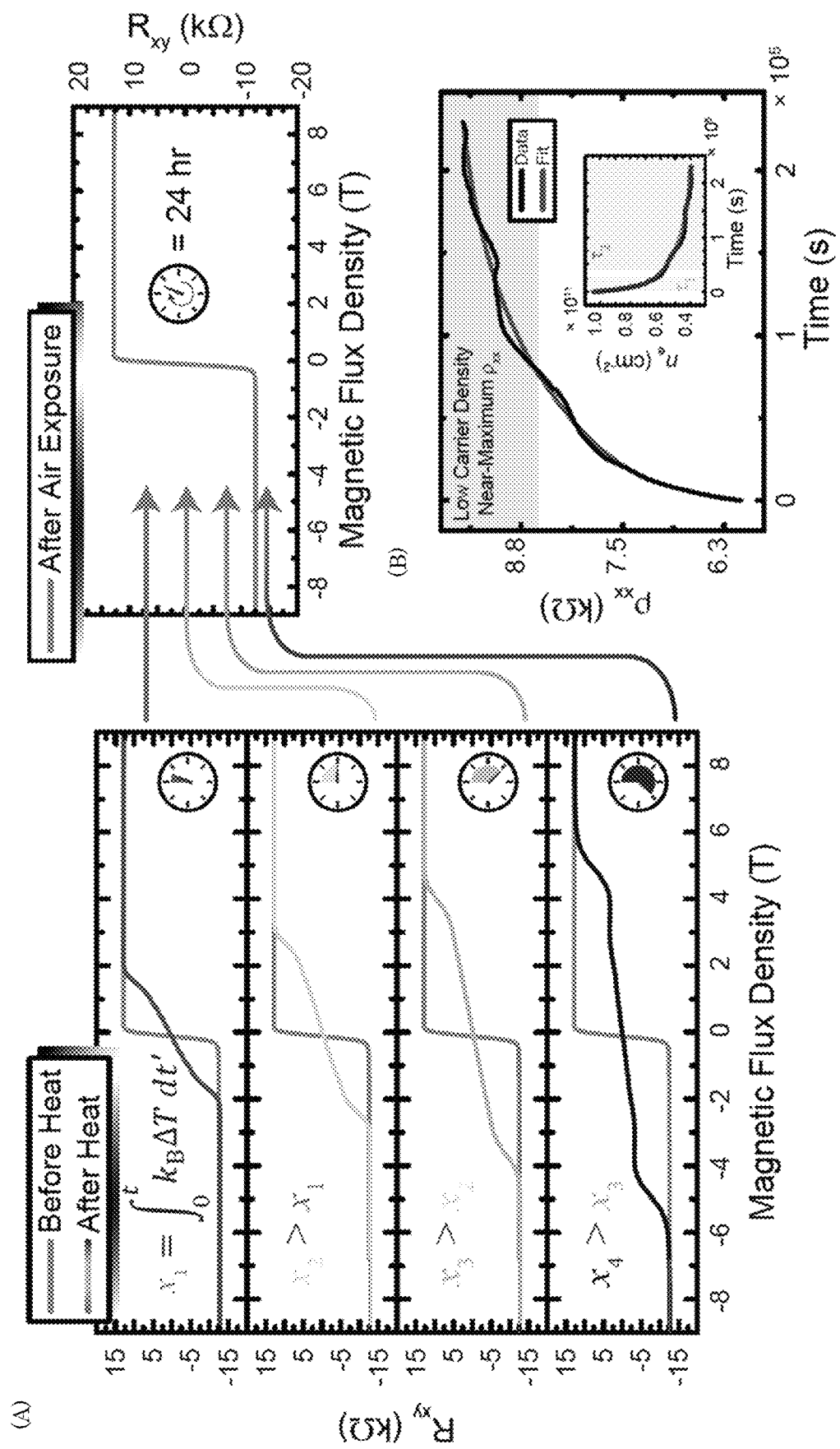
FIG. 31 shows: (a) Hall resistance for a gateless P-N junction metrolog at 1.6 K, with all gray curves representing data after the gateless P-N junction metrolog stabilized in air before temperatures above 300 K were applied. The stacked graphs show different measurements where the gateless P-N junction metrolog chemically equilibrated with air and then annealed in vacuum. Total IHE increases in each panel. When the gateless P-N junction metrolog was left in air, carrier density of the gateless P-N junction metrolog returned to a value of $10^{10}$ cm$^{-2}$. (b) When the gateless P-N junction metrolog was warmed to room temperature and stored in air, longitudinal resistivity shifted and asymptotically reached a maximum with a Fermi level of EG near a Dirac point. Two exponential decays included this behavior as seen in the inset and were used to fit the data.

To evaluate a device's carrier density, one can use the relation $$n_e = \frac{1}{e\left(\frac{dR_{xy}}{dB}\right)},$$

where $n_e$ is the carrier density, e is the elementary charge, B is the magnetic flux density, and $R_{xy}$ is the Hall resistance, using SI units for all quantities. As shown in the gray curves in FIG. 31(a), before the device was annealed, the Hall resistance data indicated low carrier densities, on the order of $10^{10}$ cm$^{-2}$. The carrier density increased as a consequence of annealing at a temperature between 300 K and 360 K for varying periods of time, resulting in an IHE (or $x_i$ as shown abstractly in each panel) on the order of $10^{-18}$ J·s. The device was able to retain this carrier density in vacuum or helium at 300 K, before its exposure to air. Once the device was in air, the carrier density returned to its low value as before within roughly 24 hr. During this process, the longitudinal resistivity was monitored with time, and is plotted in FIG. 31(b). Two exponential decay terms were used to describe the device's asymptotic approach to 15.5 kΩ for reasons that will be explained next. The corresponding time constants, $\tau_1$ and $\tau_2$, were 7600 s and 6.97×10$^4$ s, respectively.

Figure 32:
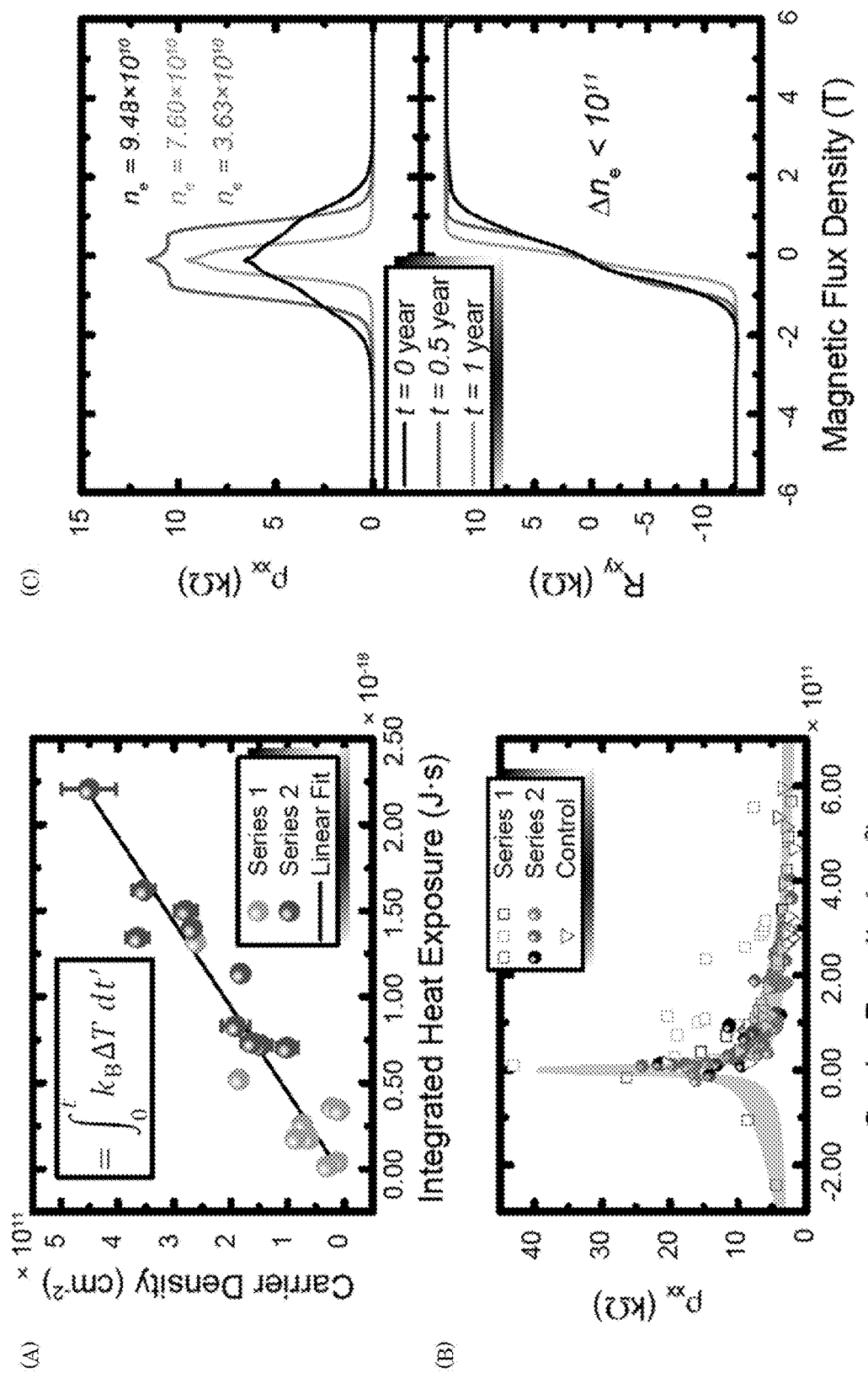
FIG. 32 shows: (a) a correlation between integrated heat exposure and subsequently-measured carrier density at 1.6 K with data representing different packages onto which gateless P-N junction metrologs were mounted, with Series 1 and 2 corresponding to the 12-pin and 32-pin packages, respectively. Error bars represent 1σ uncertainties of the average of multiple measurable regions on the gateless P-N junction metrolog; (b) The relationship between carrier density and longitudinal resistivity, both measured at 1.6 K; and (c) The stability of the carrier density is shown to be less than $10^{11}$ cm$^{-2}$ for the same gateless P-N junction metrolog exposed to air for one year. Cr(CO)$_3$ remained on the EG surface as a material for metrological applications.

The physical interpretation of this behavior can best be described by the Langmuir adsorption model for competing species. To convert the longitudinal resistivity in FIG. 31(b) to a corresponding device carrier density in the inset, the two quantities' relationship was determined for each device and averaged, as shown in FIG. 32. Since the devices were presumed to have a significantly lower population of physical adsorbates (but not of chemically bonded Cr(CO)) due to prolonged annealing, the gas species to which the devices presumably were exposed included atmospheric dopants, namely $N_2$ (78.1%), $O_2$ (20.9%), and Ar (0.93%) as well as water vapor. Other constituents are several orders of magnitude lower in concentration. Argon and nitrogen were neglected due to weak interactions with graphene compared to other constituents. This leaves $O_2$, but $H_2O$ must also be added in the appropriate amount. At 25° C. and 35% to 40% relative humidity, the expected percentage contribution of water vapor to the ambient environment, in terms of mass, is between 0.8% and 0.9%. The time-dependent function for the occupancy of one of two competing gaseous species (in this case, oxygen) is:

$$\frac{d\theta_{O_2}}{dt} = k_{O_2,A} p_{O_2}(1 - \theta_{O_2}(t) - \theta_{H_2O}(t)) - k_{O_2,D} \theta_{O_2}(t) \quad (2)$$

$\theta_{O_2}(t)$ and $\theta_{H_2O}(t)$ are the fractional occupancies of oxygen and water on EG's available surface sites. The quantities $k_{O_2}$ and $p_{O_2}$ are the rate constants (A for adsorption and D for desorption) and unitless ratio of oxygen's partial pressure to the total pressure. For the differential equation involving $\theta_{H_2O}(t)$, the two molecule subscripts need to be swapped. From these coupled first-order ordinary differential equations, one can determine both the final occupancy percentage for each species at equilibrium as well as the form taken by $\theta_{gas}(t)$, which includes two exponential decay terms. The final predicted occupancies of oxygen and water are approximately 90% and 10%, respectively.

When the carrier density is fit to the two decay terms from the Langmuir model, the time constants listed earlier provide an optimized reduced chi-squared. Previously reported work indicates that adsorption of oxygen and water on graphene takes place on a similar order of magnitude, with oxygen adsorption taking place at slightly slower times at room temperature, assuming that the adsorption follows an Arrhenius behavior. A more detailed analysis of the time-dependency of water adsorption revealed a $\tau_{H_2O}$ of about 130 min. The second constant requires more careful treatment to justify. With both species of gases occupying roughly equal areas for times below 2 hr, water must undergo significant desorption to accommodate for the equilibrium occupancies. A different study on EG measured a time constant on the same order of magnitude when the device was exposed to room temperature air. We estimated based on the measured water desorption energy of 360 meV and by use of the formula $$k_A = \nu \, \exp\left[\frac{-E_{ads}}{k_B T}\right],$$

where $E_{ads}$ is the adsorption energy per molecule, $\nu$ is an attempt frequency (in this case, the attempt frequency is the vibrational frequency of the molecule, usually approximated as $10^{13}$ s$^{-1}$), $k_B$ is the Boltzmann constant, and T is temperature (K), the estimated time constant is on the order of $10^6$ s, which is about 15 times higher than our fit value. Inaccuracies can arise from two factors: (1) the uncertainty of the desorption energy on EG, which can contribute an order-of-magnitude change to the time constant, and (2) the significant increase of hydrophobicity found in EG versus other forms of graphene, which would cause desorption to occur on faster time scales.

The amount of IHE (shown as $x_i$ in FIG. 31) was quantified in Equation 1 and used to shift the carrier density by a desired amount. This correlation is shown in FIG. 32(a). The two data point types indicate the two different types of devices since some devices were older by a year compared with the newer devices. Some data came from devices mounted on a 12-pin package, whereas the data in green were acquired with devices mounted on a 32-pin package and allowed for more regions of the millimeter-scale EG to be tested. The error bars correspond to the uncertainties generated by the variation across the device, only present in the 32-pin package since the 12-pin package was only used to monitor one region's carrier density. There is a clear linear trend within the order of magnitude of carrier density that is most suitable for resistance metrology. FIG. 32(b), as described earlier, is a plot of the relationship between the longitudinal resistivity and carrier density, both measured at 1.6 K using the length of the device as 640 μm and the width as 400 μm for the conversion from a measured resistance. From this plot, we are also able to determine the mobilities of the device regions which span two orders of magnitude, from $10^4$ cm$^2$V$^{-1}$s$^{-1}$ to $10^5$ cm$^2$V$^{-1}$s$^{-1}$.

Tunability and reversibility of functionalized EG were explored, and long term stability was considered. FIG. 32(c) shows an example device stored in air over the course of one year and exhibits stability such that shifts are less than $10^{11}$ cm$^{-2}$. Despite the appearance of the Hall plateau as flat at this low carrier density, precision measurements suggest that the plateau is not quantized to within parts in $10^8$. Thus, some additional electrons are needed, but with this level of stability in air coupled with the linear relationship between IHE and carrier density, we can develop resistance standards that have a shelf life longer than one year.

With the knowledge that devices exposed to air retain a stable, but low, carrier density (less than $10^{11}$ cm$^2$), and the method to apply a specific amount integrated heat, we are now able to tune devices to a carrier density which enables metrological access to the quantum Hall effect. Device quantization was verified by measuring the longitudinal resistivity $\rho_{xx}=V_{xx}/I_{SD}*w/l$ where $V_{xx}$ is the voltage drop across the potential contacts, $I_{SD}$ is the source/drain current and w and l are the width of the Hall bar and the distance between the potential contacts, respectively. If $\rho_{xx}$ becomes negligibly small, the Hall resistance $R_H$ becomes quantized, for example, at the $\nu=2$ plateau with $R_H=V_{xy}/I_{SD}=R_K/2$, where $R_K$ is the von Klitzing constant. Thus, clear indication of a breakdown of resistance quantization can be identified through changes in the resistivity that depend on the magnetic flux density, temperature, and current.

Figure 33:
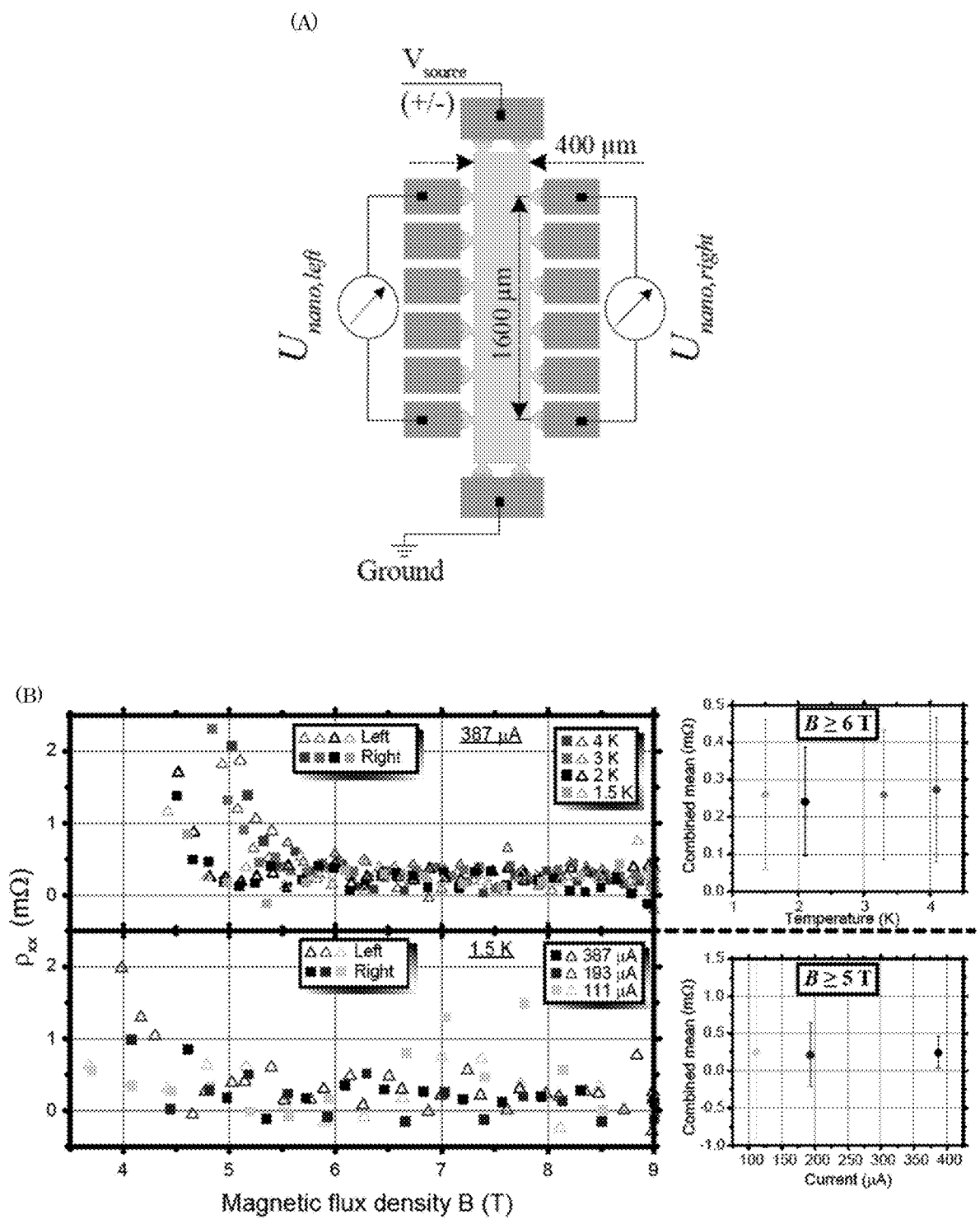
FIG. 33 shows resistivity measurements in a QHE regime at a low potentials, wherein (a) shows measurement configuration of a gateless P-N junction metrolog (1600 μm×400 μm) for determination of resistivity along the right and the left side of the device with polarity reversal; (b) shows vanishing of resistivity on both sides of the gateless P-N junction metrolog at high fields indicates resistance quantization at a current of 387 μA and temperatures up to 4 K. Increasing current from 111 μA to 387 μA at 1.5 K resulted in reduced noise but not correlated with increase in resistivity. Scatterplots show corresponding resistivity measurements for increasing temperatures (upper) and increasing currents (lower) summarize the results by taking the mean value of the left and the right side of the Hall bar for B≥6 T and B≥5 T. Error bars represent 1σ uncertainties of the average of all measurements above the indicated magnetic flux density.

FIG. 33 shows resistivity measurements of an EG device of dimensions 1.6 mm×0.4 mm (FIG. 33(a)) that were collected using a nanovoltmeter and a ramping voltage source that are both normally used in a two-terminal cryogenic current comparator bridge for high resistance measurements. The voltage source was operated at voltages of ±0.5 V, ±1.1 V and ±5 V, allowing for currents up to about 387 μA in the $\nu=2$ quantum Hall regime. Increasing the temperature from 1.5 K to 4 K at a high current of 387 μA had no measurable impact on the longitudinal resistivity at magnetic flux densities greater than 6 T (FIG. 33(b), upper panels) and reducing the current only increased measurement noise (FIG. 33(b), lower panels). In all measurements, an offset of about $\rho_{xx}$=0.25 mΩ (about $10^{-8}$ $R_K$) was observed, likely to be the result of circuit leakage or nanovoltmeter input leakage in the measurement, since similar offsets were also observed using many functionalized and untreated samples. However, since there is no temperature or current dependent behavior over a wide range of magnetic flux densities, in agreement with the guidelines for reliable dc measurements of the QHR, we expect the devices to be well quantized despite the small offset.

Example 2

Atypical Quantized Resistances in Millimeter-Scale Epitaxial Graphene p-n Junctions.

Si atoms that sublimate from the silicon face of SiC. Samples were grown on square SiC chips diced from on-axis 4H—SiC(0001) semi-insulating wafers. SiC chips were submerged in a 5:1 diluted solution of hydrofluoric acid and deionized water prior to the growth process. Chips were placed, silicon face down, on a polished graphite substrate and processed with AZ5214E to utilize polymer-assisted sublimation growth techniques. The face-down configuration promotes homogeneous growth, and the annealing process was performed with a graphite-lined resistive-element furnace. The heating and cooling rates were about 1.5° C./s, with the growth performed in an ambient argon environment at 1900° C.

The grown EG was evaluated with confocal laser scanning and optical microscopy as an efficient way to identify large areas of successful growth. Protective layers of Pd and Au are deposited on the EG to prevent organic contamination. While protected, the EG is etched into the desired device shape, with the final step being the removal of the protective layers from the Hall bar using a solution of 1:1 aqua regia to deionized water. To fabricate the pnJs, completed Hall bars were functionalized with $Cr(CO)_3$ to reduce the electron density to a value close to the Dirac point and on the order of $10^{10}$ $cm^{-2}$. An S1813 photoresist spacer layer was then deposited on a region intended to be preserved as an n region. Finally, a 100 nm layer of PMMA/MMA and an approximately 350 nm layer of ZEP520A were deposited. The 100 nm layer was intended to be a mild protectant for EG since ZEP520A is very photoactive and known to reduce the mobility of EG when in direct contact with it.

Raman spectroscopy was used to verify the behavior of the 2D (G') peak of the EG before and after the functionalization process and polymer photogating development. Spectra were collected with a micro-Raman spectrometer using a 633 nm wavelength excitation laser source. The spot size was about 1 μm, the acquisition times were 30 s, the laser power was 1.7 mW power, and the optical path included a 50× objective and 1200 $mm^{-1}$ grating. Rectangular Raman maps were collected in a backscattering configuration with step sizes of 20 μm in a 5 by 3 raster-style grid. To avoid the effects of polymer interference, spectra were collected through the backside of the SiC chip.

The analog electronic circuit simulator LTspice was employed to predict the electrical behavior of the pnJ devices in several measurement configurations. Interconnected p-type and n-type quantized regions compose the circuit and were modeled either as ideal clockwise (CW) or counterclockwise (CCW) k-terminal quantum Hall effect (QHE) elements. The terminal voltages $e_m$ and currents $j_m$ are related by $R_H j_m = e_m - e_{m-1}$ (m=1, ..., k) for CW elements and $R_H j_m = e_m - e_{m+1}$ for CCW elements. To determine the circuit's behavior at the external terminals (to be labeled as A and B), only one polarity of magnetic flux density was simulated at a time. For a positive B-field, an n-doped (p-doped) graphene device was modeled by a CW (CCW) QHE element, whereas, when B is negative, a CWW (CW) QHE element was used.

Figure 34:
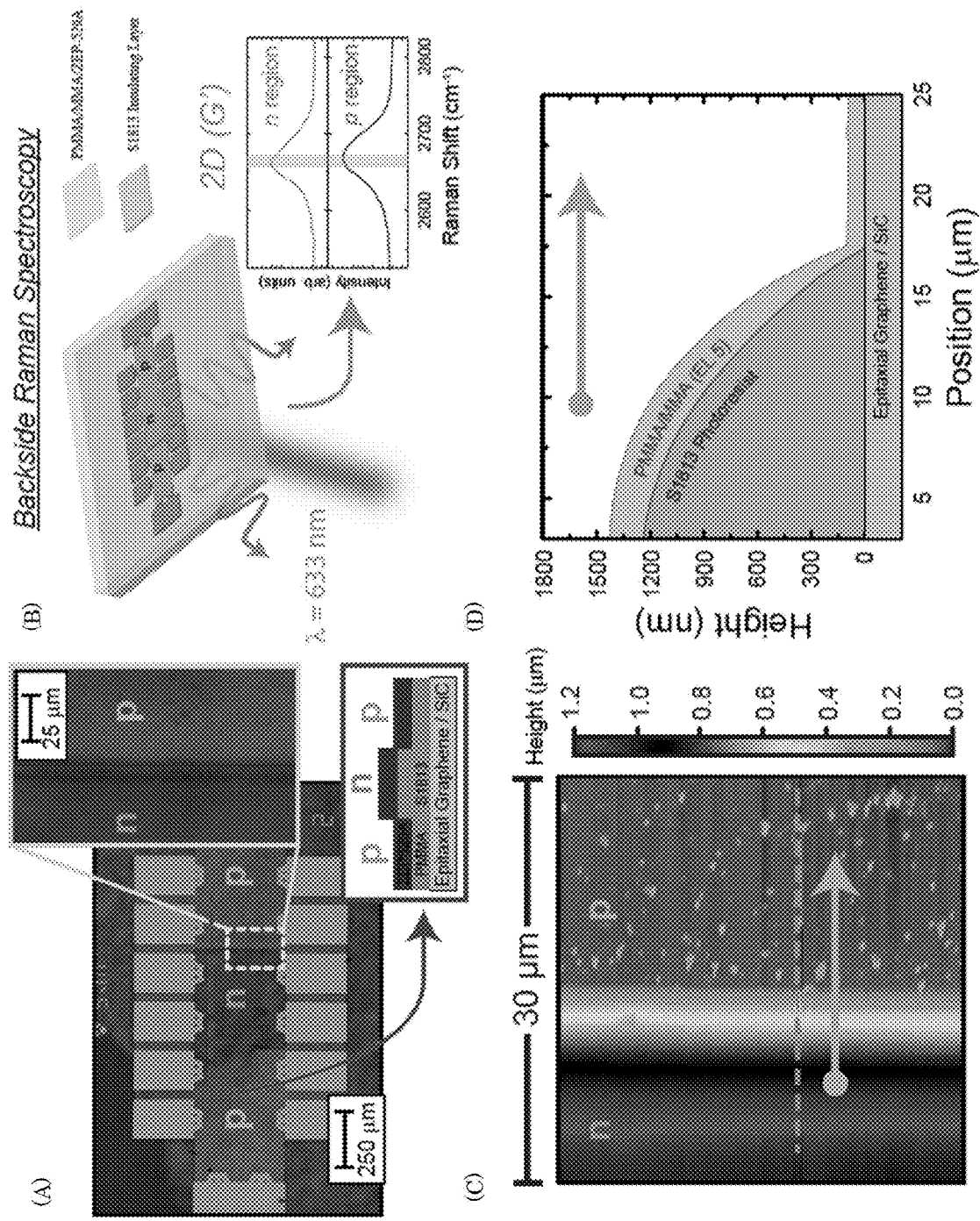
FIG. 34 shows: (a) an optical image of a gateless P-N junction metrolog with labels indicating charge polarity. A cross-section of the gateless P-N junction metrolog is shown in the inset; (b) an illustration of Raman acquisition and a map-averaged 2D (G') spectrum for the n and p regions; (c) an atomic force microscope image of a boundary between p and n regions formed; and (d) an extracted profile prior to ZEP520A deposition.

An optical image of the EG device, fabricated into a Hall bar geometry and processed with $Cr(CO)_3$ and ZEP520A to establish two pnJs, is shown in FIG. 34(a). The first and third regions separated by the UVP-obtained junctions were intended to be p-type regions, as indicated by the gray letters, whereas the n region is preserved by a thick S1813 photoresist spacer layer. Raman spectra of the device's 2D (G') peak were acquired and shown for the n and p regions immediately after transport measurements to verify the polarity of the regions. Since the thick photoresist layers prevented spectra acquired in the usual backscattering geometry, the setup was modified such that the excitation laser was shown through the backside of the SiC chip to enhance the quality of the 2D (G') peak. For the data in FIG. 34(b), the p and n region spectra, which are averages of the map acquisitions, show 2D (G') peaks positioned at 2668.2 $cm^{-1} \pm 2.3$ $cm^{-1}$ and 2664.9 $cm^{-1} \pm 4.1$ $cm^{-1}$, respectively with corresponding full-widths at half-maxima of 79.1 $cm^{-1} \pm 11.5$ $cm^{-1}$ and 64.9 $cm^{-1} \pm 9.3$ $cm^{-1}$.

Atomic force microscope (AFM) images, one of which is shown in FIG. 34(c), were used to determine the device's final thickness profile. The example profile in FIG. 34(d) was averaged over 1.1 μm and shows a height difference of about 1.4 μm between the n and p region. What became evident was that the pnJ width was not guaranteed to be sharp enough for dissipationless edge state equilibration. Therefore, careful treatment and analysis of the device's charge configuration was required to assess the viability of pnJs created with UVP.

To assess device quality, the charge configuration of the device needed to be known and the width of the pins needed to be estimated. It is also important to approximate how the carrier densities in the regions change with exposure to 254 nm, 17 000 μWcm$^{-2}$ UV light (distinct from the UV light used in UVP), and this is primarily done by monitoring the longitudinal resistivity in all three regions of a p-n-p device during a room temperature exposure, with two polarities shown in the upper panel of FIG. 35(a). For the p region, the expected p-type doping mechanism resulting from the deposition of a ZEP520A layer on the whole device persists to the point where the carrier density crosses the Dirac point. This crossing is most evident during the room temperature UV exposure when the longitudinal resistivity of the device exhibits a similar value to when the exposure was started, but instead with a negative time derivative. The S1813 successfully prevents the n region from becoming a p region, as exhibited by the flat resistivity (and electron density). For varying distances between the device and the UV lamp, as well as how the devices behave after UV exposure and without functionalization. Though the idea of using ZEP520A as a dopant for EG has been demonstrated, accessing the p region with that mechanism is challenging due to the intrinsic EG Fermi level pinning from the buffer layer below. However, the reduction of the electron density from the order of $10^{13}$ $cm^2$ to the order of $10^{10}$ $cm^{-2}$ by the presence of $Cr(CO)_3$ considerably assists the p region to undergo its transition. It should be briefly noted that the temporary dip in resistivity near t=30 000 s arises from another competing process to shift the carrier density, namely that of the applied heat, which as prescribed by other work, causes n-type doping in EG devices.

Transport measurements were performed at 4 K, allowing us to determine the low-temperature longitudinal resistivity ($\rho_{xx}$), mobility (μ), and electron density in EG ($n_G$), where the latter two parameters are calculated by the following respective formulas:

$$\mu = \frac{1}{e n_G \rho_{xx}} \text{ and } n_G = \frac{1}{e\left(\frac{dR_{xy}}{dB}\right)},$$

with e as the elementary charge, B as the magnetic flux density, and $R_{xy}$ as the Hall resistance, using SI units for all quantities. The derivative term in the denominator is calculated for magnetic flux densities under 1 T due to the linear behavior of the Hall resistance. Mobilities were measured to be on the high range of the order $10^3$ $cm^2V^{-1}s^{-1}$ and low range of the order $10^4$ $cm^2V^{-1}s^{-1}$. By mapping the change of the room temperature resistivity to that measured at 4 K, the time-dependent shift of the carrier density with UV exposure can be approximated. These trends are plotted in the lower panel of FIG. 35(a) for both polarities.

Viability of pnJ creation has focused on how regions' polarities can be converted from n-type to p-type, and how these devices respond to the conversion process. More crucially, to determine the width of the pnJ, a capacitance model was implemented using parameters from a magnified AFM profile in FIG. 35(b) to gain insight on the amount of expected charge transfer from EG to ZEP520A in the p and n regions. For the model, we must consider the quantum capacitance of the charge transfer layers which includes EG, the buffer layer beneath, and the residual chemical doping between graphene and polymer layers above it. The general properties of the interfacial buffer layer are well-known, with its presence leading to n-type doping in EG. $E_F$ is the Fermi level of the EG layer, respectively, with $E_F = h\nu_F \sqrt{\pi|n_G|}\mathrm{sign}(n_G)$. The relationship between those two parameters and the amount of charge transferred from graphene to ZEP520A is given by:

$$\frac{C_{poly}}{e}\left(\frac{e\Delta q}{C_{poly}} - V_D\right) = \frac{C_{y2}}{C_{s2}}\left[n_G + (C_{s1} + C_{s2})\frac{E_F}{e^2}\right] \quad (1)$$

In equation (1), $$\frac{e\Delta q}{C_{poly}}$$

replaces the term that typically represents an electrostatic gate ($V_G$), where $\Delta q$ is the amount of charge transferred. The polymer gate geometric capacitance (all capacitances are per unit area) is $$C_{poly} = \frac{\epsilon_{poly}}{d_{poly}},$$

where $\epsilon_{poly}$ and $d_{poly}$ are the dielectric constant and thickness of the used polymer (either S1813 or PMMA/MMA or a combination in series), respectively. Vu is the voltage corresponding to the Dirac point, which is approximately 16.5 meV ($n_G = 2 \times 10^{10}$ cm$^{-2}$), as per the expected behavior of functionalized EG. The summed capacitance, taking on the subscript i=1 for the buffer layer and i=2 for residual chemical doping, is $$C_{si} = \left(\frac{1}{C_{ci}} + \frac{1}{C_{yi}}\right)^{-1}.$$

Within that sum, the contribution from quantum capacitance is $C_{yi} = \gamma_i e^2$ and that from the geometrical capacitance is $$C_{ci} = \frac{\epsilon_i}{d},$$

with d=0.3 nm as the distance for both cases. The following dielectric constants are used: $\epsilon_{S1813} = 2.54\epsilon_0$, $\epsilon_{PMMA/MMA} = 4\epsilon_0$, $\epsilon_1 = 9.7\epsilon_0$, and $\epsilon_2 = 3\epsilon_0$, where $\epsilon_0$ is the vacuum permittivity.

This charge transfer calculation depends on the quantum capacitance parameters $\gamma_1$ and $\gamma_2$, which have been roughly determined for EG devices as $\gamma_1 = 5 \times 10^{12}$ eV$^{-1}$ cm$^{-2}$ and $\gamma_2 = 1.5 \times 10^4$ eV$^{-1}$cm$^{-2}$.[20, 41] For the p region, we only need to use a PMMA/MMA spacer layer thickness of 100 nm, yielding a predicted transfer of $\Delta q = 5.9 \times 10^{10}$ cm$^{-2}$ for the corresponding measured hole density of $1.22 \times 10^{11}$ cm$^{-2}$. Subsequently, we repeat the calculation for the n region, bearing in mind that the two polymer spacer layers must be summed in series. The S1813 thickness was 1.2 µm, as per the example AFM images, and the PMMA/MMA thickness slightly increased along the S1813 wall due to the changes in flow during spin coating. The expected charge transfer is $\Delta q = 2.2 \times 10^8$ cm$^{-2}$, a couple of orders of magnitude lower, which makes sense because the observed electron density does not change very much with UV exposure.

Figure 35:
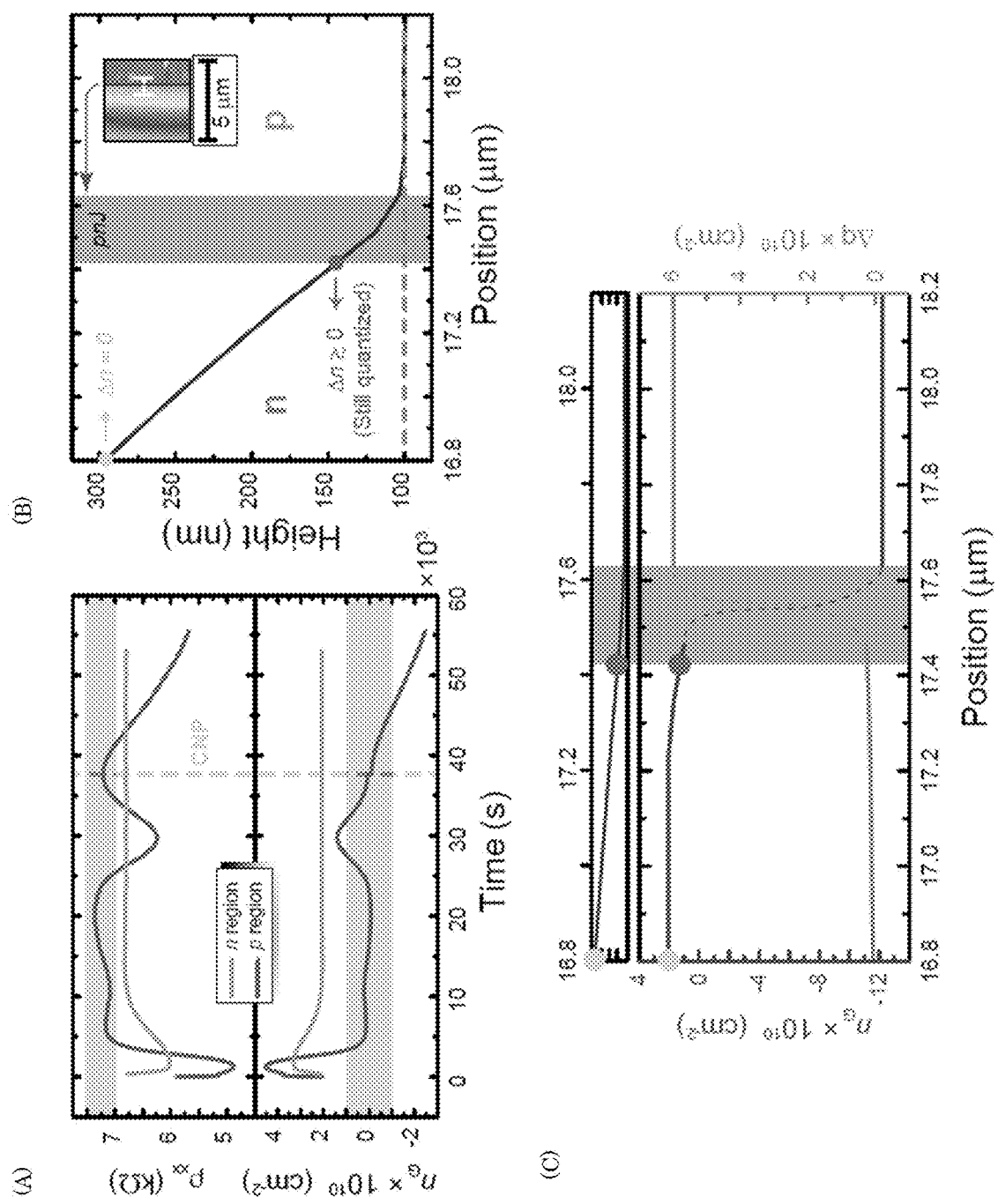
FIG. 35 shows: (a) longitudinal resistivity $\rho_{xx}$ and electron density in EG $n_G$ as a function of time in the upper and lower panel, respectively, while being exposed to 254 nm UV light. Cr(CO)$_3$ provided carrier density transition from n-type to p-type. Charge neutrality point (CNP) is indicated by a dashed line. Shading bands show a range where electrical properties of the EG did not yield quantized plateaus; (b) AFM profile and magnified image of the pnJ after PMMA/MMA copolymer deposition (totaling 100 nm). The curve is taken along the white line in the inset. To validate the junction width, multiple gateless P-N junction metrologs with various thicknesses were measured, as indicated by dots along the profile representing two thicknesses of 300 nm and 42.4 nm. The shaded region indicates bounds within which the carrier density to switched polarity; and (c) the profile and shaded region projected onto calculated charge transfer Δq to the ZEP520A layer and profile of no as a function of lateral distance.

Though the capacitance model gave us insight into what charge dynamics to expect in the device, additional information was needed to determine how the charge transfer and total carrier density changed across the junction as a result of the dielectric spacer thickness. For this, we performed similar coating methods on an example device to gauge whether an identical UV exposure will change the carrier density. For a device having a 300 nm-thick S1813 layer, the electron density remained the same. However, for a device having an approximate S1813 thickness of 41 nm, from reactive ion etching the S1813 layer, the n region changed by nearly one part in $10^{10}$ cm$^{-2}$, but still had a region providing quantized plateaus. This small shift corresponds to a calculated charge transfer of $1.9 \times 10^9$ cm$^{-2}$, an order of magnitude lower than that of the p region. In other work, a polymethylglutarimide spacer layer of around 200 nm yielded similar results. From these factors, and combining the information obtained from the AFM profile, one can claim that the junction width in these devices have an upper bound of 200 nm, well within the range of junction widths enabling $\nu=2$ edge state equilibration. With the knowledge of an upper bound, one can predict the spatial dependence of the carrier density along the pnJ by using the charge transfer model. The resulting behavior is shown in FIG. 35(c).

Figure 36:
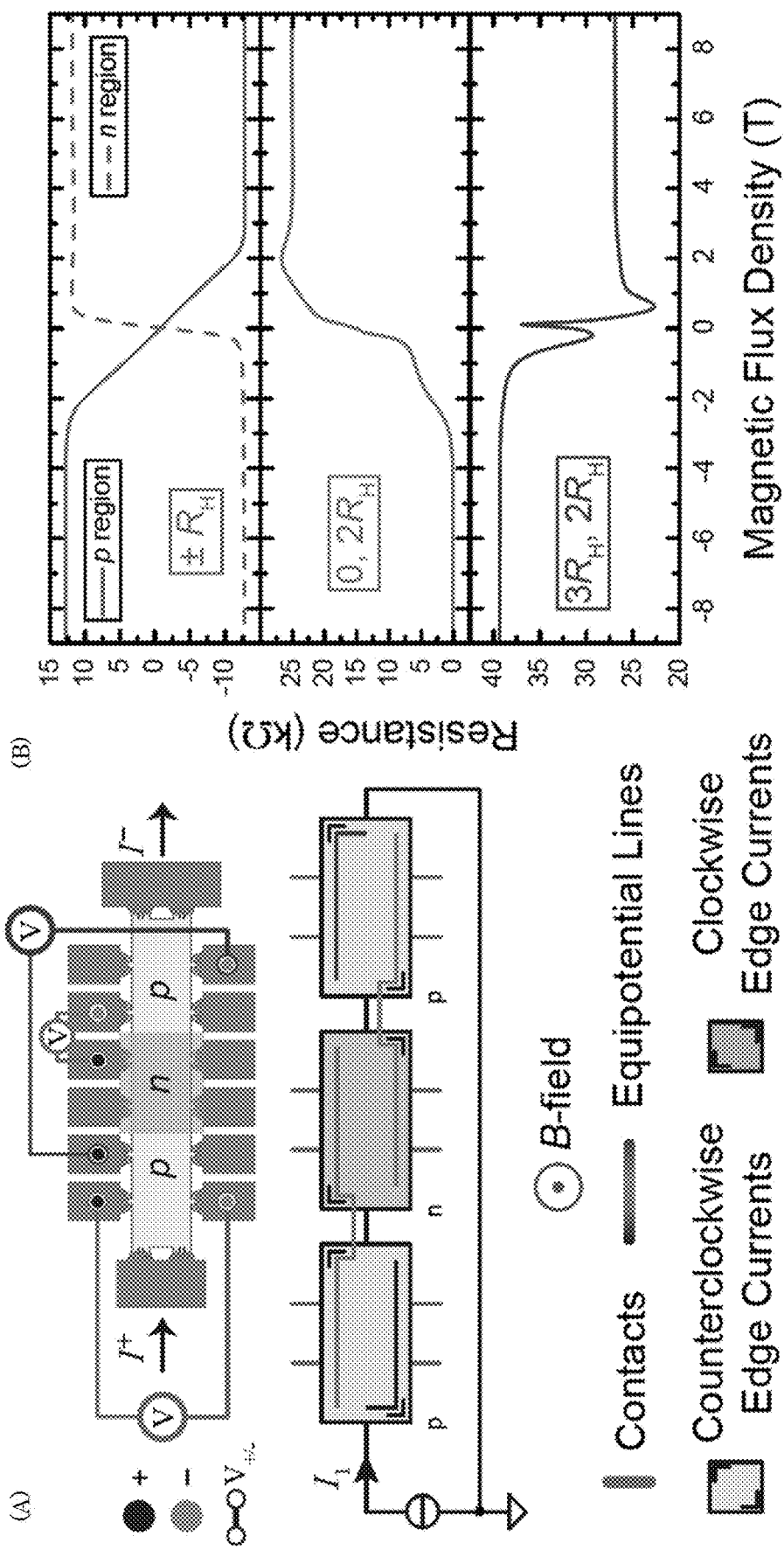
FIG. 36 shows: (a) a gateless P-N junction metrolog and model implemented in LTspice. Voltage measurements are marked with lines connecting the positive and negative terminals and an injected current of 1 μA. Below the gateless P-N junction metrolog, the current simulator drawing shows current flow with assumptions that each box is either a counterclockwise (p region) or clockwise (n region) edge current, for B>0. Contacts are shown and equipotential lines are drawn; and (b) resistances of voltage measurements with the curves matching voltage counterparts as a function of magnetic flux density such that multiples of $R_H$ are accessible.

With regard to measuring nonconventional fractions of the $\nu=2$ Hall resistance and determination that UVP creates large-scale pnJs, we verify expected electrical behavior in a p-n-p device. Circuit simulations were implemented to assist in predicting varied configurations, but first started with the well-known case of injecting a current along the length of the device and measuring various resistances, Hall and otherwise. This verification procedure is presented in FIG. 36. The device and its corresponding circuit simulation model are shown in FIG. 36(a). Three voltage measurements are indicated on the device: a single Hall, a pnJ, and opposing corners. An injected current of 1 µA is used. The circuit simulator drawing, on the other hand, elaborates on how the software interprets the problem of current flow. It first assumes that each box represents either a counterclockwise (p region) or clockwise (n region) edge current, strictly for B>0. The simulations can only be performed for a single polarity of magnetic flux density, so to predict the expected resistive behavior for B<0, one may reverse the polarity of the edge current (pink-gray-pink circuit). Equipotential lines are shown to clarify how the potential is expected to behave in the shown orientation.

Dividing current from voltage measurements yields final resistance data shown in FIG. 36(b). According to the model, for positive B-field, if one was to measure the resistance from the top to the bottom of the device, one could see a negative Hall resistance. This result is confirmed in the top panel, with a dotted line showing the experimental result for a Hall measurement in the center of the device, maintaining the positive and negative voltage terminals as the top and bottom, respectively. For another measurement, one confirms the resistance values of $2R_H$ and 0 for positive and negative B-fields, respectively. Lastly, the values of $2R_H$ and $3R_H$ emerge from measuring the opposing corners. These measurements fully verify the functionality of the millimeter-scale pnJ device.

Figure 37:
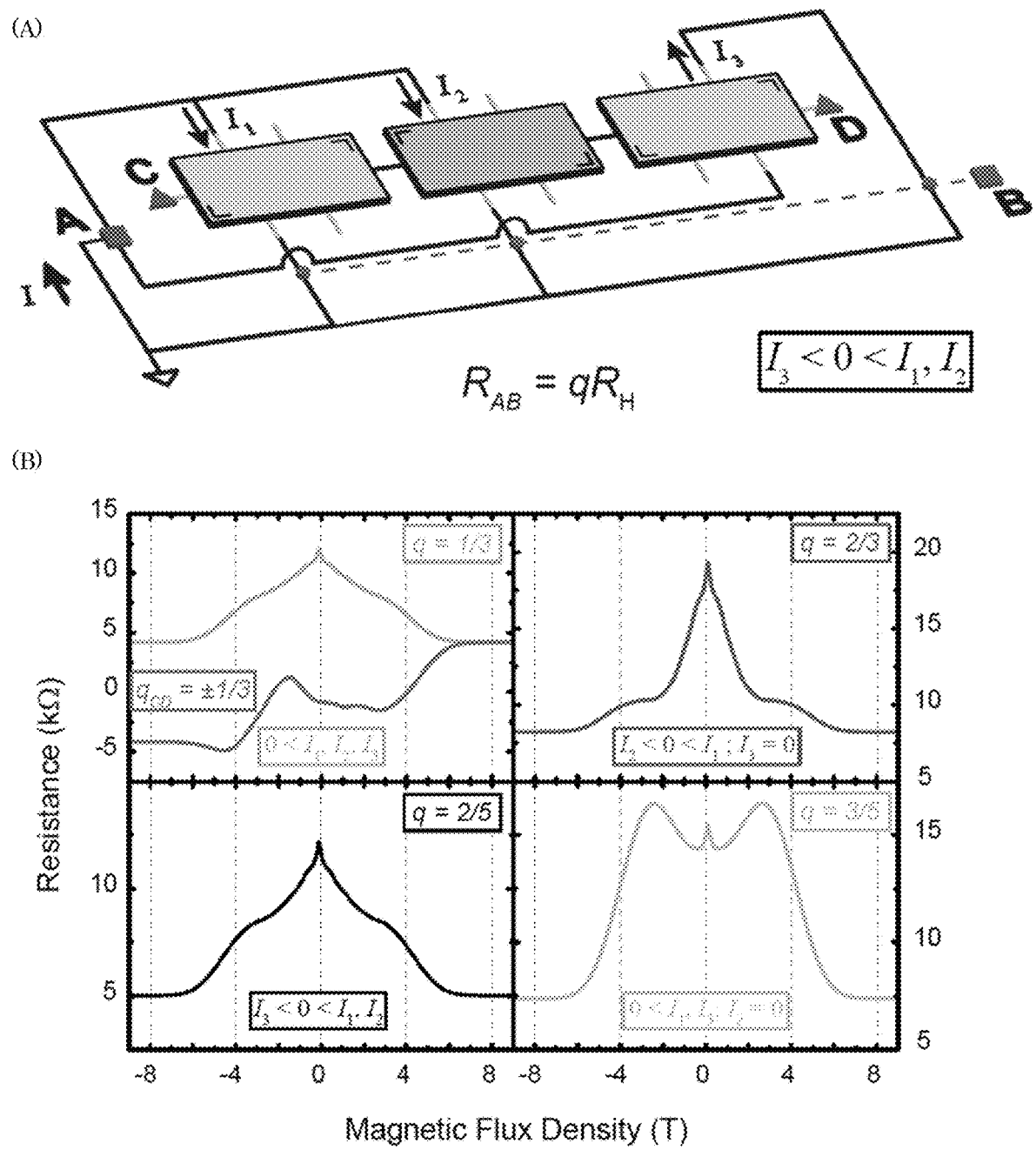
FIG. 37 shows: (a) a circuit model implemented by a circuit simulator. A total current (I) of 1 μA is used and split among up to three injection points on the gateless P-N junction metrolog, shown as $I_1$, $I_2$, and $I_3$; and (b) measured resistances of several configurations of current injection plotted as a function of magnetic flux density for fractional multiples of $R_H$, including ⅓, ⅔, ⅖, and ⅗.

Observations in these pnJ devices motivated exploration of how overall resistance of the pnJ devices can be quantized at other values of $R_H$ under the appropriate conditions. Resistance simulations across points A and B using the circuit simulator (FIG. 37(a)) yielded nonconventional fractions of $R_H$, warranting experimental verification (FIG. 37(b)). Currents were injected at up to three distinct sites on the device, with all currents summing to 1 μA. For general notation, assume that $I_1$, $I_2$, and $I_3$ are positive if they flow from the top to the bottom of the device. If a current is negative, assume that its source has been applied to the bottom of a region, with flow to the top, much like $I_3$ pictured in FIG. 37(a). If one of the three currents is zero, then only two branches are utilized. After the measurement, the overall device resistance is determined from $R_{AB}=qR_H$.

For the configuration $0<I_1$, $I_2$, $I_3$ in FIG. 4(b), q=⅓, which may appear to be an intuitive behavior since there are essentially three regions with Hall resistances, albeit with one region having an opposite polarity. Results rapidly become unintuitive when current directions are changed and branches eliminated. The configuration $I_3<0<I_1$, $I_2$ which is pictured in FIG. 37(a), yields q=⅖, revealing that electric equipotentials are redistributed for reversing a single current. Furthermore, when $I_2<0<I_1$ and $I_3=0$, a value of ⅔$R_H$ is obtained, and for the final displayed configuration of $0<I_1$, $I_3$ and $I_2=0$ occurs, $R_{AB}=⅗R_H$. The simulations provide insight on how the effective resistance can switch sign with the polarity of the B-field. This antisymmetric behavior can be measured with points C and D, with one example being shown in FIG. 37(b) in the $0<I_1$, $I_2$, $I_3$ configuration. Accuracy of the deviation of these measurements from their expected values is limited to approximately 1% due to the elements of the experiment whose uncertainties may also be on that order. Other considerations to make are those of possibly imperfect junctions of insufficient sharpness, whose presence would result in local longitudinal resistances that are unrelated to the propagation of edge states.

When every region of a pnJ device displays quantized Hall resistances, but has a different carrier concentration and polarity, the measured resistivity across one or several sets of pnJs depends on Landauer-Büttiker edge state equilibration at the junction. In the case of EG, where the Fermi level is typically pinned due to the buffer layer, and where the carrier densities take on values on the order of $10^{11}$ cm$^{-2}$, ν=2 equilibration becomes relevant, unlike exfoliated graphene p-n-p devices. With this knowledge, one can construct devices with more regions having opposite polarity, like the one shown in FIG. 38(a). Though it can be speculated that these atypical fractions arise from the redistribution of the electric potential throughout the device, this phenomenon is not intuitive with multiple currents in the quantum Hall regime. Because of this difficulty, using a circuit simulator including quantum Hall elements becomes vital for predicting which fractions of $R_H$ are measurable while each region displays the ν=2 plateau.

Figure 38:
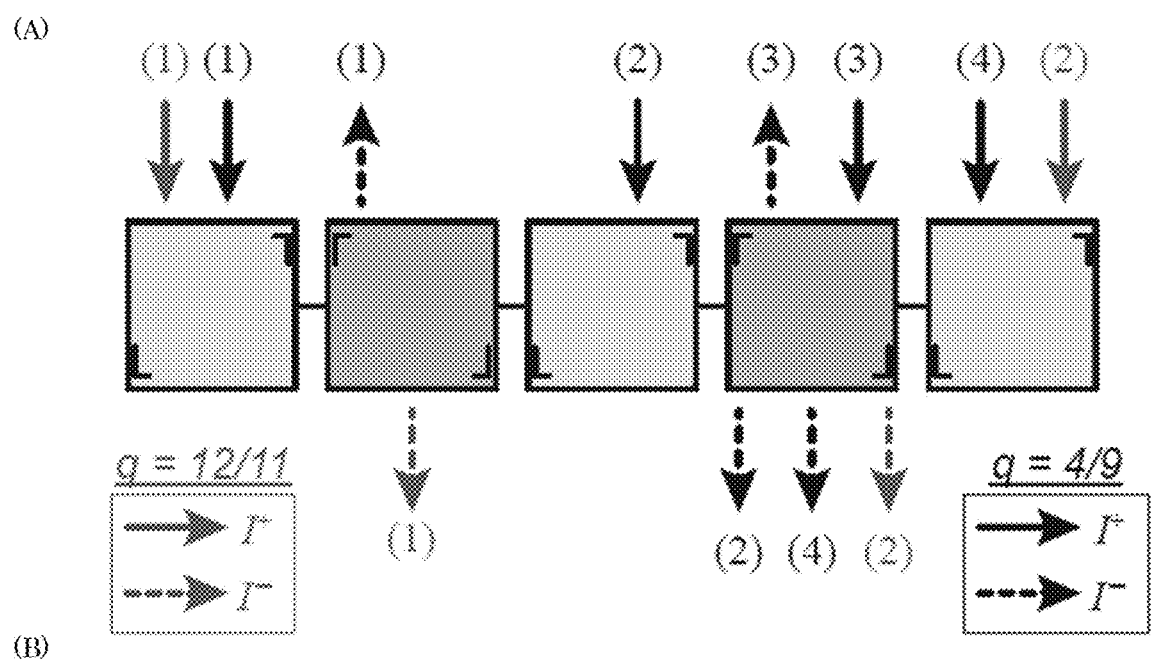
FIG. 38 shows: (a) a circuit model implemented by a circuit simulator. A total current (I) of 1 μA is used and split among up to injection points on the gateless P-N junction metrolog. For obtaining $^{12}/_{11}R_H$, two currents are injected into the gateless P-N junction metrolog. Other fractions, e.g., $^4/_9R_H$, involve four injected currents, indicated by solid (source) and dashed (drain) arrows; and (b) experimental data for simulated fractions $^{12}/_{11}$ and $^4/_9$, to within 97% accuracy. Dotted lines are simulated values.
Figure 38:
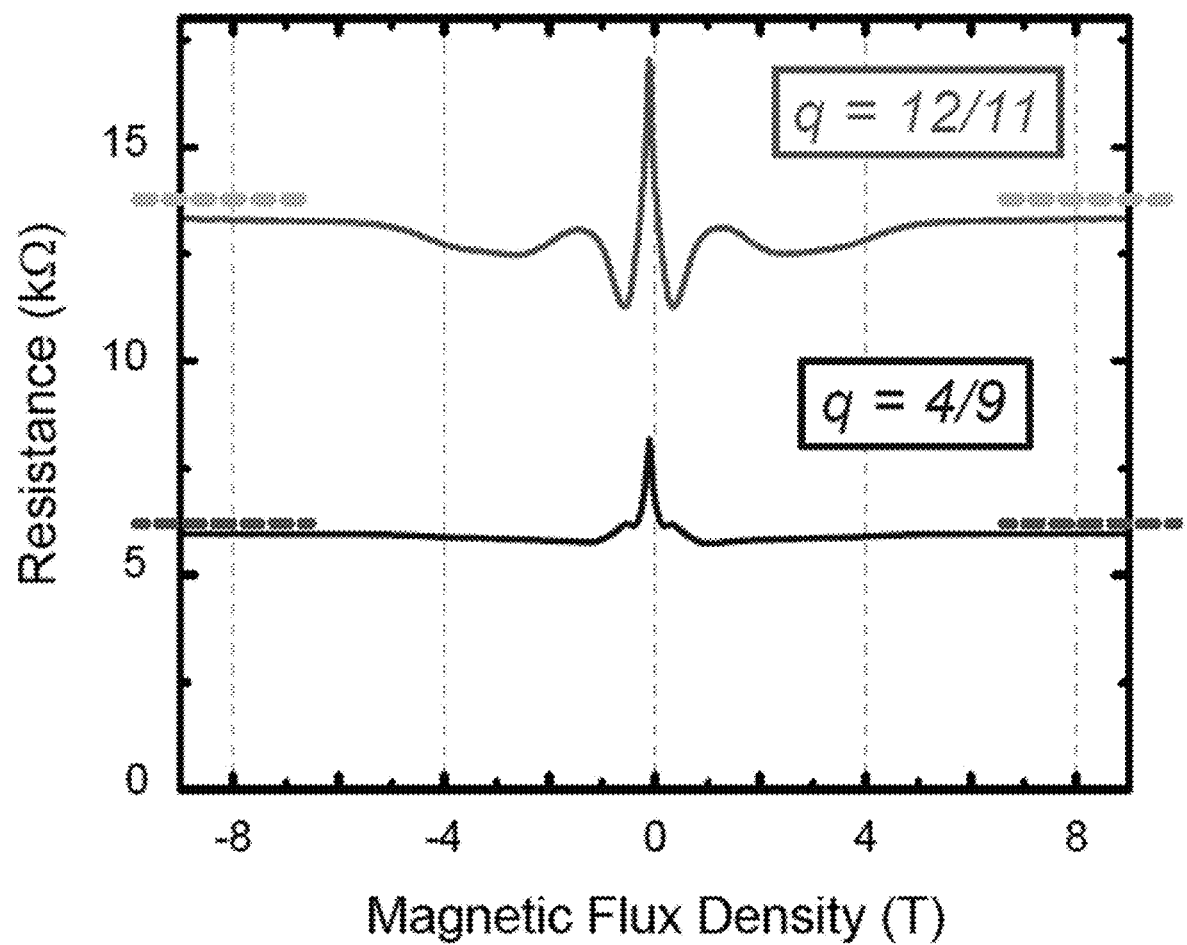

In FIG. 38(b), two examples are shown to provide further validation of using the spice circuit simulator for pnJ devices. Among the many combinations of input and output currents on the device, the fractional values ⅘$R_H$ and 12⁄11$R_H$ are possible results. In the simpler case of q=12⁄11, only two current sources are injected at opposite ends, with the drains exiting from the pair of regions with reverse polarity (see FIG. 38(a)). The data match within 3%, but more experiments are called for to examine the offset errors, possibly a result of the contact resistances and the lock-in amplifiers used to measure points A and B. Furthermore, an analytical way to determine fractional values for a given configuration is warranted. New pnJ devices with many regions in series can now be constructed and explored to find more nonconventional fractions of $R_H$.

Figure 39:
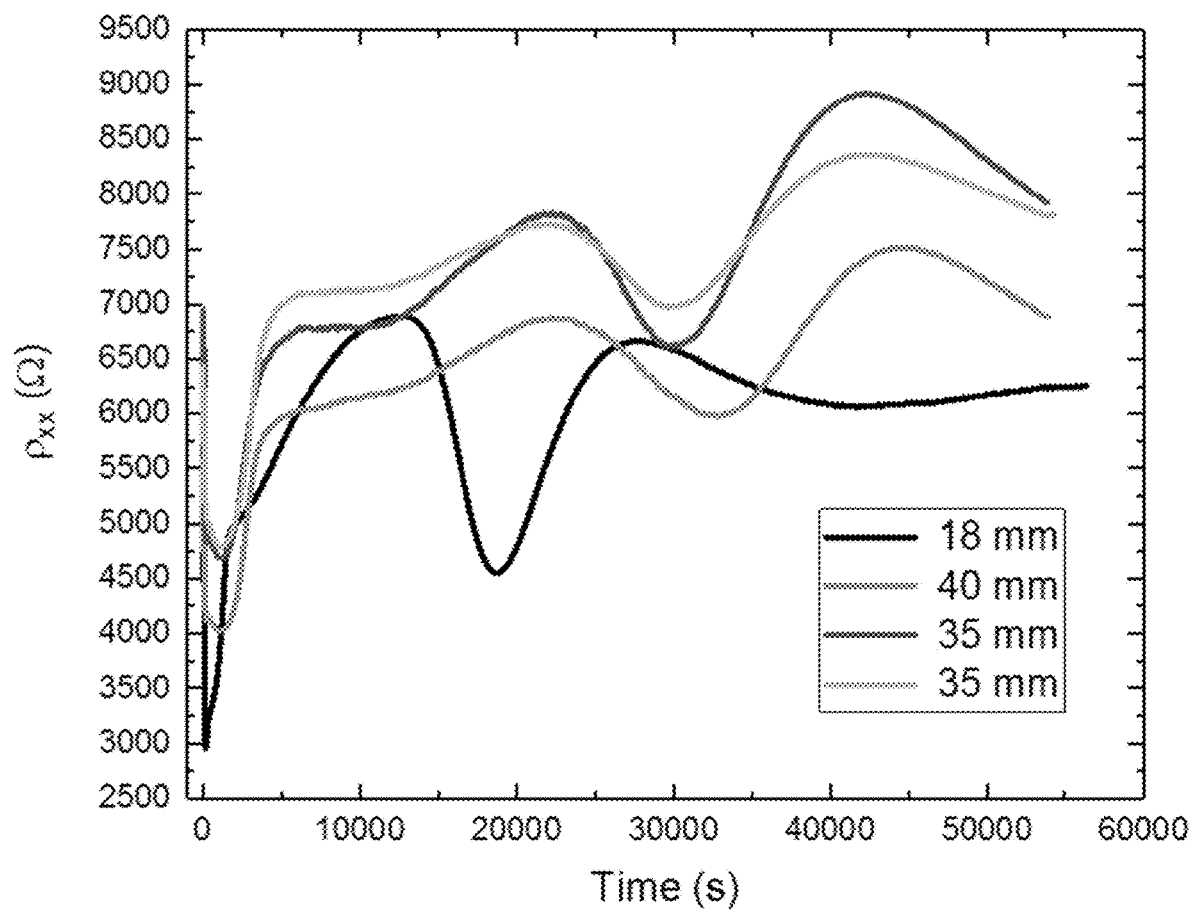
FIG. 39 shows a longitudinal resistivity $\rho_{xx}$ for several gateless P-N junction metrologs exposed to 254 nm UV light with some gateless P-N junction metrologs closer or farther from the 17 000 μW/cm$^2$ bulb source. The dip at $1.9\times10^4$ s (18 mm), $3\times10^4$ s (35 mm for two cases), and $3.3\times10^4$ s (40 mm) is a start of transition of an n-type region to a p-type region with Dirac point crossed after the local maximum approximately $10^4$ seconds after each major dip. Measuring gateless P-N junction metrologs with a resistivity at the dip (local minimum) yielded n-type behavior in Hall resistance at 9 T.
Figure 40:
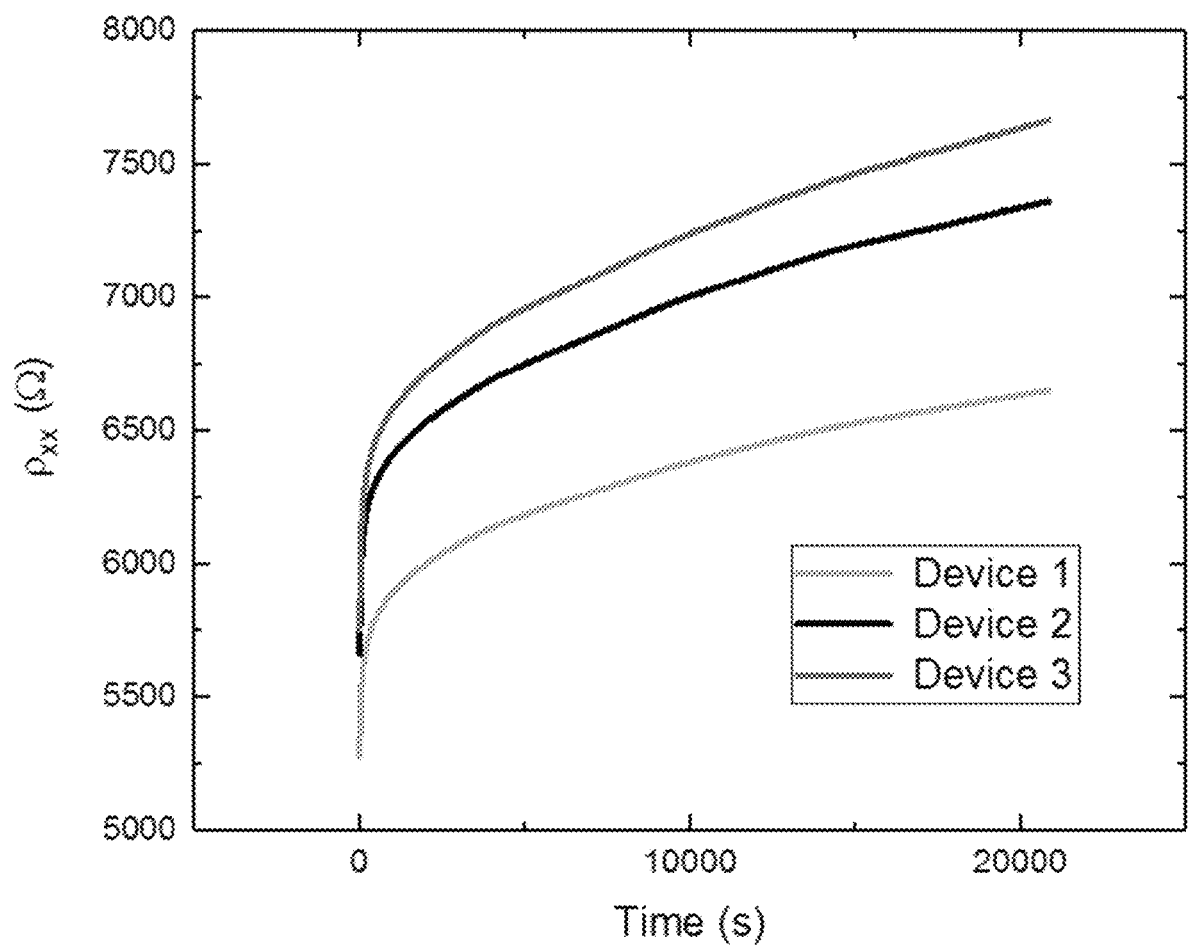
FIG. 40 shows a longitudinal resistivity $\rho_{xx}$ for gateless P-N junction metrologs after exposure to 254 nm UV light. Within $2\times10^4$ s, longitudinal resistivity increased because the p-type region did not maintain its hole density at room temperature under ambient laboratory conditions.
Figure 41:
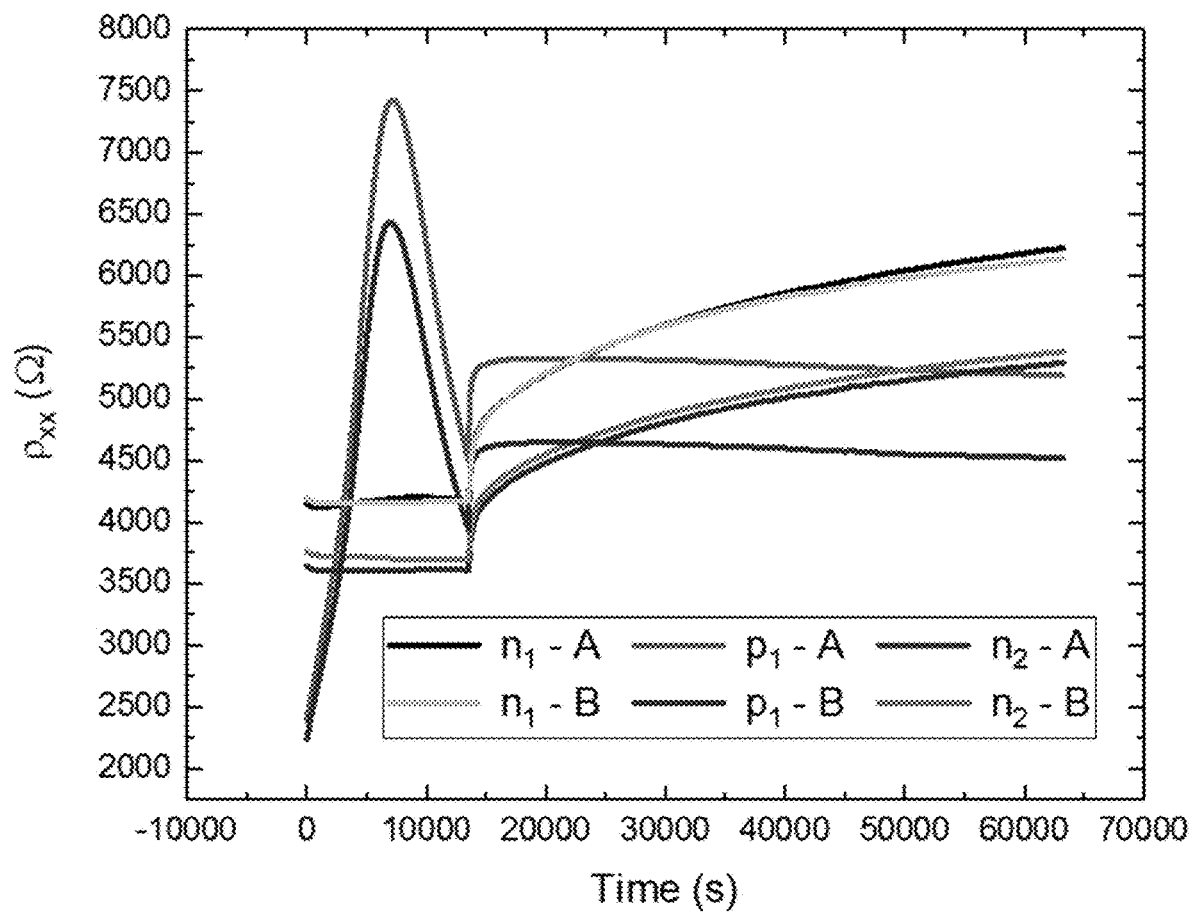
FIG. 41 shows a longitudinal resistivity $\rho_{xx}$ at room temperature as a function of UV exposure time for a gateless P-N junction metrolog not been functionalized with Cr(CO)$_3$. Four different regions were to remain as n-type regions. Two measurements for the p region were in the middle of the gateless P-N junction metrolog and had a transient effect within $1.5\times10^4$ s. At the end of exposure, all regions maintained an electron density that provided a quantized Hall resistance at 9 T and 4 K.
Figure 42:
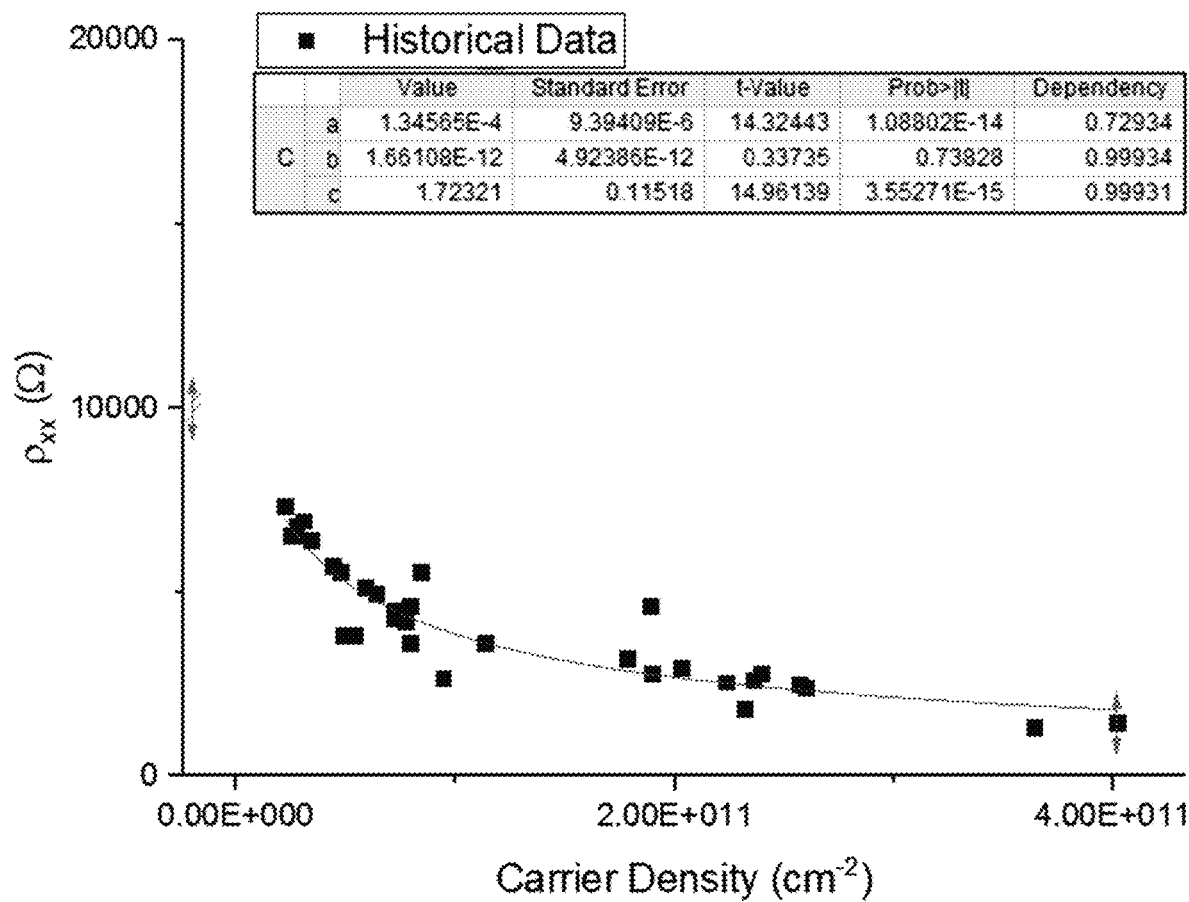
FIG. 42 shows a relationship between $\rho_{xx}$ to $n_G$ from a modified Langmuir fit on historical data for gateless P-N junction metrolog formed under similar conditions with $$\rho_{xx} = \frac{1}{a + bn^{c-1}},$$

For millimeter-scale epitaxial graphene p-n junctions, FIG. 39, FIG. 40, and FIG. 41 show UV exposure details, Modeling and simulation details are shown in FIG. 42 and FIG. 43, wherein a capacitance model is given by:

$$\frac{C_{poly}}{e}\left(\frac{e\Delta q}{C_{poly}} - V_D\right) = \frac{C_{y2}}{C_{s2}}\left[n_G + (C_{s1} + C_{s2})\frac{E_F}{e^2}\right].$$

The charge transferred from EG to ZEP520A is designated as $\Delta q$. The top panels show how $\Delta q$ varies with the thickness of the S1813 layer while keeping the final carrier density in EG constant at $2\times10^{10}$ cm$^{-2}$. The bottom panel shows $\Delta q$ as a function of $n_G$ while keeping the S1813 thickness fixed at zero. These trends are shown to elucidate the heavier influence of the final carrier density in EG on $\Delta q$ than the thickness of the S1813 layer. FIG. 44 shows aspects of model circuitry and responses for gateless P-N junction metrolog 200.

Spacer layer behavior is shown in FIG. 45 and FIG. 46.

Example 3. Analytical Determination of Atypical Quantized Resistances in Graphene p-n Junctions Graphene devices can display quantized Hall resistance values of $$\frac{1}{(4m+2)}\frac{h}{e^2},$$

where m is an integer, h is the Planck constant, and e is the elementary charge. When configured as p-n junctions (pnJs), e.g., for transport in the quantum Hall effect (QHE), these graphene-based devices become a foundation for exploring two-dimensional physics. Concordantly, such devices can be applied towards photodetection, electron optics, and quantum Hall resistance standards.

Of the applications listed, the latter can benefit from pnJs for quantum transport to access different quantized values of resistance. The behavior of those pnJs depend heavily on which Landauer-Büttiker edge states equilibrate at the relevant junctions and an extensive analysis of these behaviors was explained in previous reports, many involving tunable gates used to adjust the pnJ. To date, most of these studies have only used a single source and drain, and though this has been useful for many fundamental device measurements, this limit on how the current is permitted to flow confines the parameter space within which a device may be operated.

This work introduces a new mathematical approach to predicting quantized resistances in pnJ devices utilizing more than a single entry and exit point for electron flow. The introduction of multiple electron entry or exit terminals appears to contribute to a nonintuitive effect on the measurable effective resistance of the device. For different numbers and configurations of terminals, electrical measurements yield a variety of nonconventional, fractional multiples of the typical quantized Hall resistance at the ν=2 plateau ($R_H \approx 12906\Omega$) and take the form:

$$\frac{a}{b}R_H,$$

where a and b are integers. As seen in a previous experimental work, a and b formed several measurable coefficients of $R_H$. Since those observations, an explanation for why those values appeared was not fully understood, let alone formulated into a theoretical framework. The latter framework is important to understand and may provide insights on device functionality in the quantum Hall regime. Furthermore, this new framework provides an easily implementable algorithm for the calculation of the quantized resistances when specific experimental outputs are desired, an approach that cannot be granted by simulations alone. Given that this formulation is independent of material properties, applications to other material systems that exhibit quantum Hall behavior are to be expected.

The use of source and drain is not used in the following description in this Example to prevent confusion regarding electron flow within the device and will be replaced by electron entry or exit terminals, with entry and exit terminals being representing by negative and positive symbol icons, respectively. Many simulations were performed to determine a generalized behavior of how the overall effective resistance of the circuit shown in FIG. 47 changes with terminal configuration. These simulations were performed with the analog electronic circuit simulator LTspice.

The overall circuit comprises quantized regions of both p-type and n-type variety, with both regions being modeled as either ideal counterclockwise (CCW) or clockwise (CW) k-terminal quantum Hall effect (QHE) elements and shown as gray or blue regions in FIG. 47, respectively. The terminal voltages $e_m$ are related to the currents $j_m$ by $R_H j_m = e_m - e_{m-1}$ (m=1, ..., k) for CW elements and $R_H j_m = e_m - e_{m+1}$ for CCW elements. To determine the circuit's behavior at the external terminals (labeled as A and B in FIG. 47), only a single magnetic field (B-field) direction was simulated at a time. For a positive B-field, an n-type (p-type) device (experimentally represented as a graphene-based device) was modeled by a CW (CCW) QHE element, whereas, when B is negative, a CWW (CW) QHE element was used.

To test some of the simulations, graphene pnJ devices were fabricated from epitaxially grown graphene (EG). When at the high temperature of 1900° C., Si atoms sublimate from SiC samples, leaving behind an excess of carbon that arranges itself into a honeycomb lattice. Samples were diced from on-axis 4H—SiC(0001) semi-insulating wafers. After a chemical cleaning with a 5:1 diluted solution of hydrofluoric acid and deionized water, the samples were processed with AZ5214E for polymer-assisted sublimation. Next, samples were placed silicon-face down on a polished graphite substrate. The growth was performed in an ambient argon environment at 1900° C. with a graphite-lined resistive-element furnace, with heating and cooling rates of about 1.5° C./s.

After growth, the quality of the EG was assessed with confocal laser scanning and optical microscopy for efficiency. Protective layers of Pd and Au were deposited on the EG to prevent organic contamination during the subsequent photolithography processes. The required functionalization with $Cr(CO)_3$ to reduce the electron density to the order of $10^{10}$ cm$^{-2}$, as well as the deposition of a S1813 photoresist spacer layer and photoactive ZEP520A layer, was also followed as previously described.

As the theoretical framework for determining the effective quantized resistance of the circuit exemplified in FIG. 47 is explained, certain parameters will be frequently mentioned. The total number of terminals, regardless of polarity and position, is defined as N. For instance, the device in FIG. 47 has a total of 4 terminals. Direct current measurements were set up such that a voltage was always measured between points A and B in FIG. 47, yielding a resistance of the form $R_A B = q_{N-1} R_H$, where $R_H$ is the Hall resistance at the ν=2 plateau ($R_H \approx 12906\Omega$) and $q_{N-1}$ is defined as the coefficient of effective resistance (CER). The CER, based on the efforts reported here, appears to be restricted to the set of rational numbers, with all simulated results being expressed as a either a fraction or an integer.

For N terminals, the number $n_j$ is defined as the number of junctions between two adjacent terminals, thereby limiting j to N−1. In the example case of FIG. 47 (where N=4), there are three $n_j$ terms: $n_1=1$, $n_2=2$, $n_3=2$ (rectangles in FIG. 47). Assignment of numerical subscripts to $n_j$ must also be defined. One of the conditions upon which the forthcoming theory correctly predicts the CER is that the greater of the two outermost adjacent terminal pairs in any given configuration is assigned as $n_{N-1}$. The second outermost is then assigned as $n_{N-2}$ (if both pairs are equal, then the assignment is arbitrary and will yield the same calculated result for both selections). This alternation continues until $n_1$ has been assigned. As one goes from region to region on the device from left to right, terminals alternate in polarity like in FIG. 47 (negative, positive, negative, positive).

Terminals can be treated like point charges in electrostatics (though confined to the Hall bar geometry), and this analogy of bringing a new charge from infinity to a pre-existing configuration will be useful to visualize many of the results. One assumption is that for a given terminal configuration, using either magnetic field polarity will yield the same quantized resistance.

The case of two terminals is considered in FIGS. 48(a) and (b). A positive terminal is first arbitrarily placed and kept fixed while a negative terminal nearby is moved to determine $q_1$ as a function of $n_1$. FIG. 48(a) shows the negative terminal being moved one junction at a time (from $n_1=1$ to $n_1=6$), with the corresponding result of simulation plotted in FIG. 48(b). The simulations reveal that the CER ($q_1$) is a linear function of $n_1$ and should approach infinity as $n_1$ does. This is an intuitive result since it essentially reflects a traditional two-terminal measurement across an increasing number of Hall bar regions. Furthermore, the case of $n_1=0$ yields a CER of one and represents the traditional measurement across a single region. The cases where both a positive and negative terminal occupy the same region will play a role.

Next, the three-terminal configuration is considered in FIGS. 48(c) and (d), with each terminal alternating in polarity going from left to right. The alternating polarities will make generalizing behaviors easier. By performing simulations for $q_2$ as a function of $n_z$, the non-linear behavior begins to emerge. Two example sets of simulations are shown in FIG. 48(c) while keeping $n_1$ fixed. In all cases of $n_1$, the resulting dependence of $q_2$ on $n_2$ is sigmoidal, warranting the use of the following ansatz:

$$q_2(x) = A_2 + \frac{A_1 - A_2}{1 + \left(\frac{x}{x_0}\right)^p} \quad (1)$$

Equation (1) is the Hill-Langmuir equation and also known as Logistic fit curve. Using this sigmoidal fit function, as opposed to others like the Fermi-Dirac distribution or the Verhulst growth model, yields zero error when fitted to the simulation data. Furthermore, the parameters of Eq. (1) take on meaningful quantities (p=1):

$$q_2(n_2) = q_1 + \frac{1-q_1}{1+\frac{n_2}{q_1}} = \frac{q_1(n_2+1)}{q_1+n_2} \qquad (2)$$

Equation (2) establishes the general behavior for the three-terminal configuration (recall that $q_1=n_1+1$). This includes configuration conditions that have not yet been fully elaborated, such as the case where two adjacent terminals are of the same polarity or if two terminals of opposite polarity occupy the same region (again, the latter case gives a well-known quantized resistance of $R_H$ and CER of $q_1=1$).

Electron flow can be restricted to regions along the entire length of the device, as defined by the endpoint terminals. For instance, in FIG. 48(c), electrons flow from the two negative terminals to the single positive one, effectively uniting the device as a single quantized resistor with a span of $n_1+n_2$ junctions. In these cases, the terminal configuration is said to be fully self-interacting. However, there are cases where configurations, like the one shown in FIG. 49 with non-alternating terminals, involve a semiclassical edge state picture to assist with visual understanding of the theoretical framework.

FIG. 49(a) shows a self-interacting, four-terminal configuration whose simulations reveal that the CER holds a similar dependence on $n_x$ as it does in FIG. 48(d) for $n_2$. As shown in FIG. 49(a) ($n_x=2$), the corresponding simulation yields $q_3=12/11$, and the reason for using $n_x$ instead of the outermost adjacent pair will be explained later along with the formula for N=4 configurations. When simulating the CER for increasing $n_x$, the sigmoidal trend only holds true for even values of $n_x$. For simulations of this configuration when $n_x$ is any odd number, $q_3=1$. This behavior can be explained by FIG. 49(b), where the edge current picture provides a possible answer. Both electron paths cross in opposite directions at the same points in each junction. Furthermore, within each of the central opaque regions, the currents are expected to equilibrate since there is an appropriate, but temporary, potential difference at the $n_x$ junctions (see Supplemental Material). This leads us to the justification of treating the whole configuration like a pair of isolated two-terminal configurations. And in the case of FIG. 49(b), each two-terminal configuration has a CER of 2, thus yielding our simulation result of $q_3=1$. Drawing a similar diagram for other odd values will only validate this edge state visualization. The latter configuration is said to not be self-interacting, but rather is a simpler arrangement of two configurations in parallel.

When examining self-interacting, four-terminal configurations, an attempt can be made to posit a formula that describes the CER. Since it is safe to assume that configurations with alternating terminals are fully self-interacting, that is the model upon which this next analysis will depend, and the exact model is illustrated in FIG. 50(a). As before, the two outermost adjacent pairs are inspected and the larger of the two is selected as $n_3$. The assignment of $n_2$ and $n_1$ follows thereafter in alternating succession. With all three $n_j$ terms assigned, calculating the CER becomes straightforward and starts with $q_1$. Based on the previous two formulas shown in FIG. 48, $q_1=3$ and $q_2=3/2$. The full formula for $q_3$ has not been fully uncovered at this point, but an educated prediction can be made in the form of Eq. (2), but iteratively transformed:

$$q_3 = \frac{q_2(n_3+1)}{q_2+n_3}.$$

This first prediction is shown in FIG. 50(b) as a red curve, incorrectly yielding the CER of this configuration to be $q_3=4/3$. Extending the simulation for $q_3$ for $n_3:\{0, \ldots, 16\}$ (black squares) shows that there is a consistent deviation from the first prediction, but not one that is solvable by a simple vertical translation. Adding a corrective term in the Hill-Langmuir equation enabled the finding of that corrective term, $\delta_3$, as a numerical value. The next question regarded the origin of the term $\delta_3$. For this configuration, $\delta_3=1/2$ for all values of $n_3$, and the corrected formula was plotted in blue, matching the simulations with zero error:

$$q_3(n_3) = \frac{q_2(n_3+1)}{q_2+n_3+\delta_3} \qquad (3)$$

Describing other configurations that do not alternate in polarity is beneficial as a tool to simplify complex configurations. The edge state picture and FIG. 49 were presented under the condition that a term $n_x$ was used to describe the junctions between two adjacent terminals of similar polarity. Since treating a self-interacting, non-alternating terminal configuration did not obey the same formula as its alternating counterpart, using $n_x$ was the simplest way to characterize the configuration. A similar configuration to FIG. 49 was used in FIG. 51(a), and prior to its analysis, self-interaction was verified with the edge state picture. The following formula was used as an ansatz with the intention of analyzing the limits of $n_x$:

$$q_3(n_x) = \frac{xn_x+x}{yn_x+z} \qquad (4)$$

Equation (4) (which for this configuration is only valid for even $n_x$) takes on the form of Eq. (3), with the numerator fully distributed and the denominator containing two terms. As seen in FIG. 51(a), if the limits of $n_x$ are evaluated, these variables can be found:

$$\lim_{n_x \to \infty} \frac{xn_x+x}{yn_x+z} = \frac{x}{y}, \text{ and} \qquad (5)$$
$$\lim_{n_x \to 0} \frac{xn_x+x}{yn_x+z} = \frac{x}{z}$$

Equation (5) yields two ratios that need to be determined to obtain a formula for this configuration. For $n_x \to \infty$, the left and right pairs of terminals are considered isolated, thus equating $$\frac{x}{y}$$

to the CER as if both pairs were connected in parallel, and this value is $(\frac{1}{2}+\frac{1}{3})^{-1}=\frac{6}{5}$. In FIG. 51(b), the isolated-case CER manifests itself as the asymptotic value for $q_3$ (dotted line), with its hypothetical device depicted in the outlined box. For $n_x=0$, the whole configuration effectively becomes the one shown in the other outlined box, which is an alternating terminal configuration that obeys Eq. (2). The CER for this limiting case is $q_2=\frac{3}{2}$, and this implies that, by taking the lowest common factors, x=6, y=5, and z=4, the final expression for this configuration for all $n_x$ is $$q_3(n_x) = \frac{6n_x + 6}{5n_x + 4}.$$

Ergo, for the exact configuration in FIG. 51(a), shown as the data point in (b), $q_3=\frac{9}{7}$.

The final two conditions to mention are those of the "unit" terminal, in which a positive and negative terminal both occupy the same region, and the existing symmetry of the formulas for non-alternating terminal configurations. First, the unit terminal has the obvious CER value of 1 when isolated. Once incorporated into a larger configuration, like the one shown in FIG. 51(c), the edge state picture is needed to determine whether the unit terminal will remain isolated or interact with the other terminals. For the graph in FIG. 51(c), full self-interaction is expected only for even $n_x$, and for all odd $n_x$, the CER is ¾. The unit terminal immediately renders the configuration as one that is non-alternating, warranting the approach taken for Eq.s (4) and (5). By repeating the analysis, one arrives at $$q_3(n_x) = \frac{3n_x + 3}{4n_x + 3}$$

for even $n_x$ (but for cases when the unit terminal is near another single terminal of either polarity, the total CER remains unaffected and at 1). With the formula for even $n_x$, one finds $q_3=\frac{9}{11}$ (data point in FIG. 51(c)).

To address the second condition, if the two, adjacent, like-polar terminals are on opposite sides of the device, as shown in FIG. 51(d), then this reflection about the horizontal must then be described by the same equations, with the conditions on even and odd $n_x$ being switched. The repeated simulations and mathematical analysis are plotted, and as expected, the CER, still being based on $n_x=2$, now describes the parallel combination of two isolated configurations ($q_3=\frac{3}{4}$).

To begin generalizing behavior for alternating configurations with any N, it will help to go through one additional analysis of limiting cases. Recall Eq. (3), with appropriate subscripts for the arbitrary N=5 case:

$$q_4(n_4) = \frac{q_3(n_4 + 1)}{q_3 + n_4 + \delta_4} \tag{6}$$

One note to make is t at $\delta_4$ does not depend on $n_4$, but rather the remaining $n_j$ terms, and that independence allows for an easier inspection of the limiting case when $n_4=0$. By applying this case to Eq. (6), the relation for the corrective term becomes clear:

$$\delta_4 = q_3\left(\frac{1}{q_4^{(0)}} - 1\right).$$

By substituting this back into Eq. (6), the following result is obtained:

$$q_4(n_4) = \frac{q_3(n_4 + 1)}{n_4 + \frac{q_3}{q_4^{(0)}}} \tag{7}$$

In Eq. (7), the term $q_4^{(0)}$ is a CER that characterizes a similar N=5 configuration as above, with the substantial difference that one of its outermost adjacent terminal pairs (parameterized by $n_4$) has been reduced to a unit terminal. A unit terminal renders a configuration non-alternating, and so a new calculation must be performed to obtain $q_4^{(0)}$. After that calculation or simulation, $q_4(n_4)$ is fully known and can be predicted. The final result is one where Eq. (7) has been generalized for any alternating configurations containing N terminals:

$$q_{N-1}(n_{N-1}) = \frac{q_{N-2}(n_{N-1} + 1)}{n_{N-1} + \frac{q_{N-2}}{q_{N-1}^{(0)}}} \tag{8}$$

Combining al the presented mathematical techniques enables one to predict the CER for an arbitrary configuration of large N despite the increasing complexity of both the configurations and the corresponding calculations.

Two functioning devices were fabricated to test this theoretical framework. They were inherently limited by the number of allowable electrical contacts and the good performance of a subset of those contacts. Nonetheless, experimental data were acquired at ±9 T, 1.6 K, and on a transistor outline (TO-8) package. Two relatively complex configurations that fit within the useable contacts were measured and plotted in FIG. 52. The first configuration was a non-alternating one that was not self-interacting (since $n_x=1$). It essentially contained a unit terminal on one isolated branch and a CER of 2 on the other. A quick parallel resistance calculation would reveal an expected value of $q_3=\frac{2}{3}$, and this comparison is made on FIG. 52(a) between the data and dashed line for the theory.

FIG. 52(b) has an additional terminal, but because $n_x=1$ (odd) and the two like-polar terminals are on the same side of the device, the unit terminal on the left is still isolated from the rest of the configuration. The right side of $n_x$ may be treated as an isolated N=3 configuration (with subsequent assignments of $n_1$ and $n_2$). The right side has a CER of ¾ per Eq. (2), and when this value is placed in parallel with the left side's CER of 1, the expected value is $q_4=\frac{4}{7}$. In both cases, there is a small offset from the plateaus, most likely due to instrument errors and device imperfections. Any simulations performed henceforth may now be trusted and understood, seeing as its analytical counterpart has been explained and expressed.

A complex configuration, along with some of its sub-configurations with main configuration (N=11) is shown in FIG. 53. The calculations are done step-by-step for the first few components of the configuration.

Once the $n_j$ terms have been assigned, the calculation can begin. As described in the main text, selection of the larger of the two outermost pairs of adjacent terminals to be $n_{10}$. When assigning the lower numerical subscripts, take care to go from one side of the device to the other. This will result in the even subscripts being on one side and the odd subscripts being on the other. This condition is necessary to ensure the exactness of Eq. (A1) (also in FIG. 53):

$$q_{N-1}(n_{N-1}) = \frac{q_{N-2}(n_{N-1}+1)}{n_{N-1} + \frac{q_{N-2}}{q_{N-1}^{(0)}}} \quad (A1)$$

With $n_1=1$, we use the linear form of Eq. (A1), which is $q_2=(n_1+1)$. Note that this is the only case when Eq. (A1) "breaks down", mainly because of the ill-defined $q_0$. $q_1=2$, and that brings us to $n_2=2$. If we apply Eq. (A1) again:

$$q_2(n_2) = \frac{q_1(n_2+1)}{n_2 + \frac{q_1}{q_2^{(0)}}} = \frac{2(2+1)}{2 + \frac{2}{1}} = \frac{6}{4} = \frac{3}{2}$$

$$q_3(n_3) = \frac{q_2(n_3+1)}{n_3 + \frac{q_2}{q_3^{(0)}}} = \frac{\frac{3}{2}(3+1)}{3 + \frac{\frac{3}{2}}{\frac{3}{4}}} = \frac{6}{5}$$

To calculate the $q_3^{(0)}$ term, $n_3 \to 0$, and resulting configuration must be solved as though it was a new configuration. This resembles the configuration in FIG. 52(a) of the main text. The edge state picture suggests that the electron flow from each of the two negative terminals cross in opposite directions at the single $n_x$ junction. Now we know that this new $q_3^{(0)}$ configuration in FIG. 54 has two isolated branches. The left branch (a unit terminal) has a CER of 1, and the right branch has a CER of 3. Taking the parallel addition of the two yields $q_3^{(0)}=3/4$. Using this value gives $q_3=6/5$.

$$q_4(n_4) = \frac{q_3(n_4+1)}{n_4 + \frac{q_3}{q_4^{(0)}}} = \frac{\frac{6}{5}(4+1)}{4 + \frac{\frac{6}{5}}{\frac{2}{3}}} = \frac{30}{29}$$

Moving on to $q_4$, we repeat the calculation, knowing all the terms except for $q_4^{(0)}$. To get this value, we must repeat the previous analysis of taking the limiting case of $n_4 \to 0$, giving us $q_4^{(0)}=q_4(n_4=0)$. The relevant portion of the configuration from FIG. 53 is used for FIG. 55.

The corresponding configuration for $q_4^{(0)}$ is on the right side of the arrow in FIG. 55. The edge state picture suggests that the unit terminal on the right interacts with the other terminals, making this configuration self-interacting, and $$q_4^{(0)}(n_x) = \frac{xn_x + x}{yn_x + z}$$

When $$n_x \to \infty, \frac{x}{y}$$

is equal to the total CER of two independent branches in parallel, with the left branch having a CER of 8/5 (in this new configuration's left branch, $n_1=1$ and $n_2=3$) and the right branch having a CER of 1 (unit terminal). Therefore, $$\frac{x}{y} = \frac{8}{13}.$$

Now let's consider the $n_x \to 0$ case. The ratio $$\frac{x}{z}$$

is equal to the CER of the configuration shown in FIG. 56.
To make matters slightly easier, the CER of FIG. 56 is the parallel combination of $n_{left}=4$ and $n_{right}=1$, giving $$\frac{x}{z} = \frac{4}{5} = \frac{8}{10}.$$

For determining $q_4^{(0)}$, plug in the lowest common factors for the ratios yields:

$$q_4^{(0)}(n_x = 2) = \frac{xn_x + x}{yn_x + z} = \frac{8n_x + 8}{13n_x + 10} = \frac{24}{36} = \frac{2}{3}$$

Now that $q_4(n_4=4)=30/29$ has been established, the calculation may continue with $n_5=4$. At this point, the remaining calculations are left as an exercise to the reader, and they will find that the simulations match the resulting calculated values:

$q_5(n_5=4)=15/17, q_5^{(0)}=5/9$ $q_6(n_6=5)=15/19, q_6^{(0)}=15/29$ $q_7(n_7=5)=5/7, q_7^{(0)}=15/31$ $q_8(n_8=6)=21/32, q_8^{(0)}=15/34$ $q_9(n_9=6)=105/173, q_9^{(0)}=105/251$ $q_{10}(n_{10}=7)=420/737, q_5^{(0)}=105/263$

Having such a device at the ν=2 plateau ($R_H \approx 12906\Omega$) would result in a quantized effective resistance of: $R_{AB}=q_{10}R_H \approx 5152.75\Omega$.

Terminal configurations yield the same CER for both polarities of magnetic field. The support will stem mostly from a visual representation of the edge state picture. In FIG. 57, non-alternating configurations are placed in both polarities of magnetic field. A self-interacting configuration Is shown in FIGS. 57 (a) and (b), with positive and negative B-field, respectively. The difference in how the currents are permitted to travel does not alter the configuration's status as one that is self-interacting.

A configuration that is not self-interacting is shown in FIGS. 57 (c) and (d), with positive and negative B-field, respectively. Though the differences in electron flow are more substantial, both cases still feature central opaque regions that effectively isolate the two pairs of terminals. The mechanism for edge state "cancellation" in FIG. 57 (c) is shown below. Alternating configurations are easier to justify as having this CER symmetry with positive and negative B-field because no matter which region electrons begin to flow from, the first junction will split the current such that they flow towards both positive, adjacent terminals.

With $q_2^{(0)}=1$, if one considers where a unit terminal has a third terminal adjacent to it (see FIG. 58(a)), we arrive at that result by performing the limiting case analysis.

$$q_3(n_x) = \frac{xn_x + x}{yn_x + z}$$

If $n_x \to 0$, the ratio $$\frac{x}{z}$$

is 1 since all that remains is a single unit terminal. When $n_x \to \infty$, the lone negative terminal at infinity will provide no current due to the infinite resistance that path would offer to an electron. Ergo, the ratio $$\frac{x}{y} = 1,$$

which is the case where current only flows through the unit terminal. It is implied that y=z, and the final result for this configuration is that $q_3^{(a)}(n_x)=1$, independent of $n_x$. Since FIGS. 58(a) and (b) are both non-alternating cases with the two negative terminals separated by $n_x$, a similar result will hold true: $q_3^{(b)}(n_x)=2$.

Like-polar terminals can be on the same side of the configuration or on opposite sides. The former case is presented in FIG. 58(c), where if $n_x \to 0$, the ratio $$\frac{x}{z}$$

is 1 again. When $n_x \to \infty$, the ratio $$\frac{x}{y}$$

is equal to the CER of two parallel unit terminals. Therefore, we get $$\frac{x}{y} = \frac{1}{2},$$

and the two ratios give us our final result for even $n_x$:

$$q_2(n_x) = \frac{n_x + 1}{2n_x + 1}$$

When the like-polar terminals are on opposite sides, the formula remains true for odd $n_x$.

For visual representation when portions of a configuration are isolated from one another, two methods can be used for a configuration that has isolated components. Electrons may be unable to flow through portions of the configuration because the electric potential extremum has been reached, i.e., the electron has reached the positive terminal along its path leading out of the circuit (FIG. 57(d)).

With reference to FIG. 59, the second case is a magnification of part of FIG. 57(c). If one current is larger than the other, at every junction crossing point, then a portion of the larger current will split off to return toward the positive terminal it had already passed. This further reduction of the larger current continues to the point that both currents within the middle regions are equal at the junction crossing points. The net current flow is zero, and those central regions do not contribute to the CER. This situation is equivalent to having the two branches in the circuit in parallel.

While one or more embodiments have been shown and described, modifications and substitutions may be made thereto without departing from the spirit and scope of the invention. Accordingly, it is to be understood that the present invention has been described by way of illustrations and not imitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A process for performing resistance metrology with a gateless P-N junction metrolog, the process comprising:

connecting a first electrode to a p-interface;
connecting a second electrode to an n-interface;
communicating voltage across through a drain electrode and a source electrode; and
acquiring a resistance value across a p-n junction from the first electrode and the second electrode to perform resistance metrology,
wherein the gateless P-N junction metrolog comprises:
  a junction member comprising:
    the p-interface; and
    the n-interface disposed laterally and adjacent to the p-interface; and
    the p-n junction disposed at where the p-interface and n-interface contact;
  the drain electrode disposed on the junction member;
  the source electrode disposed on the junction member such that the source electrode is spaced apart from and opposing the drain electrode;
  an n-polymer disposed on the n-interface of the junction member;
  a p-polymer disposed on the p-interface of the junction member such that the n-polymer is interposed between the p-polymer and the n-interface;
  a mediation polymer disposed on the p-polymer such that the p-polymer is interposed between the mediation polymer and the junction member; and
  a mediator disposed in the mediation polymer and that receives electrons from the junction member in forming the p-interface.

\* \* \* \* \*